United States Patent
Ritzdorf et al.

(10) Patent No.: US 7,102,763 B2
(45) Date of Patent: Sep. 5, 2006

(54) METHODS AND APPARATUS FOR PROCESSING MICROELECTRONIC WORKPIECES USING METROLOGY

(75) Inventors: Thomas L. Ritzdorf, Kalispell, MT (US); Steve L. Eudy, Kalispell, MT (US); Gregory J. Wilson, Kalispell, MT (US); Paul R. McHugh, Kalispell, MT (US); Robert A. Weaver, Kalispell, MT (US); Brian Aegerter, Kalispell, MT (US); Curt Dundas, Kalispell, MT (US); Steven L. Peace, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 916 days.

(21) Appl. No.: 09/902,491

(22) Filed: Jul. 9, 2001

(65) Prior Publication Data

US 2003/0020928 A1 Jan. 30, 2003

Related U.S. Application Data

(63) Continuation-in-part of application No. 09/872,151, filed on May 31, 2001, and a continuation-in-part of application No. 09/866,463, filed on May 24, 2001, and a continuation-in-part of application No. 09/733,608, filed on Dec. 8, 2000, and a continuation-in-part of application No. 09/612,176, filed on Jul. 8, 2000.

(51) Int. Cl.
*G01B 11/28* (2006.01)
*H01L 21/306* (2006.01)
*B05C 11/00* (2006.01)

(52) U.S. Cl. ............. 356/630; 156/345.15; 156/345.24; 118/712

(58) Field of Classification Search ................. 356/630; 250/559.27; 156/345.13–345.18, 345.23–345.25, 156/345.31–345.32; 118/712

See application file for complete search history.

(56) References Cited

U.S. PATENT DOCUMENTS 1,526,644 A  2/1925  Pinney (Continued)

FOREIGN PATENT DOCUMENTS

DE  4109955  10/1992

(Continued)

OTHER PUBLICATIONS

U.S. Appl. No. 09/612,176, filed Jul. 8, 2000, Ritzdorf et al.
International Search Report for International Application No. PCT/US01/21579; mailed Nov. 16, 2001; Applicant: Semitool, Inc.; 3 pages.

(Continued)

*Primary Examiner*—Zandra V. Smith
(74) *Attorney, Agent, or Firm*—Perkins Coie LLP

(57) ABSTRACT

A method and apparatus for processing a microelectronic workpiece using metrology. The apparatus can include one or more processing or transport units, a metrology unit, and a control unit coupled to the metrology unit and at least one of the processing or transport units. The control unit can modify a process recipe or a process sequence of the processing unit based on a feed forward or a feed back signal from the metrology unit. The control unit can also provide instructions to the transport unit to move the workpiece to a selected processing unit. The processing unit can include, inter alia, a seed layer deposition unit, a process layer electrochemical deposition unit, a seed layer enhancement unit, a chemical mechanical polishing unit, and/or an annealing chamber arranged for sequential processing of a workpiece. The processing units can be controlled as an integrated system using one or more metrology units, or a separate metrology unit can provide input to the processing units.

69 Claims, 49 Drawing Sheets

U.S. PATENT DOCUMENTS

| | | |
|---|---|---|
| 1,881,713 A | 10/1932 | Laukel |
| 2,256,274 A | 9/1941 | Boedecker et al. |
| 3,664,933 A | 5/1972 | Clauss |
| 3,706,635 A | 12/1972 | Kowalski |
| 3,716,462 A | 2/1973 | Jensen |
| 3,727,620 A | 4/1973 | Orr |
| 3,878,066 A | 4/1975 | Dettke et al. |
| 3,930,963 A | 1/1976 | Polichette et al. |
| 3,953,265 A | 4/1976 | Hood |
| 4,000,046 A | 12/1976 | Weaver |
| 4,030,015 A | 6/1977 | Herko et al. |
| 4,046,105 A | 9/1977 | Gomez |
| 4,113,391 A | 9/1978 | Minowa |
| 4,132,567 A | 1/1979 | Blackwood |
| 4,134,802 A | 1/1979 | Herr |
| 4,276,855 A | 7/1981 | Seddon |
| 4,286,541 A | 9/1981 | Blackwood |
| 4,304,641 A | 12/1981 | Grandia et al. |
| 4,384,930 A | 5/1983 | Eckles |
| 4,437,943 A | 3/1984 | Beck et al. |
| 4,439,243 A | 3/1984 | Titus |
| 4,439,244 A | 3/1984 | Allevato |
| 4,443,117 A | 4/1984 | Muramoto et al. |
| 4,475,823 A | 10/1984 | Stone |
| 4,495,453 A | 1/1985 | Inaba et al. |
| 4,500,394 A | 2/1985 | Rizzo |
| 4,544,446 A | 10/1985 | Cady |
| 4,557,785 A | 12/1985 | Ohkuma |
| 4,566,847 A | 1/1986 | Maeda et al. |
| 4,576,689 A | 3/1986 | Makkaev et al. |
| 4,634,503 A | 1/1987 | Nogavich |
| 4,648,944 A | 3/1987 | George et al. |
| 4,664,133 A | 5/1987 | Silvernail et al. |
| 4,687,552 A | 8/1987 | Early et al. |
| 4,732,785 A | 3/1988 | Brewer |
| 4,750,505 A | 6/1988 | Inuta et al. |
| 4,761,214 A | 8/1988 | Hinman |
| 4,781,800 A | 11/1988 | Goldman et al. |
| 4,790,262 A | 12/1988 | Nakayama et al. |
| 4,828,654 A | 5/1989 | Reed |
| 4,838,289 A | 6/1989 | Kottman et al. |
| 4,902,398 A | 2/1990 | Homstad |
| 4,903,717 A | 2/1990 | Sumnitsch |
| 4,949,671 A | 8/1990 | Davis et al. |
| 4,951,601 A | 8/1990 | Maydan et al. |
| 4,959,278 A | 9/1990 | Shimauchi et al. |
| 4,979,464 A | 12/1990 | Kunze-Concewitz et al. |
| 4,982,215 A | 1/1991 | Matsuoka |
| 4,982,753 A | 1/1991 | Grebinski, Jr. et al. |
| 4,988,533 A | 1/1991 | Freeman et al. |
| 5,000,827 A | 3/1991 | Schuster et al. |
| 5,020,200 A | 6/1991 | Mimasaka |
| 5,032,217 A | 7/1991 | Tanaka |
| 5,061,144 A | 10/1991 | Akimoto et al. |
| 5,096,550 A | 3/1992 | Mayer et al. |
| 5,115,430 A | 5/1992 | Hahne et al. |
| 5,117,769 A | 6/1992 | DeBoer |
| 5,135,636 A | 8/1992 | Yee et al. |
| 5,138,973 A | 8/1992 | Davis et al. |
| 5,151,168 A | 9/1992 | Gilton et al. |
| 5,155,336 A | 10/1992 | Gronet et al. |
| 5,156,730 A | 10/1992 | Bhatt et al. |
| 5,168,886 A | 12/1992 | Thompson et al. |
| 5,209,180 A | 5/1993 | Shoda et al. |
| 5,209,817 A | 5/1993 | Ahmad et al. |
| 5,217,586 A | 6/1993 | Datta et al. |
| 5,222,310 A | 6/1993 | Thompson et al. |
| 5,224,503 A | 7/1993 | Thompson et al. |
| 5,224,504 A | 7/1993 | Thompson et al. |
| 5,227,041 A | 7/1993 | Brogden et al. |
| 5,252,807 A | 10/1993 | Chizinsky |
| 5,256,274 A | 10/1993 | Poris |
| 5,302,464 A | 4/1994 | Nomura et al. |
| 5,306,895 A | 4/1994 | Ushikoshi et al. |
| 5,344,491 A | 9/1994 | Katou |
| 5,349,978 A | 9/1994 | Sago et al. |
| 5,361,449 A | 11/1994 | Akimoto |
| 5,363,171 A | 11/1994 | Mack |
| 5,368,711 A | 11/1994 | Poris |
| 5,372,848 A | 12/1994 | Blackwell et al. |
| 5,376,176 A | 12/1994 | Kuriyama |
| 5,377,708 A | 1/1995 | Bergman et al. |
| 5,391,285 A | 2/1995 | Lytle et al. |
| 5,391,517 A | 2/1995 | Gelatos et al. |
| 5,393,624 A | 2/1995 | Ushijima |
| 5,411,076 A | 5/1995 | Matsunaga et al. |
| 5,421,893 A | 6/1995 | Perlov |
| 5,431,421 A | 7/1995 | Thompson et al. |
| 5,431,803 A | 7/1995 | DiFranco et al. |
| 5,445,172 A | 8/1995 | Thompson et al. |
| 5,472,502 A | 12/1995 | Batchelder |
| 5,474,807 A | 12/1995 | Koshiishi |
| 5,500,081 A | 3/1996 | Bergman |
| 5,510,645 A | 4/1996 | Fitch et al. |
| 5,513,594 A | 5/1996 | McClanahan et al. |
| 5,549,808 A | 8/1996 | Farooq et al. |
| 5,551,986 A | 9/1996 | Jain |
| 5,567,267 A | 10/1996 | Kazama et al. |
| 5,571,325 A | 11/1996 | Ueyama et al. |
| 5,584,971 A | 12/1996 | Komino |
| 5,591,262 A | 1/1997 | Sago et al. |
| 5,597,460 A | 1/1997 | Reynolds |
| 5,600,532 A | 2/1997 | Michiya et al. |
| 5,616,069 A | 4/1997 | Walker et al. |
| 5,639,316 A | 6/1997 | Cabral, Jr. et al. |
| 5,650,082 A | 7/1997 | Anderson |
| 5,651,823 A | 7/1997 | Parodi et al. |
| 5,658,183 A | 8/1997 | Sandhu et al. |
| 5,660,472 A | 8/1997 | Peuse et al. |
| 5,666,985 A | 9/1997 | Smith, Jr. et al. |
| 5,670,034 A | 9/1997 | Lowery |
| 5,677,824 A | 10/1997 | Harashima et al. |
| 5,678,116 A | 10/1997 | Sugimoto et al. |
| 5,681,392 A | 10/1997 | Swain |
| 5,684,713 A | 11/1997 | Asada et al. |
| 5,700,127 A | 12/1997 | Harada et al. |
| 5,700,180 A | 12/1997 | Sandhu et al. |
| 5,718,763 A | 2/1998 | Tateyama et al. |
| 5,719,495 A | 2/1998 | Moslehi |
| 5,723,028 A | 3/1998 | Poris |
| 5,754,842 A | 5/1998 | Minagawa |
| 5,762,708 A | 6/1998 | Motoda et al. |
| 5,762,751 A | 6/1998 | Bleck et al. |
| 5,765,444 A | 6/1998 | Bacchi et al. |
| 5,779,796 A | 7/1998 | Tomoeda et al. |
| 5,785,826 A | 7/1998 | Greenspan |
| 5,802,856 A | 9/1998 | Schaper et al. |
| 5,815,762 A | 9/1998 | Sakai et al. |
| 5,845,662 A | 12/1998 | Sumnitsch |
| 5,860,640 A | 1/1999 | Marohl et al. |
| 5,868,866 A | 2/1999 | Maekawa et al. |
| 5,871,626 A | 2/1999 | Crafts et al. |
| 5,872,633 A * | 2/1999 | Holzapfel et al. .......... 356/630 |
| 5,882,433 A | 3/1999 | Ueno |
| 5,882,498 A | 3/1999 | Dubin et al. |
| 5,885,755 A | 3/1999 | Nakagawa et al. |
| 5,892,207 A | 4/1999 | Kawamura et al. |
| 5,900,633 A * | 5/1999 | Solomon et al. ....... 250/339.08 |
| 5,908,543 A | 6/1999 | Matsunami et al. |
| 5,916,366 A | 6/1999 | Ueyama et al. |
| 5,924,058 A | 7/1999 | Waldhauer et al. |

| | | | |
|---|---|---|---|
| 5,932,077 A | 8/1999 | Reynolds | |
| 5,937,142 A | 8/1999 | Moslehi et al. | |
| 5,942,035 A | 8/1999 | Hasebe et al. | |
| 5,948,203 A * | 9/1999 | Wang | 156/345.13 |
| 5,952,050 A | 9/1999 | Doan | |
| 5,964,643 A | 10/1999 | Birang et al. | |
| 5,980,706 A | 11/1999 | Bleck et al. | |
| 5,985,126 A | 11/1999 | Bleck et al. | |
| 5,989,397 A | 11/1999 | Laube et al. | |
| 5,989,406 A | 11/1999 | Beetz, Jr. et al. | |
| 5,997,653 A | 12/1999 | Yamasaka | |
| 5,999,886 A | 12/1999 | Martin et al. | |
| 6,004,047 A * | 12/1999 | Akimoto et al. | 118/52 |
| 6,004,828 A | 12/1999 | Hanson | |
| 6,017,437 A | 1/2000 | Ting et al. | |
| 6,017,820 A | 1/2000 | Ting et al. | |
| 6,025,600 A | 2/2000 | Archie et al. | |
| 6,027,631 A | 2/2000 | Broadbent | |
| 6,028,986 A | 2/2000 | Song | |
| 6,045,618 A | 4/2000 | Raoux et al. | |
| 6,051,284 A | 4/2000 | Byrne et al. | |
| 6,063,190 A | 5/2000 | Hasebe et al. | |
| 6,072,160 A | 6/2000 | Bahl | |
| 6,072,163 A | 6/2000 | Armstrong et al. | |
| 6,074,544 A | 6/2000 | Reid et al. | |
| 6,077,412 A | 6/2000 | Ting et al. | |
| 6,086,680 A | 7/2000 | Foster et al. | |
| 6,090,260 A | 7/2000 | Inoue et al. | |
| 6,091,498 A | 7/2000 | Hanson et al. | |
| 6,107,192 A | 8/2000 | Subrahmanyan et al. | |
| 6,108,937 A | 8/2000 | Raaijmakers | |
| 6,110,011 A | 8/2000 | Somekh et al. | |
| 6,110,346 A | 8/2000 | Reid et al. | |
| 6,122,046 A | 9/2000 | Almogy | |
| 6,130,415 A | 10/2000 | Knoot | |
| 6,132,289 A * | 10/2000 | Labunsky et al. | 451/6 |
| 6,136,163 A | 10/2000 | Cheung et al. | |
| 6,139,703 A | 10/2000 | Hanson et al. | |
| 6,149,729 A | 11/2000 | Iwata et al. | |
| 6,151,532 A | 11/2000 | Barone et al. | |
| 6,156,167 A | 12/2000 | Patton et al. | |
| 6,157,106 A | 12/2000 | Tietz et al. | |
| 6,159,073 A | 12/2000 | Wiswesser et al. | |
| 6,159,354 A | 12/2000 | Contolini et al. | |
| 6,162,344 A | 12/2000 | Reid et al. | |
| 6,162,488 A | 12/2000 | Gevelber et al. | |
| 6,168,693 B1 | 1/2001 | Uzoh et al. | |
| 6,179,983 B1 | 1/2001 | Reid et al. | |
| 6,184,068 B1 | 2/2001 | Ohtani et al. | |
| 6,187,072 B1 | 2/2001 | Cheung et al. | |
| 6,190,234 B1 | 2/2001 | Swedek et al. | |
| 6,193,802 B1 | 2/2001 | Pang et al. | |
| 6,193,859 B1 | 2/2001 | Contolini | |
| 6,194,628 B1 | 2/2001 | Pang et al. | |
| 6,197,181 B1 | 3/2001 | Chen | |
| 6,199,301 B1 | 3/2001 | Wallace | |
| 6,201,240 B1 | 3/2001 | Dotan et al. | |
| 6,208,751 B1 | 3/2001 | Almogy | |
| 6,228,232 B1 | 5/2001 | Woodruff et al. | |
| 6,231,743 B1 | 5/2001 | Etherington | |
| 6,234,738 B1 | 5/2001 | Kimata et al. | |
| 6,238,539 B1 | 5/2001 | Joyce et al. | |
| 6,244,931 B1 | 6/2001 | Pinson et al. | |
| 6,247,998 B1 | 6/2001 | Wiswesser et al. | |
| 6,251,692 B1 * | 6/2001 | Hanson | 156/345.24 |
| 6,255,222 B1 | 7/2001 | Xia et al. | |
| 6,264,752 B1 | 7/2001 | Curtis et al. | |
| 6,268,289 B1 | 7/2001 | Chowdhury et al. | |
| 6,270,619 B1 * | 8/2001 | Suzuki et al. | 204/298.25 |
| 6,270,634 B1 | 8/2001 | Kumar et al. | |
| 6,277,194 B1 | 8/2001 | Thilderkvist et al. | |
| 6,277,263 B1 | 8/2001 | Chen | |
| 6,278,089 B1 | 8/2001 | Young et al. | |
| 6,280,183 B1 | 8/2001 | Mayur et al. | |
| 6,280,289 B1 | 8/2001 | Wiswesser et al. | |
| 6,283,692 B1 | 9/2001 | Perlov et al. | |
| 6,284,622 B1 | 9/2001 | Campbell et al. | |
| 6,290,865 B1 | 9/2001 | Lloyd et al. | |
| 6,296,548 B1 | 10/2001 | Wiswesser et al. | |
| 6,297,154 B1 | 10/2001 | Gross et al. | |
| 6,303,395 B1 | 10/2001 | Nulman | |
| 6,303,931 B1 | 10/2001 | Menaker et al. | |
| 6,309,276 B1 | 10/2001 | Tsai et al. | |
| 6,309,981 B1 | 10/2001 | Mayer et al. | |
| 6,318,384 B1 | 11/2001 | Khan et al. | |
| 6,318,385 B1 | 11/2001 | Curtis et al. | |
| 6,318,951 B1 | 11/2001 | Schmidt et al. | |
| 6,322,112 B1 | 11/2001 | Duncan | |
| 6,322,677 B1 | 11/2001 | Woodruff et al. | |
| 6,331,490 B1 | 12/2001 | Stevens et al. | |
| 6,333,275 B1 | 12/2001 | Mayer et al. | |
| 6,342,137 B1 | 1/2002 | Woodruff et al. | |
| 6,350,319 B1 | 2/2002 | Curtis et al. | |
| 6,352,467 B1 | 3/2002 | Somekh et al. | |
| 6,391,166 B1 | 5/2002 | Wang | |
| 6,399,505 B1 | 6/2002 | Nogami | |
| 6,413,436 B1 | 7/2002 | Aegerter et al. | |
| 6,423,642 B1 | 7/2002 | Peace et al. | |
| 6,428,673 B1 | 8/2002 | Ritzdorf et al. | |
| 6,444,481 B1 | 9/2002 | Pasadyn et al. | |
| 6,454,899 B1 | 9/2002 | Campbell et al. | |
| 6,494,221 B1 | 12/2002 | Sellmer et al. | |
| 6,511,898 B1 | 1/2003 | Sonderman et al. | |
| 6,534,328 B1 | 3/2003 | Hewett et al. | |
| 6,654,122 B1 | 11/2003 | Hanson et al. | |
| 6,672,820 B1 | 1/2004 | Hanson et al. | |
| 2002/0008037 A1 | 1/2002 | Wilson et al. | |
| 2002/0022363 A1 | 2/2002 | Ritzdorf et al. | |
| 2002/0032499 A1 | 3/2002 | Wilson et al. | |
| 2003/0020928 A1 | 1/2003 | Ritzdorf et al. | |
| 2003/0066752 A1 | 4/2003 | Ritzdorf et al. | |

FOREIGN PATENT DOCUMENTS

| | | |
|---|---|---|
| DE | 4202194 | 7/1993 |
| EP | 0 924 754 A2 | 10/1998 |
| EP | 0 881 673 A2 | 12/1998 |
| EP | 0 964 433 A2 | 12/1999 |
| EP | 0 982 771 A1 | 3/2000 |
| EP | 1037261 A2 | 3/2000 |
| EP | 1058172 | 12/2000 |
| EP | 1058173 | 12/2000 |
| EP | 1058174 | 12/2000 |
| EP | 1058175 | 12/2000 |
| EP | 1 069 213 A2 | 1/2001 |
| JP | 52-12576 | 1/1977 |
| JP | 59-208831 | 11/1984 |
| JP | 60-137016 | 7/1985 |
| JP | 61-196534 | 8/1986 |
| JP | 62-166515 | 7/1987 |
| JP | 63-185029 | 7/1988 |
| JP | 1-120023 | 5/1989 |
| JP | 1-283845 | 11/1989 |
| JP | 4-94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 8-279494 | 11/1995 |
| JP | 9-181026 | 7/1997 |
| JP | 10-083960 | 3/1998 |
| WO | WO 83/03636 | 10/1983 |
| WO | WO 91/04213 | 4/1991 |

| | | |
|---|---|---|
| WO | WO 99/40615 | 8/1999 |
| WO | WO 99/41434 | 8/1999 |
| WO | WO 99/45745 | 9/1999 |
| WO | WO 00/02808 | 1/2000 |
| WO | WO 99/25004 | 8/2000 |
| WO | WO 00/61498 | 10/2000 |
| WO | WO 00/61837 | 10/2000 |
| WO | WO 00/70495 | 11/2000 |
| WO | WO 01/90434 | 11/2001 |
| WO | WO 02/04886 | 1/2002 |
| WO | WO 02/04887 | 1/2002 |
| WO | WO 2/045476 | 6/2002 |
| WO | WO 02/97165 | 12/2002 |
| WO | WO 02/99165 | 12/2002 |

OTHER PUBLICATIONS

U.S. Appl. No. 08/940,524, filed Sep. 30, 1997, Bleck et al.

U.S. Appl. No. 09/114,105, filed Jul. 11, 1998, Woodruff et al.

U.S. Appl. No. 09/679,928, filed Oct. 5, 2000, Woodruff et al.

U.S. Appl. No. 60/143,769, filed Jul. 12, 1999, McHugh.

U.S. Appl. No. 60/182,160, filed Feb. 14, 2000, McHugh et al.

UlS. Appl. No. 60/206,663, filed Wilson et al., May 24, 2000.

Lee, Tien–Yu Tom, "Application of a CFD Tool in Designing a Fountain Plating Cell for Uniform Bump Plating of Semiconductor Wafer," IEE Transactions on Components, Packaging, and Manufacturing Technology (Feb. 1996), vol. 19, No. 1, IEEE.

Lowenheim, Frederick A., "Electroplating," Electrochemistry Applied to Electroplating, 1978, pp. 152–155, McGraw–Hill Book Company, New York.

Osborne, Nick et al., "Hot–Wall Furnace RTP," Solid State Technology, Jul. 2000, pp. 211–212, 214, 216 & 217.

Peuse, Bruce et al., "Advances in RTP Temperature Measurement and Control," Materials Research Society Symposium—Spring 1998, pp. 1–15.

Ritter, et al., "Two– Three– Dimensional Numberical Modeling of Copper Electroplating For Advanced ULSI Metallization," E–MRS Conference symposium M. Basic Models to Enhance Reliability, Strasbourg (FRANCE) 1999.

Satheesh Kuppurao et al., "Rapid Thermal Oxidation Technique," Solid State Technology, Jul. 2000, pp. 223–234, 236 & 239.

Thakur, RPS et al., "RTP technology for tomorrow," Jul. 1, 1998, http://www.semipark.co.kr./ifil/%EA%b8%.../RTP%20technology%20for%20tomorrow.html, dated Feb. 28, 2001.

Woo Sik Yoo et al., "Rapid Termal Furnace," Solid State Technology, Jul. 2000, pp. 223–224, 226, 228, 230.

International Search Report PCT/US02/17203, Semitool, Inc., Dec. 31, 2002, 4 pgs.

International Search Report for PCT/US02/17840; Applicant: Semitool, Inc., Mar. 3, 2003, 4 pgs.

International Search Report for PCT/US01/04444; Applicant: Semitool, Inc., Dec. 5, 2001, 7 pgs.

* cited by examiner

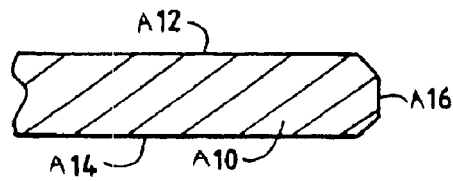
FIG. A1A PRIOR ART
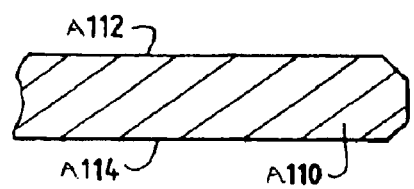
FIG. A2A
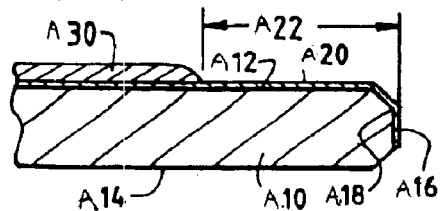
FIG. A1B PRIOR ART
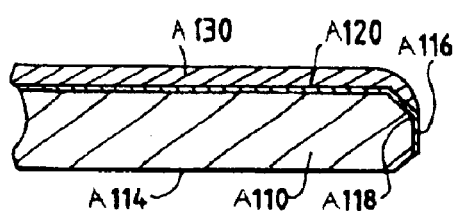
FIG. A2B
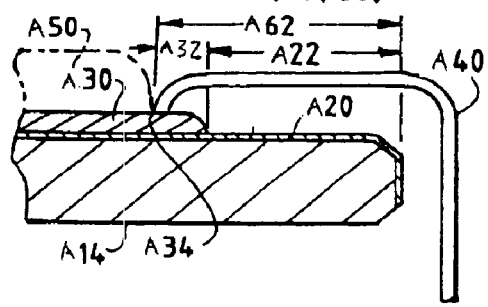
FIG. A1C PRIOR ART
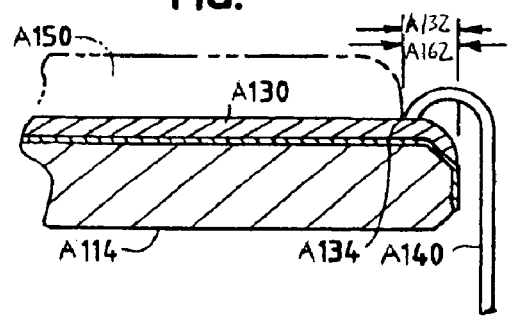
FIG. A2C
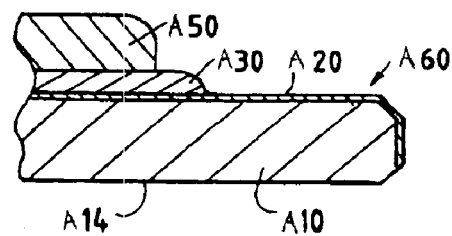
FIG. A1D PRIOR ART
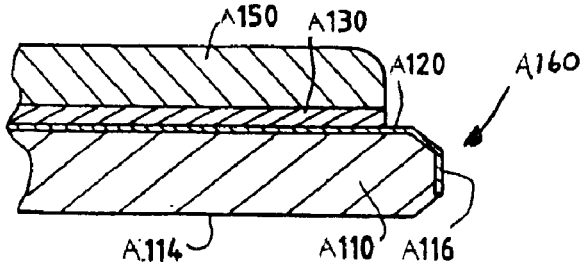
FIG. A2D

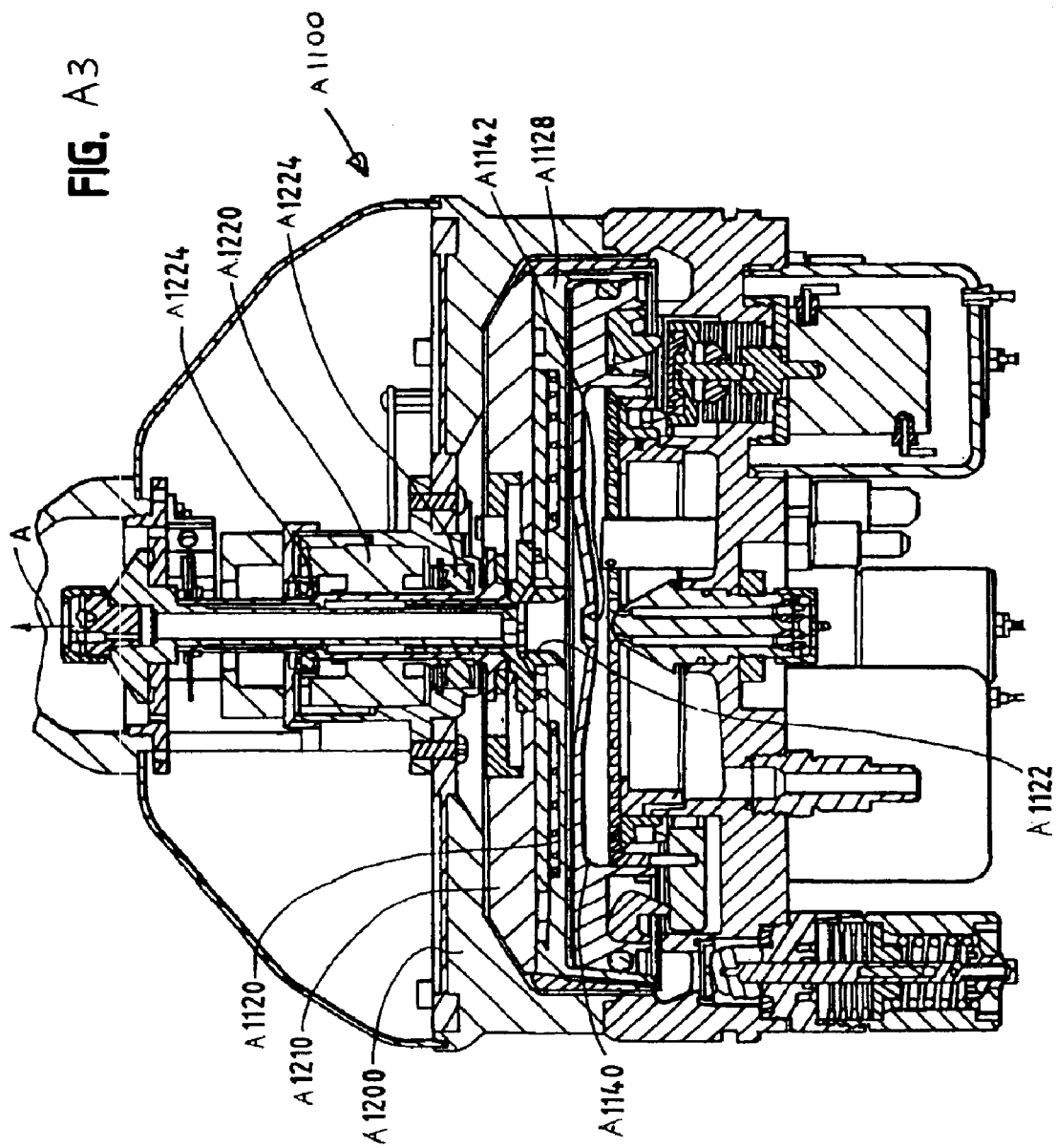

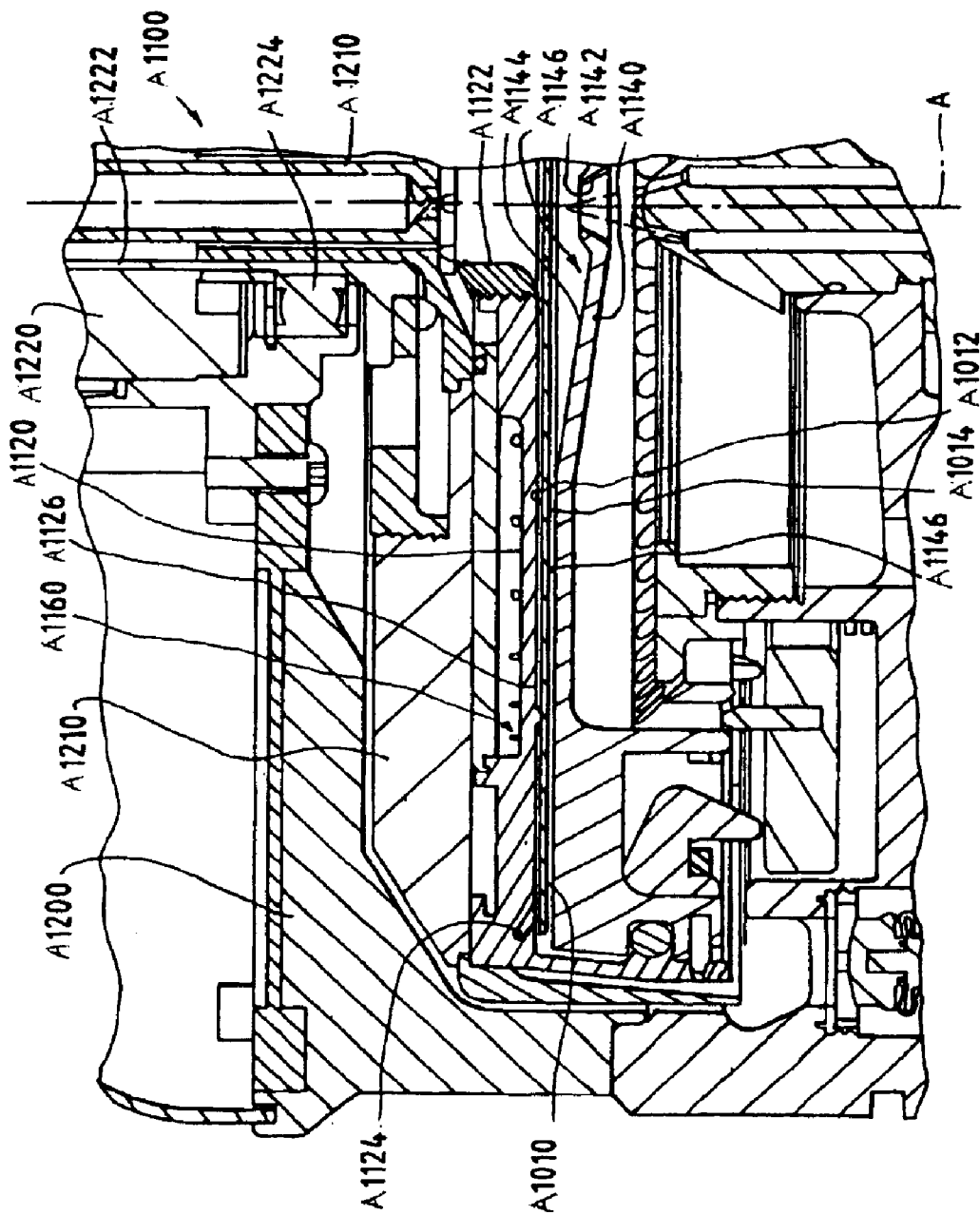
FIG. A4

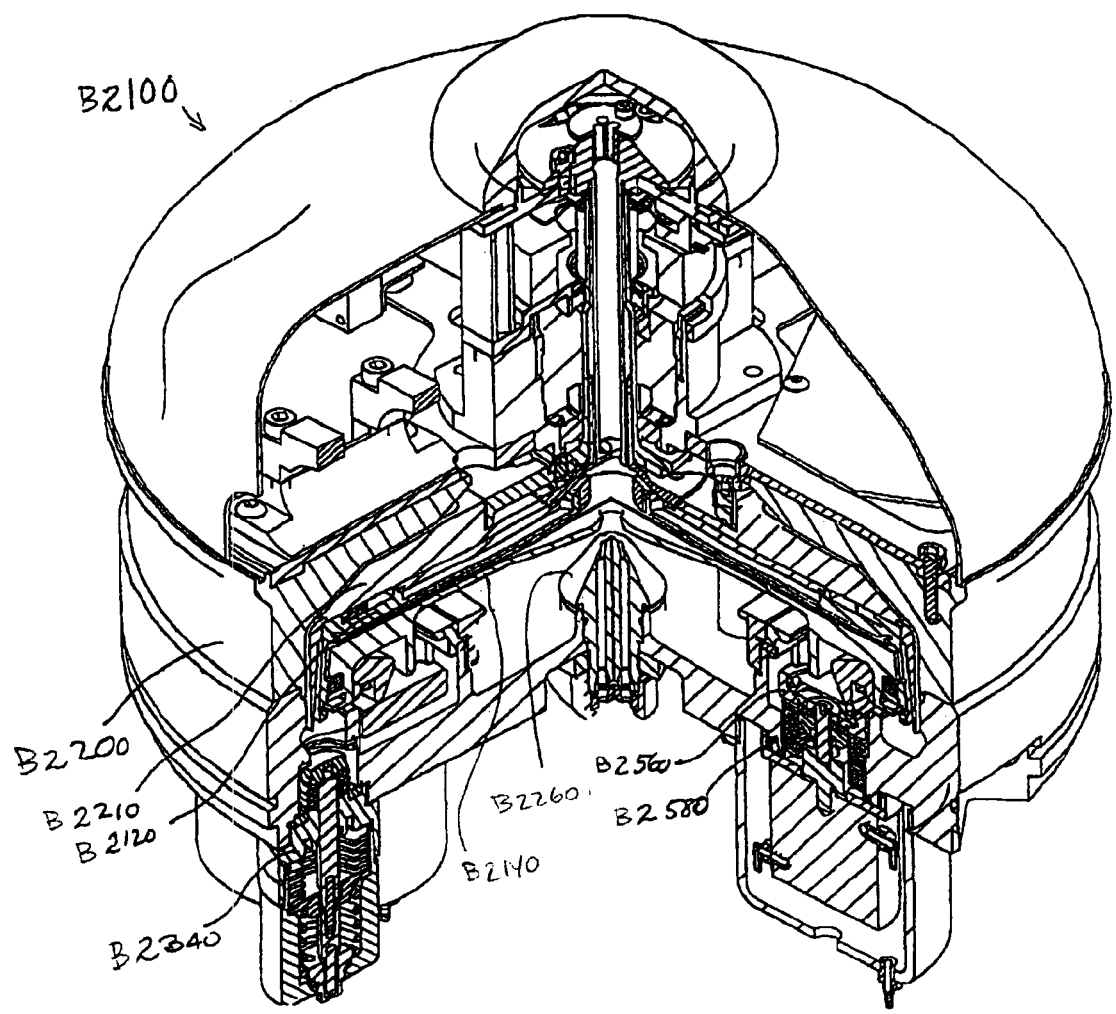
Fig. B1

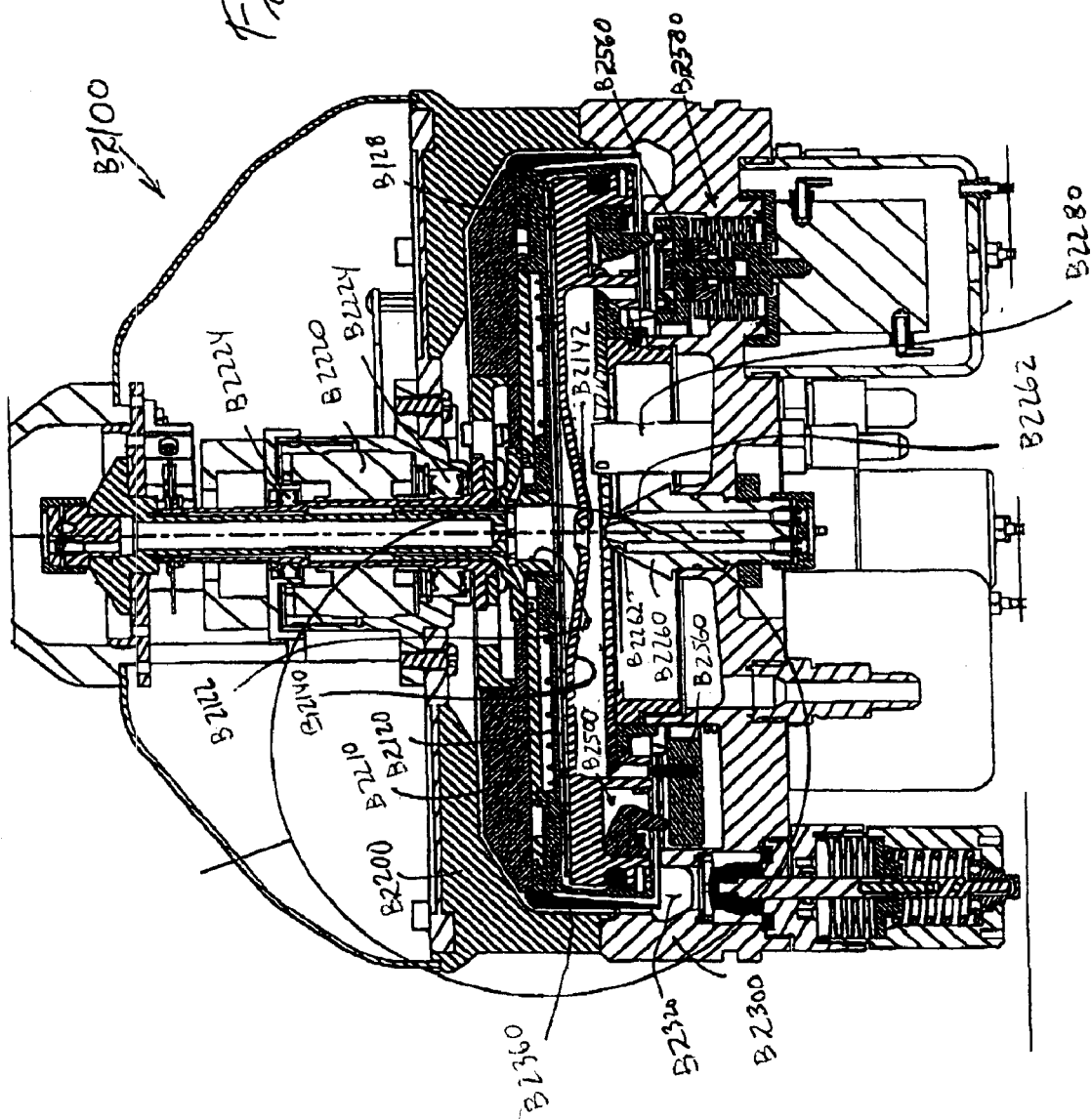

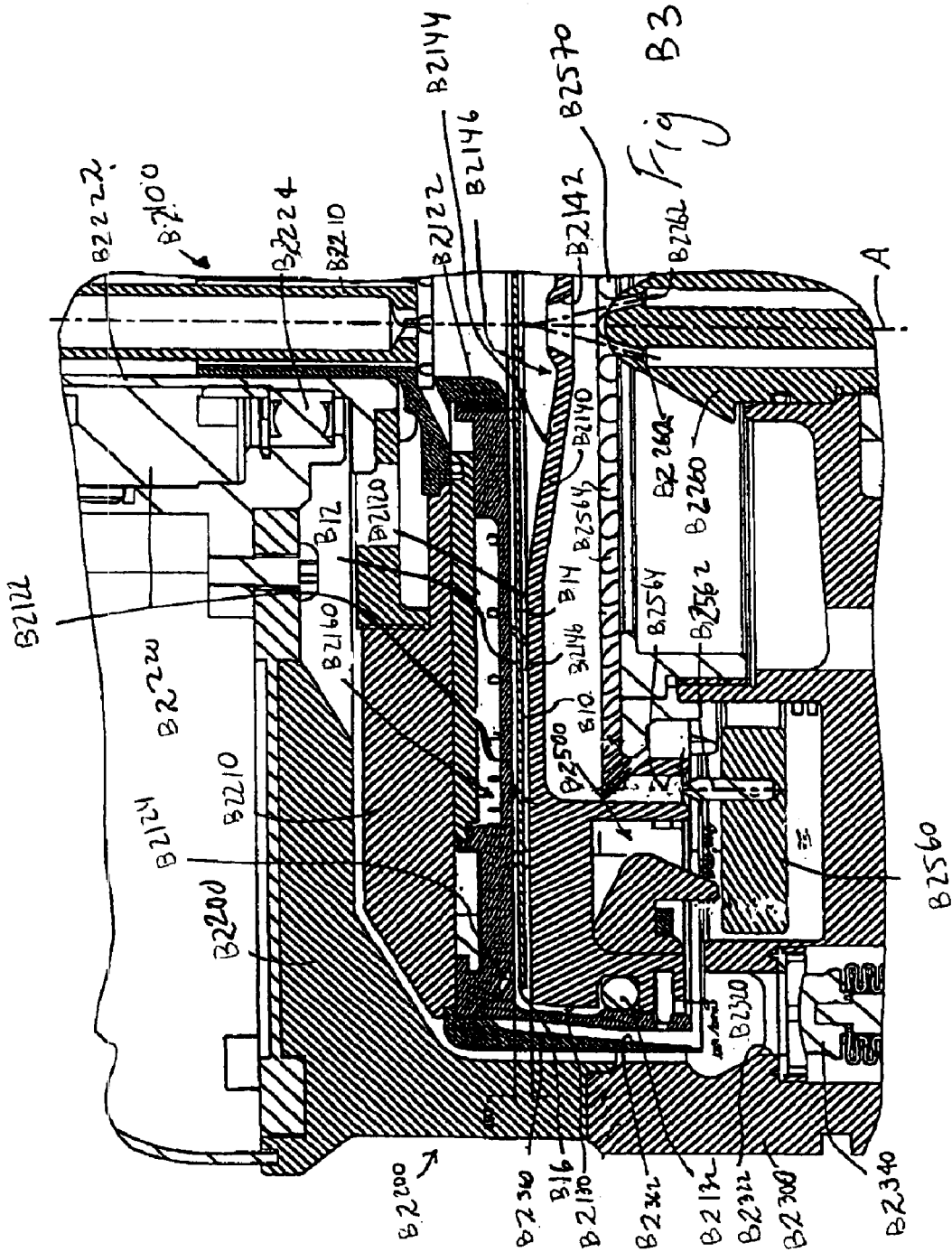

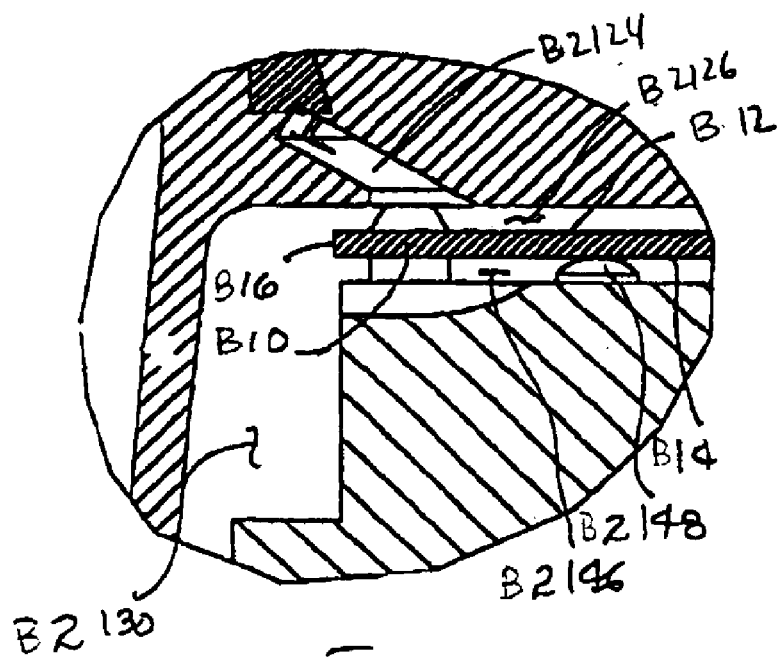
Fig. B4
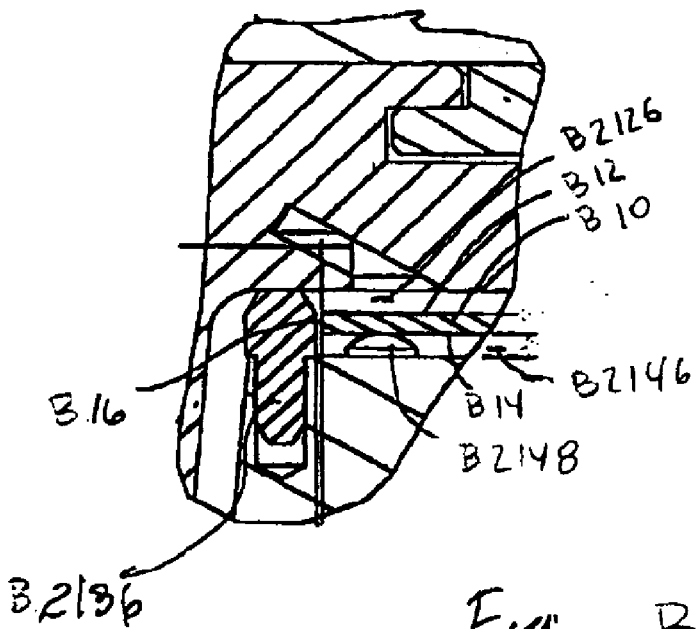
Fig. B5

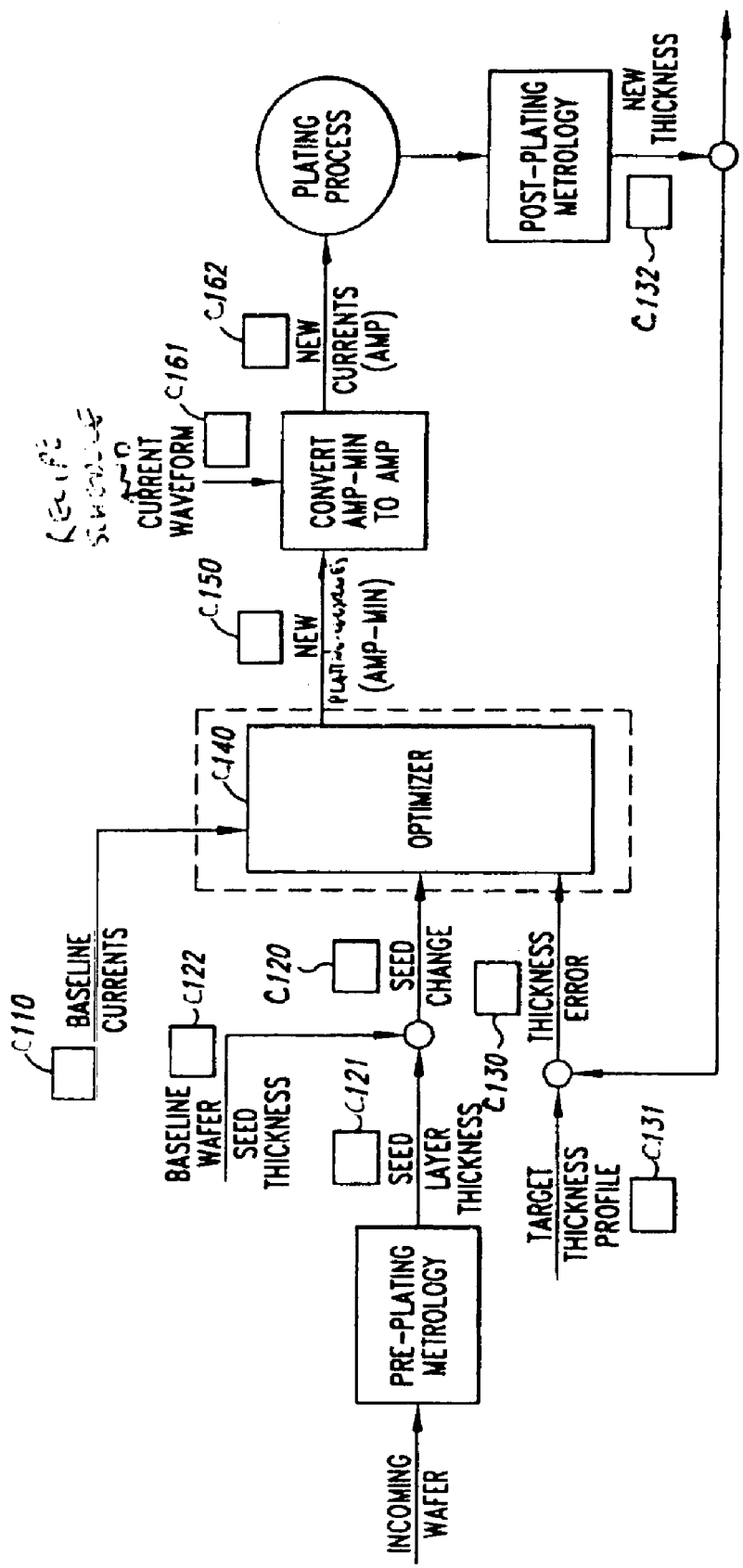
Fig. C1

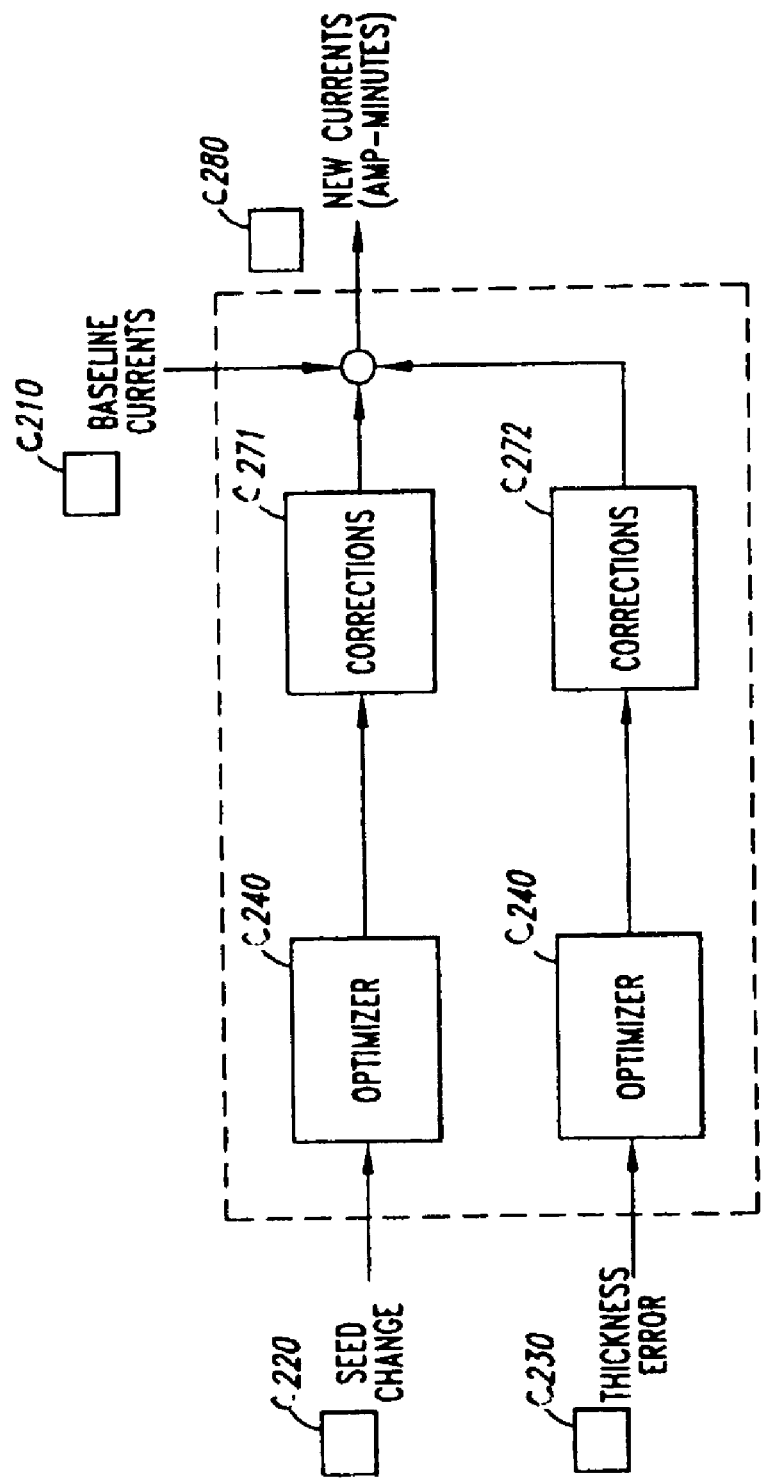
Fig. C2

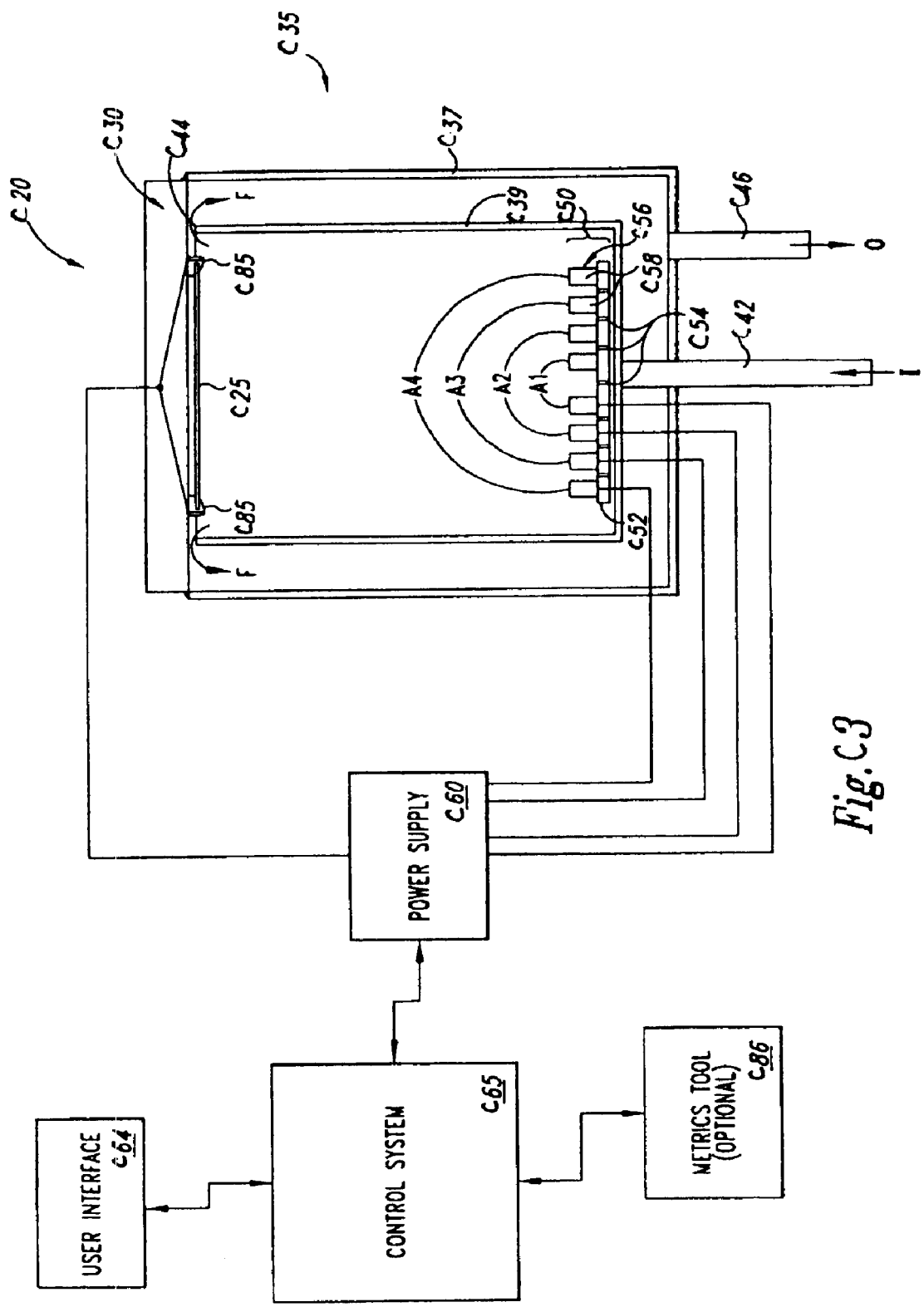
Fig. C3

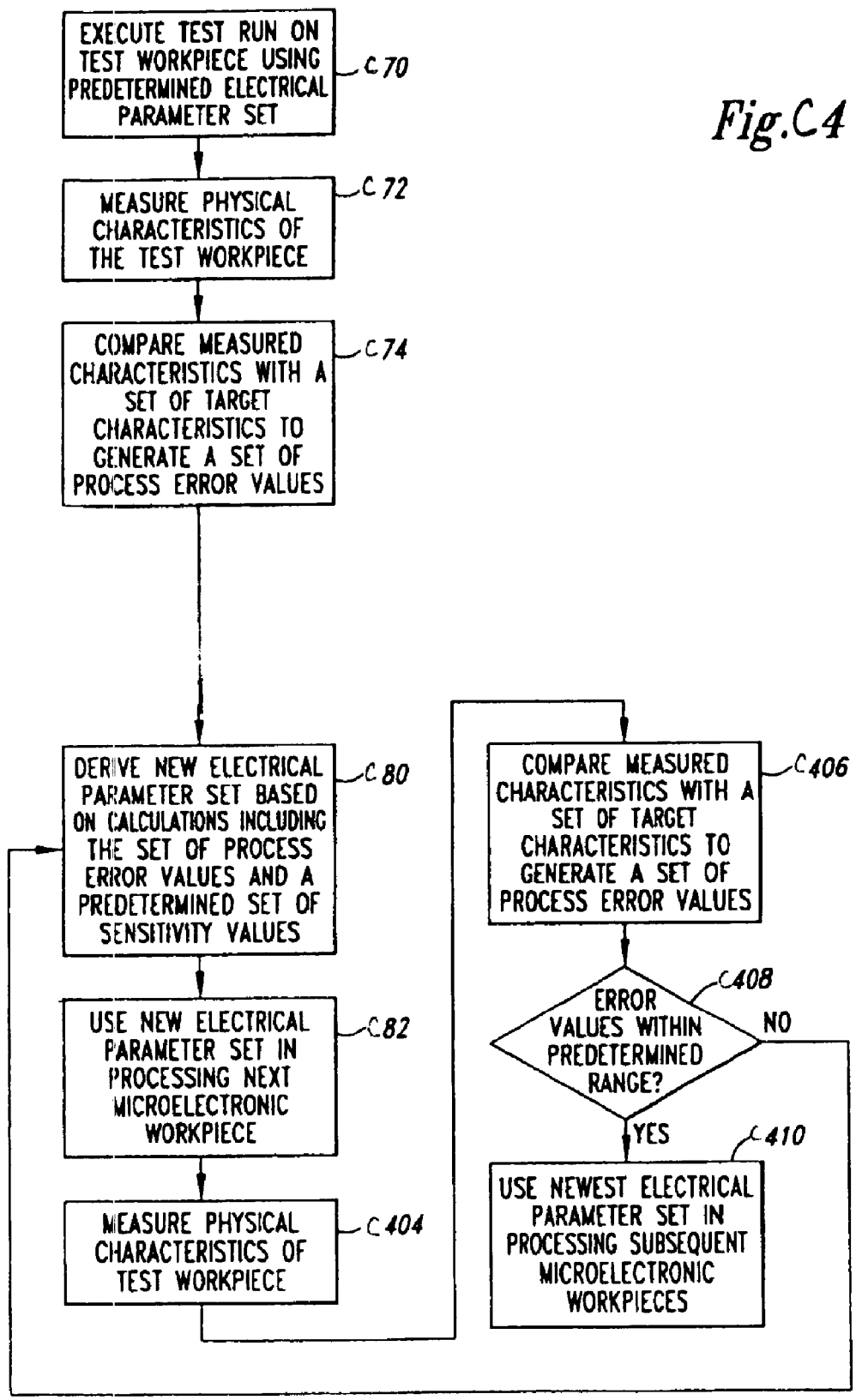
Fig.C4

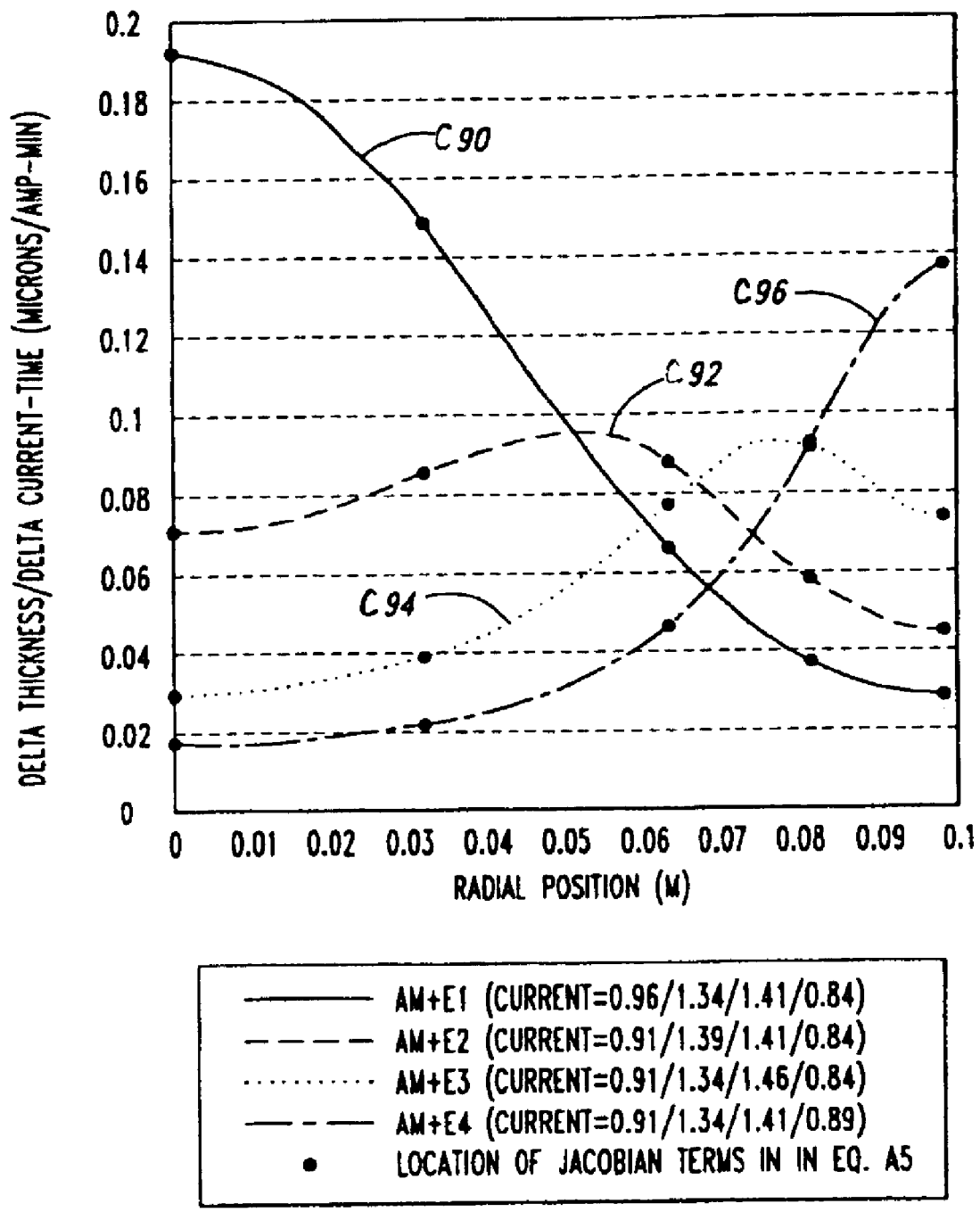
Fig.C5

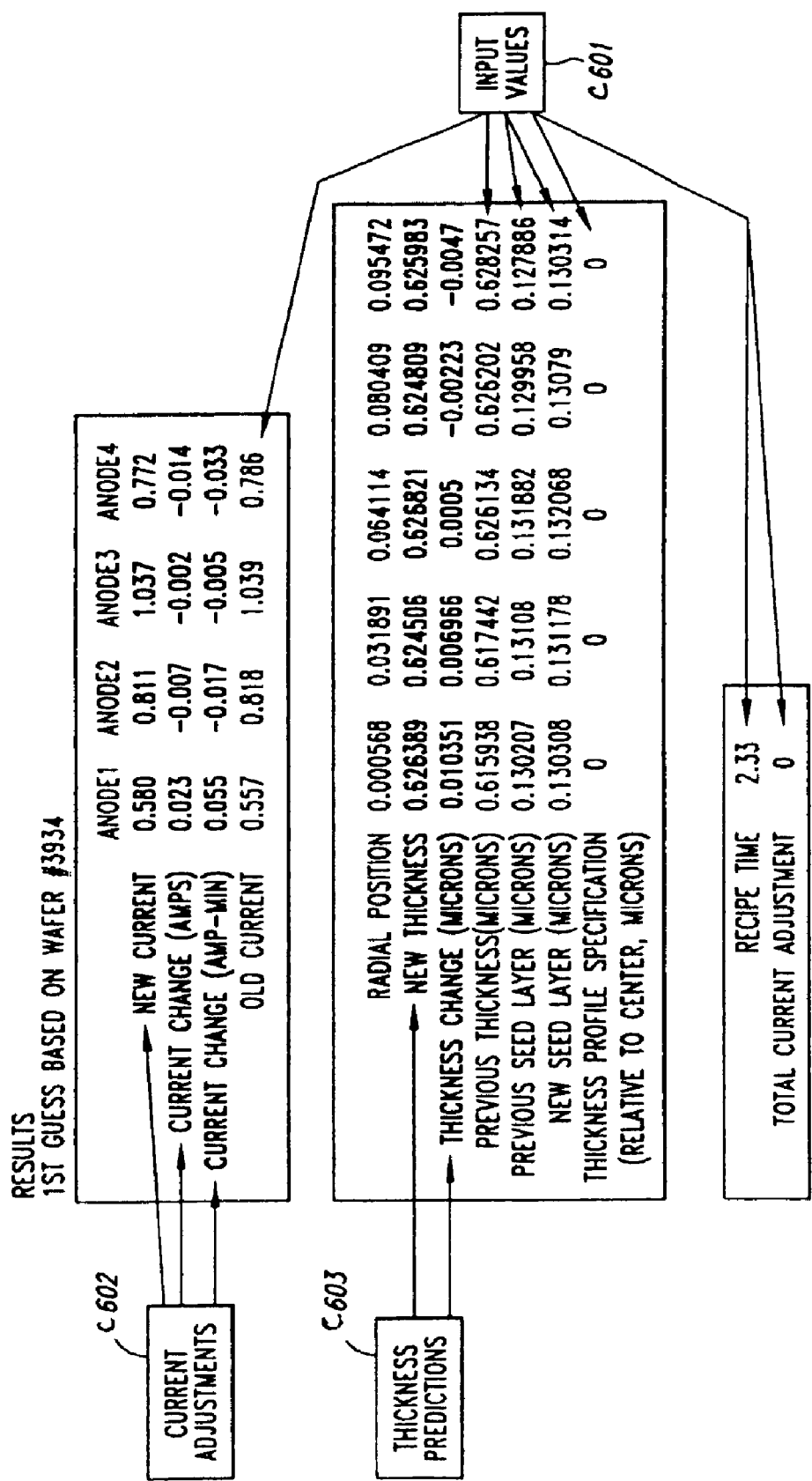
Fig. C6

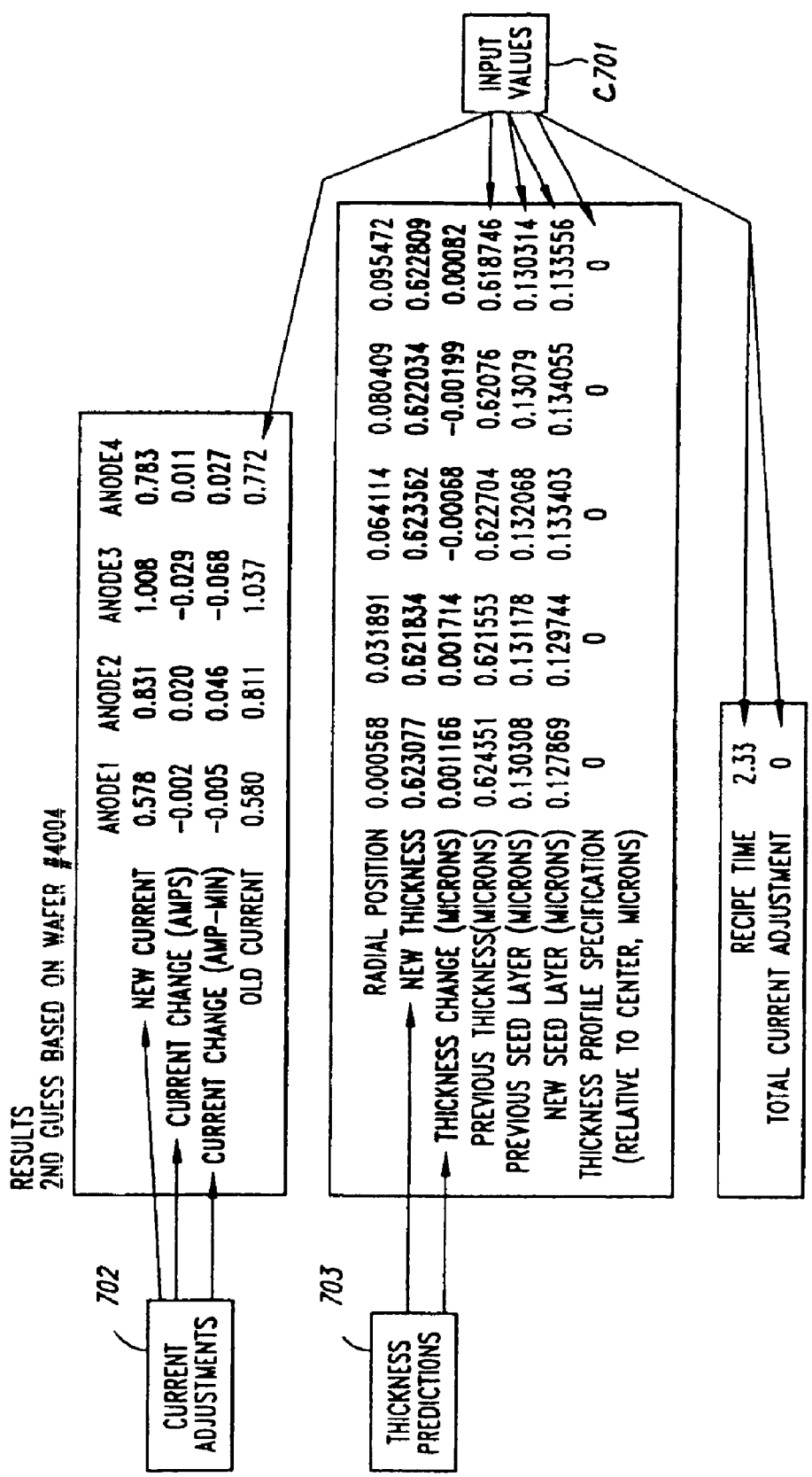
Fig.C7

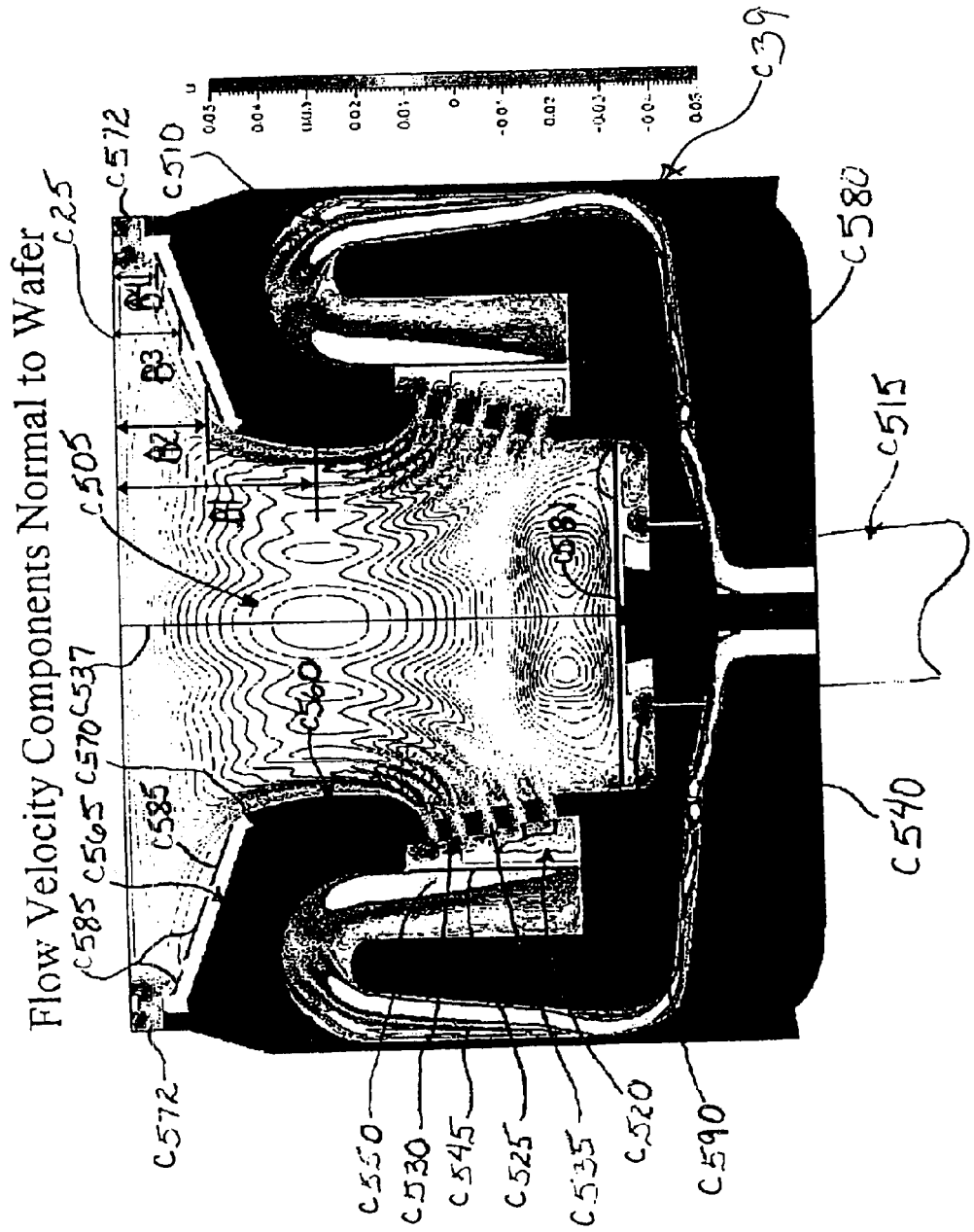

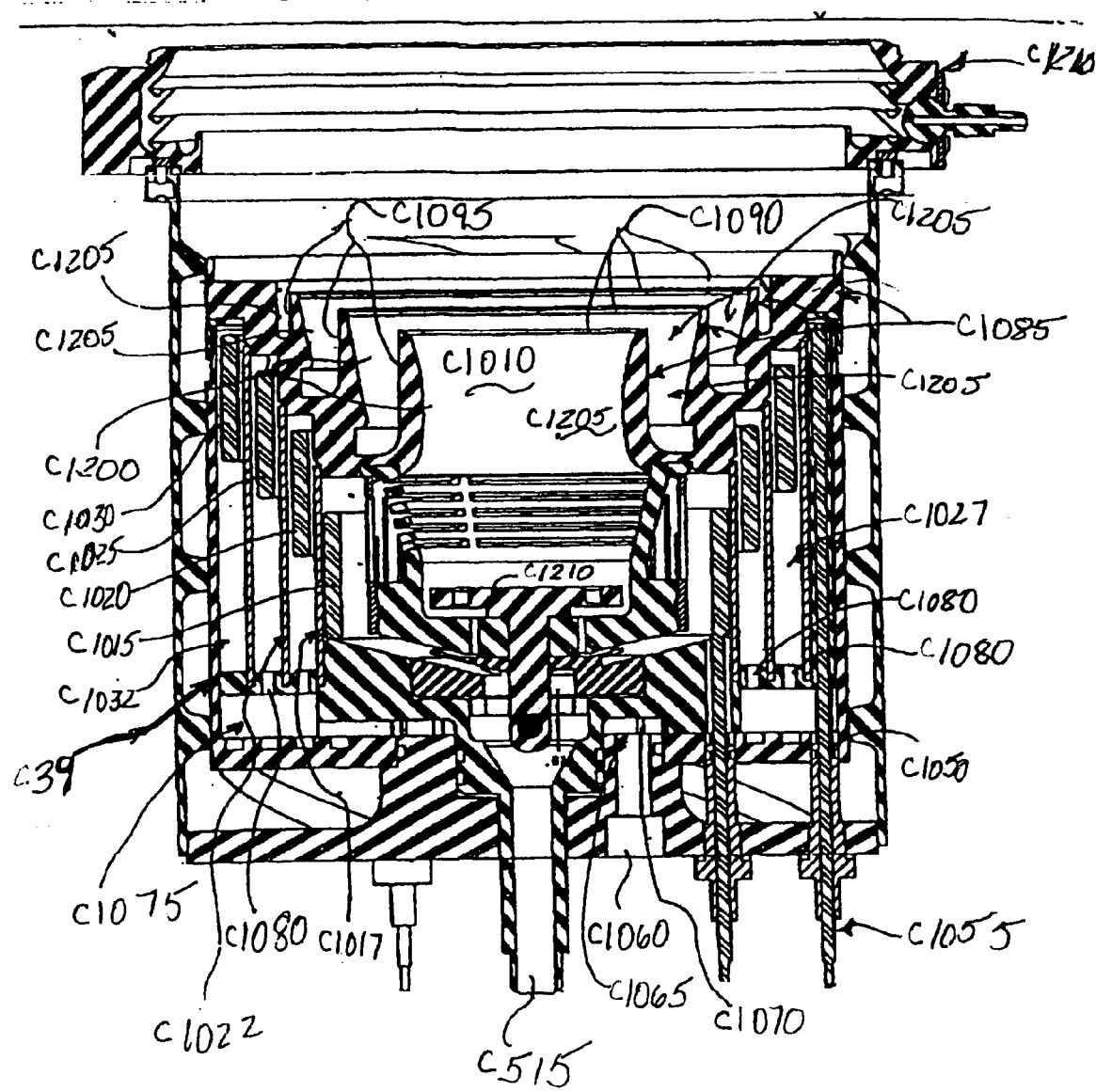

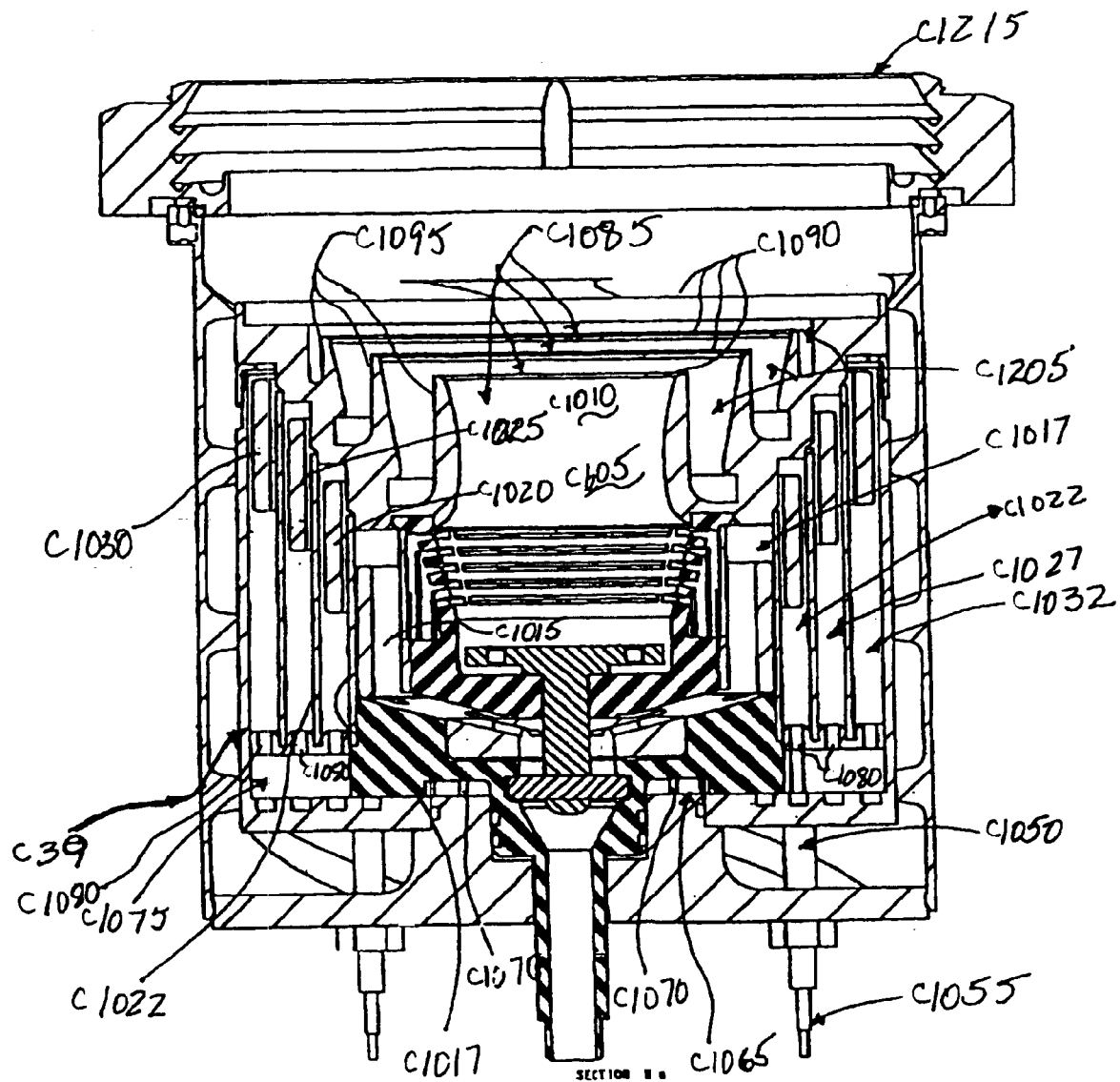
FIGURE C10

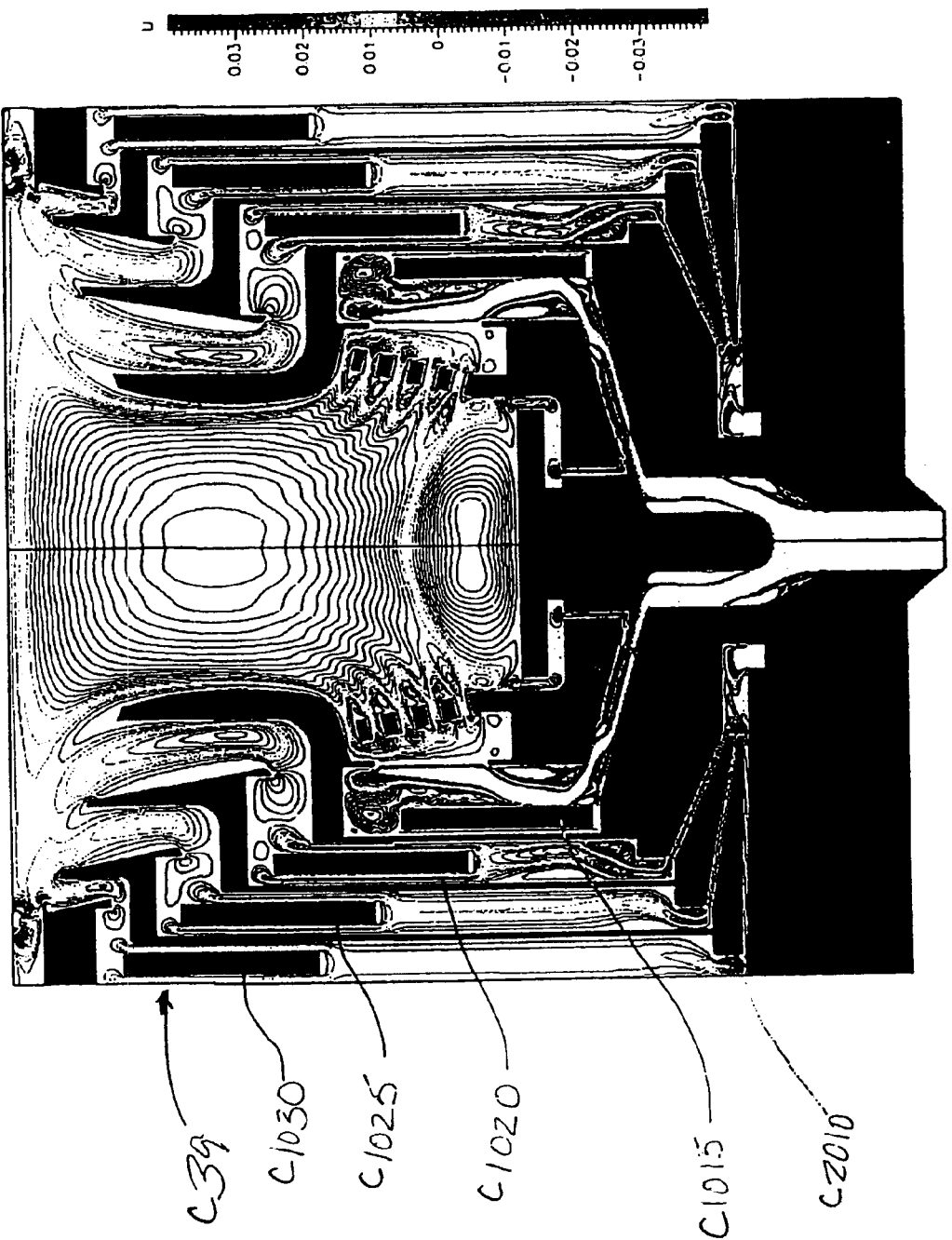
FIGURE C11

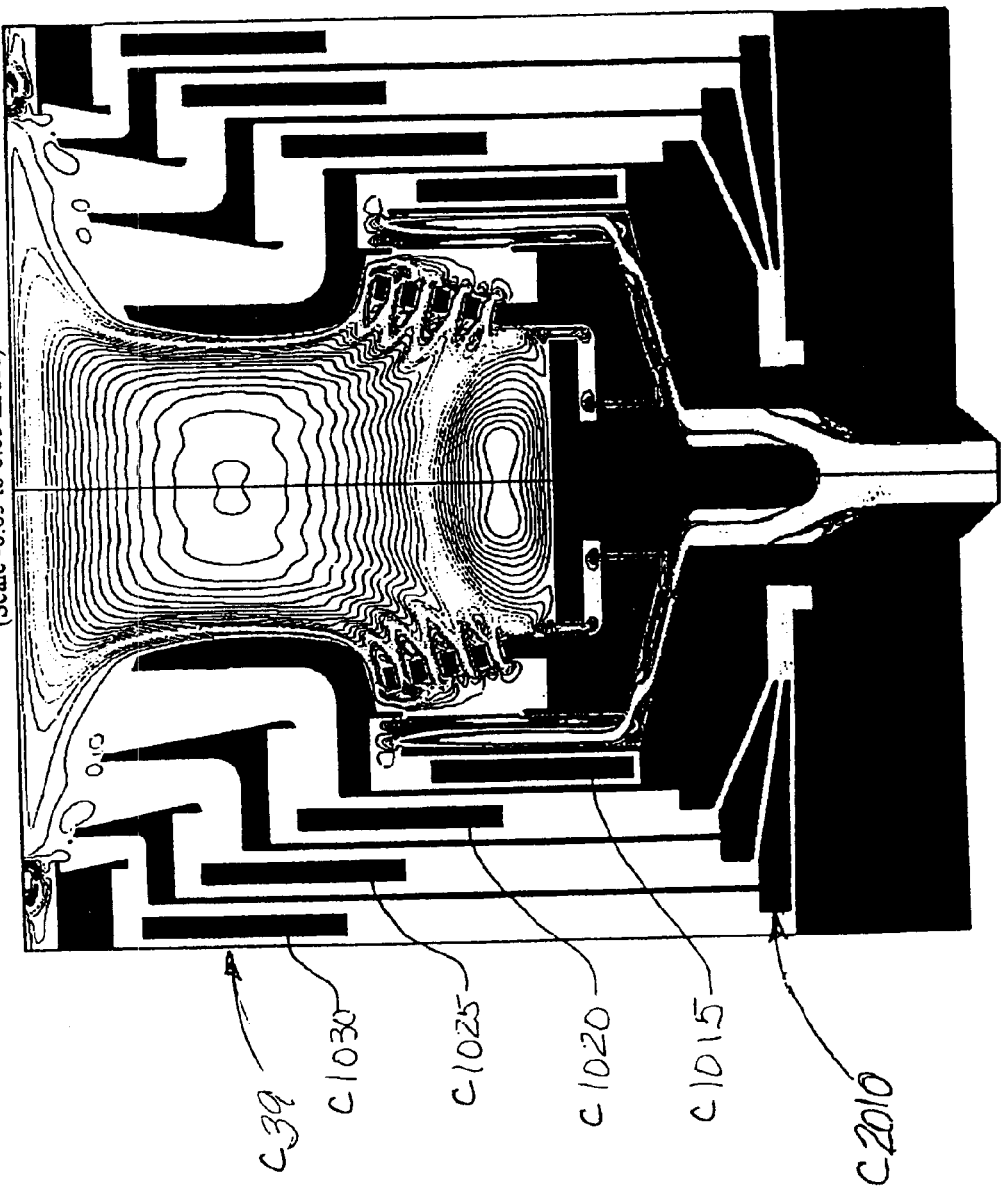

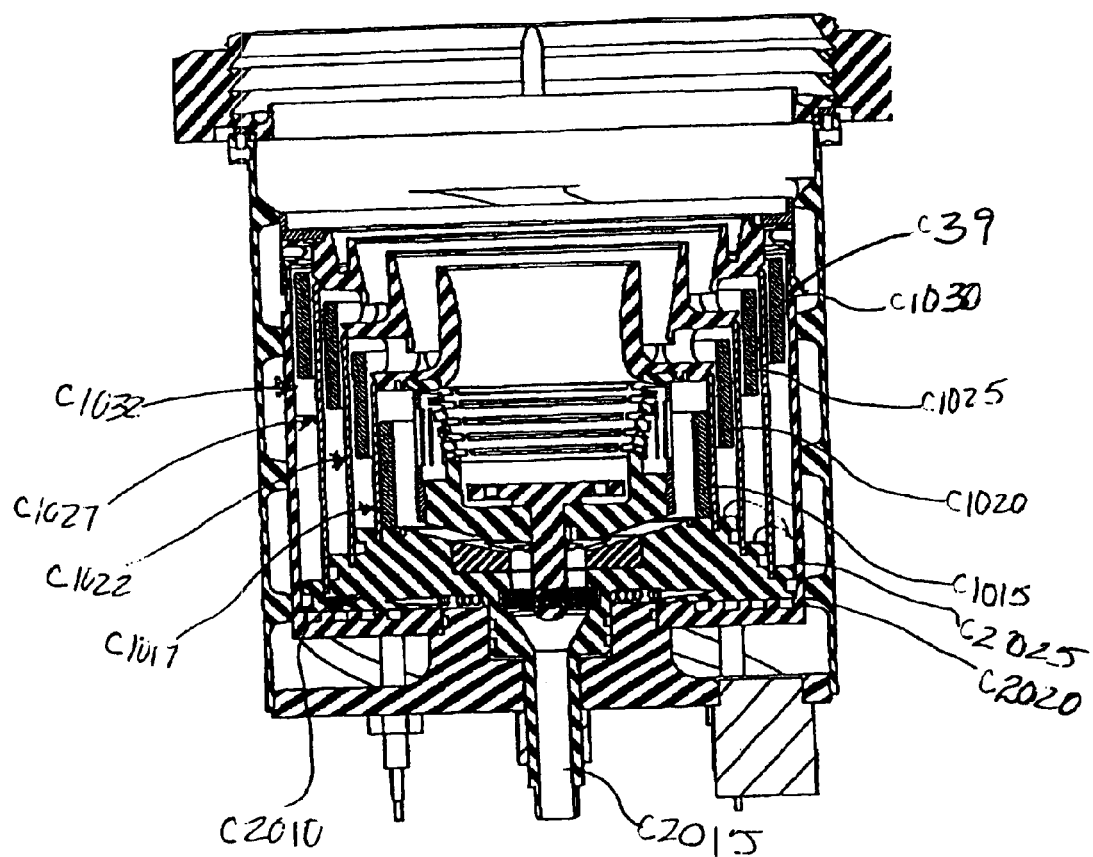
FIGURE C13

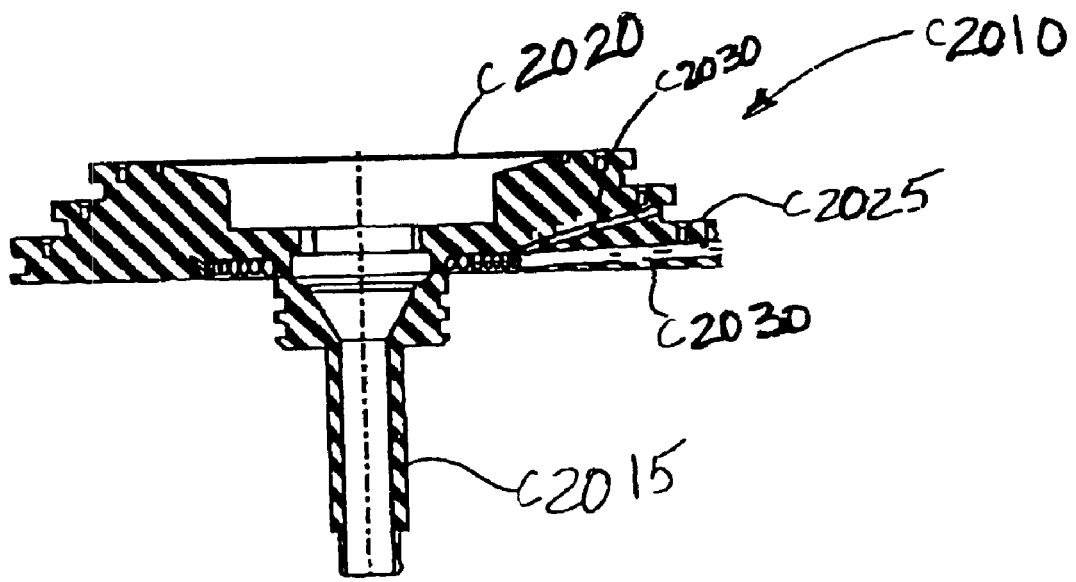
FIGURE C14

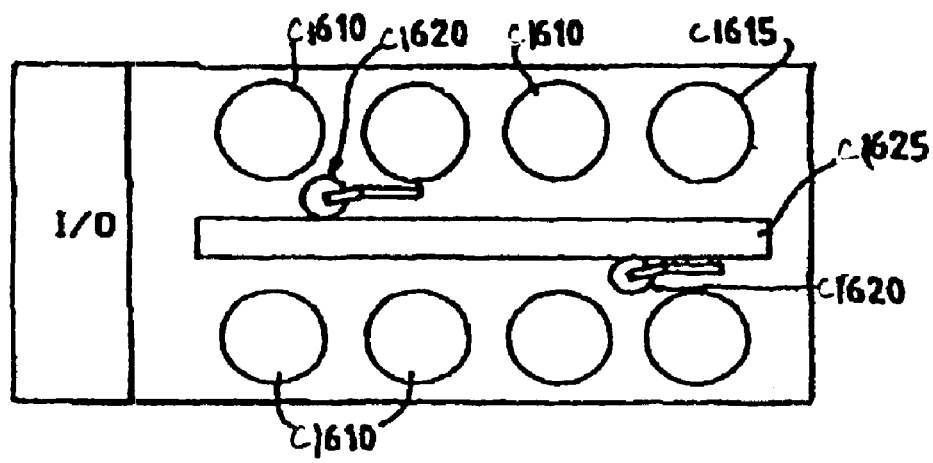
FIG. C15
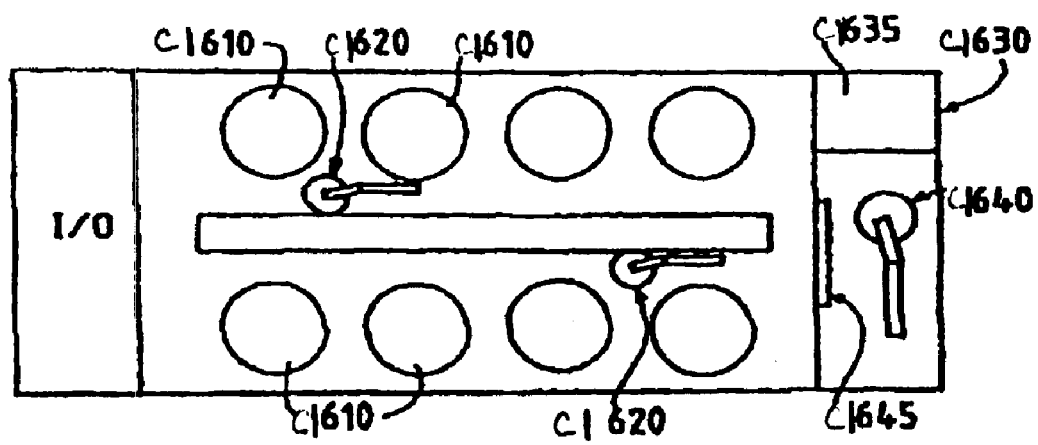
FIG. C16

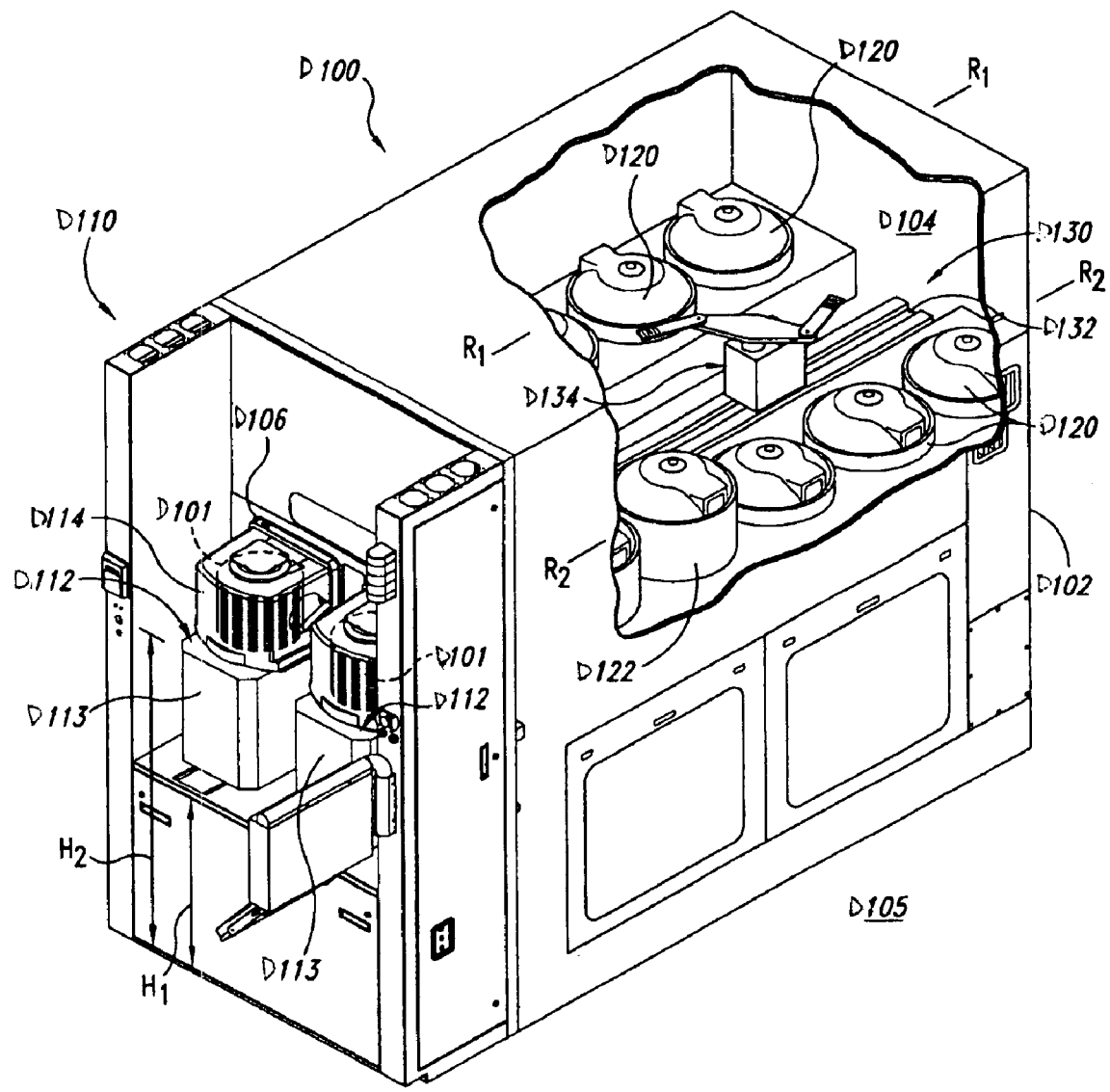
Fig. D1

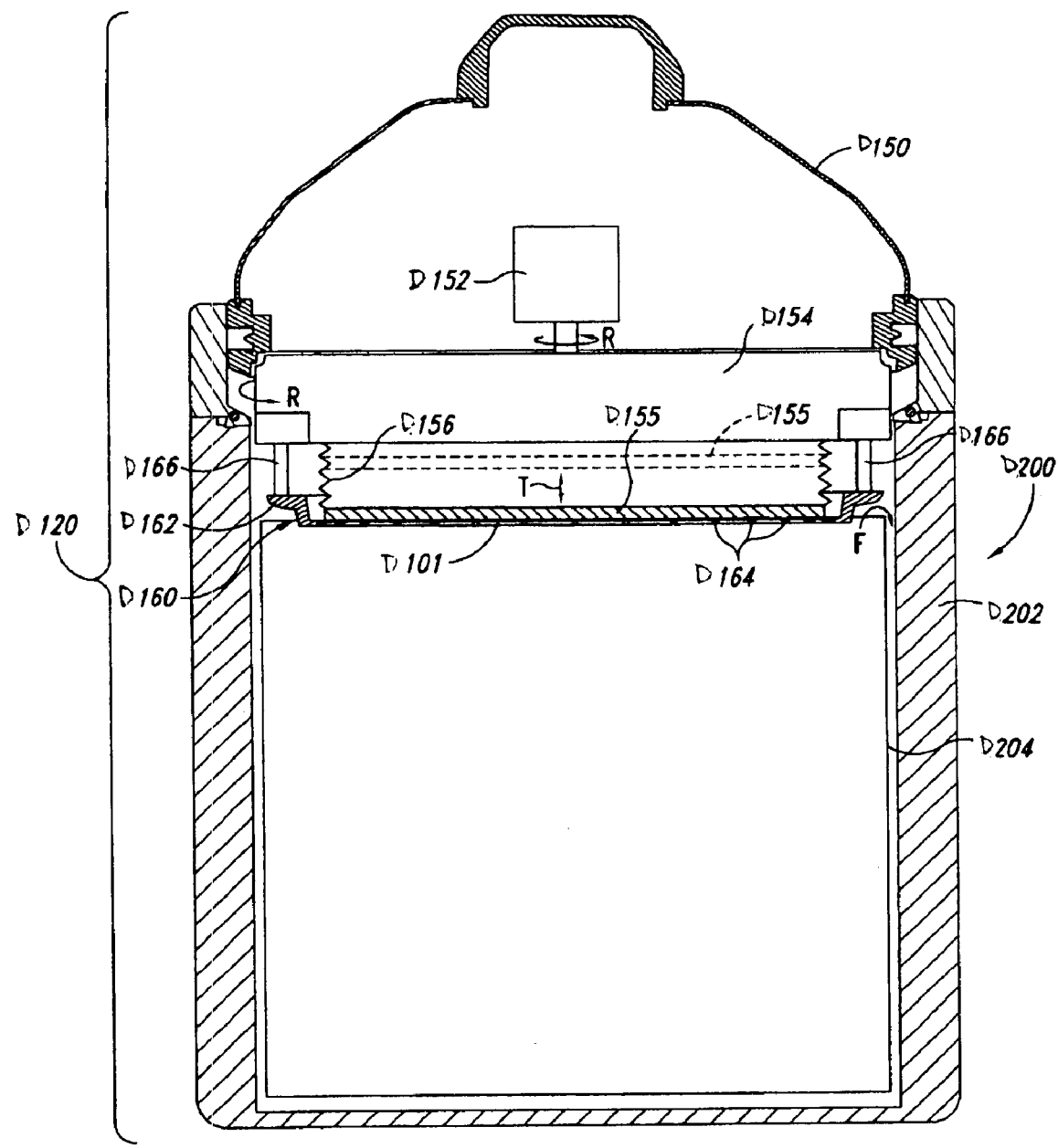
Fig. D2

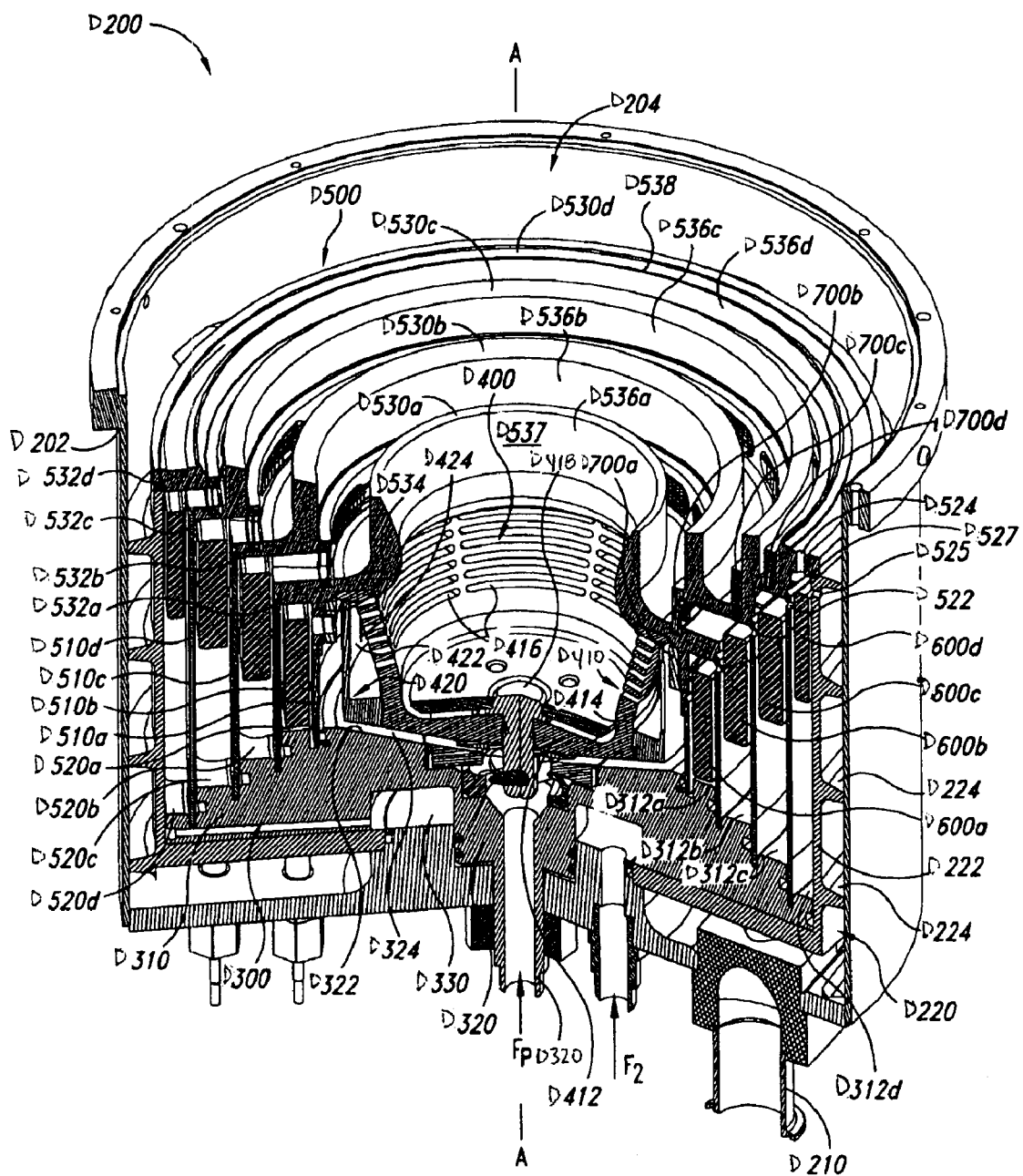
Fig. D3

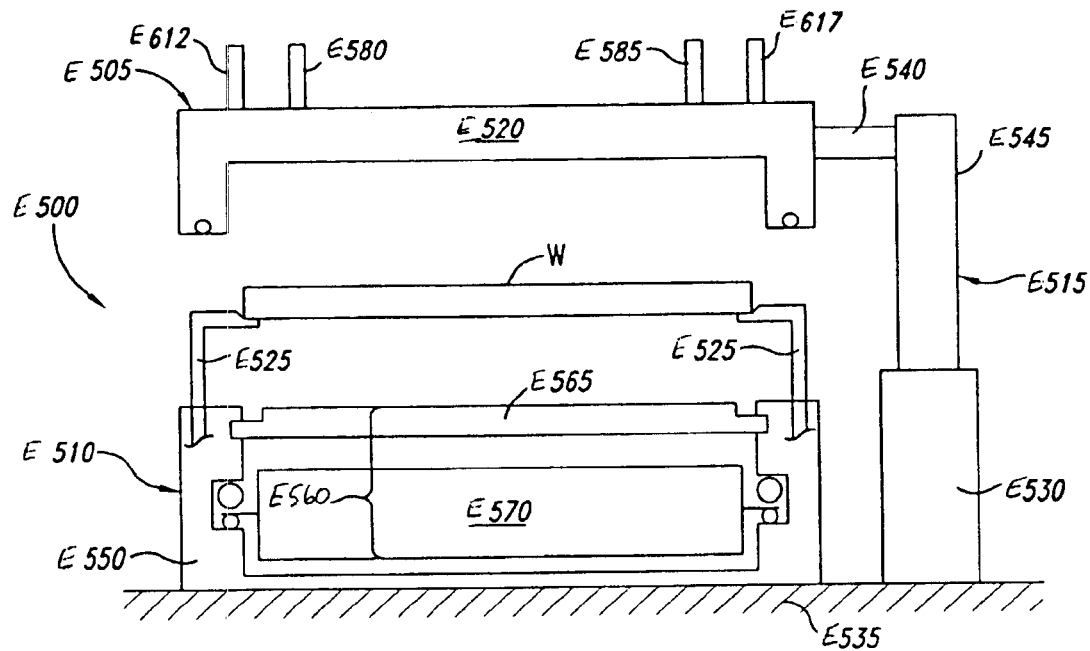
Fig. E1A
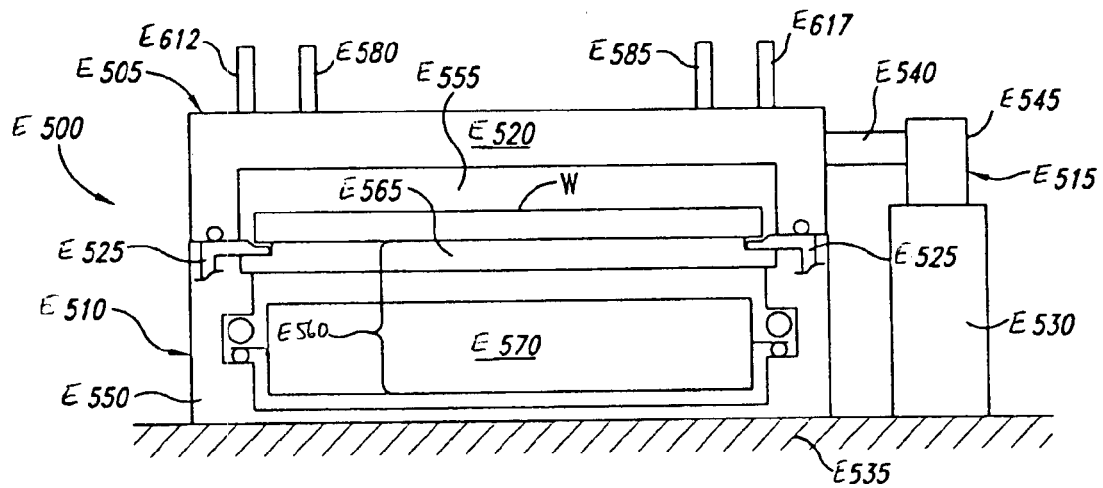
Fig. E1B

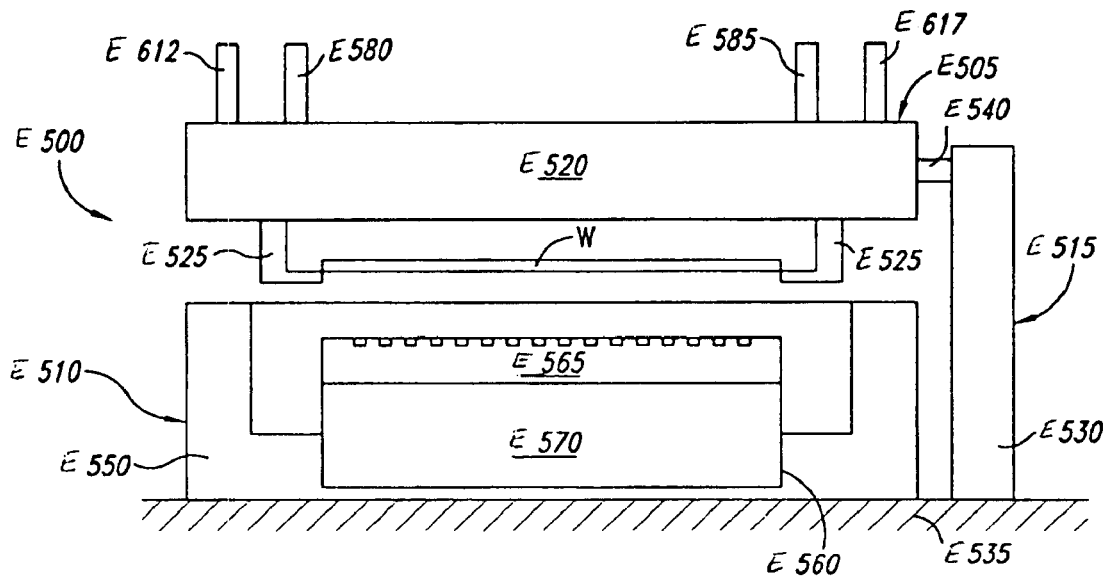
Fig. E1C
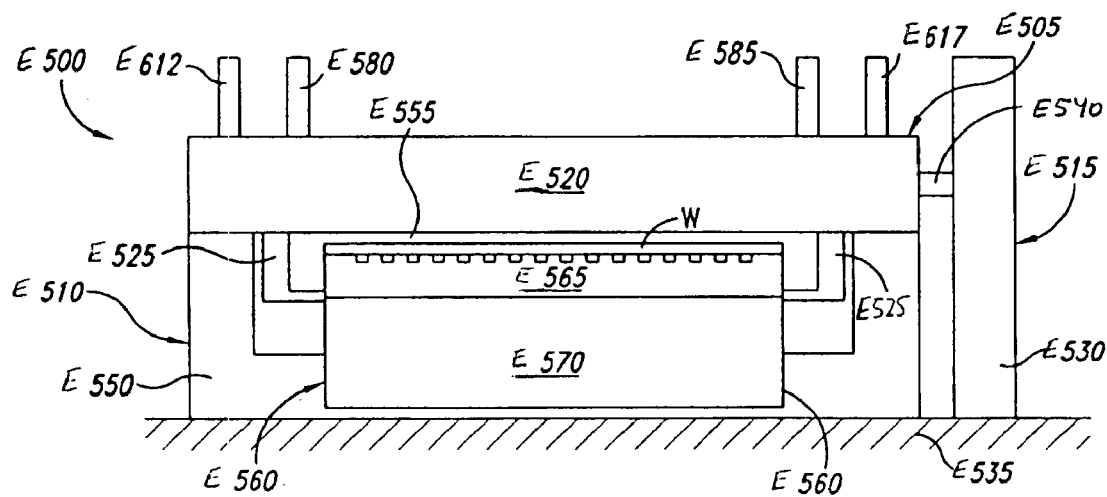
Fig. E1D

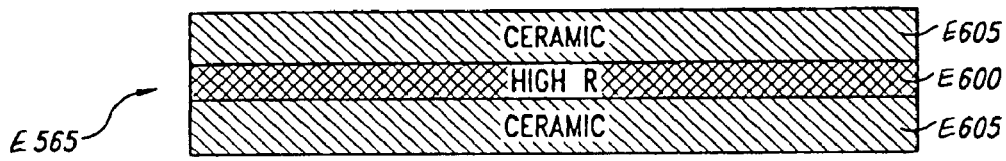
Fig. E2A
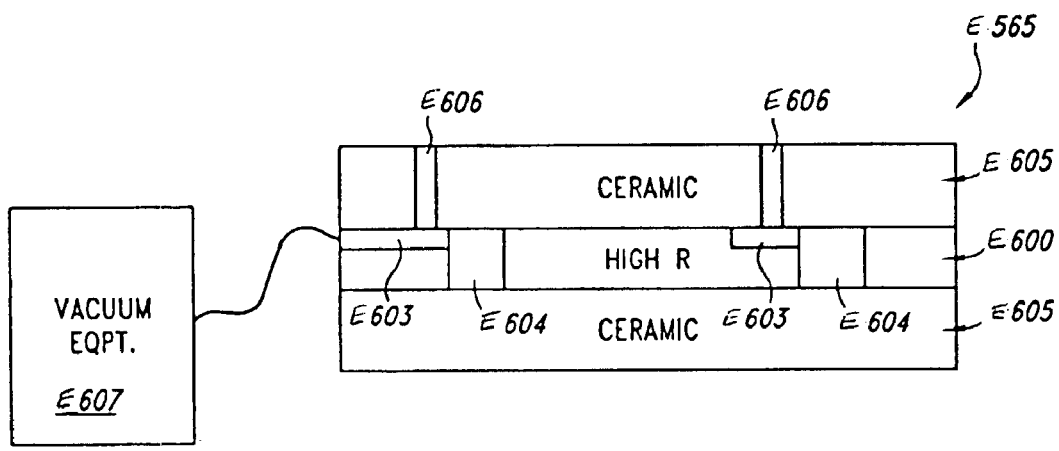
Fig. E2B
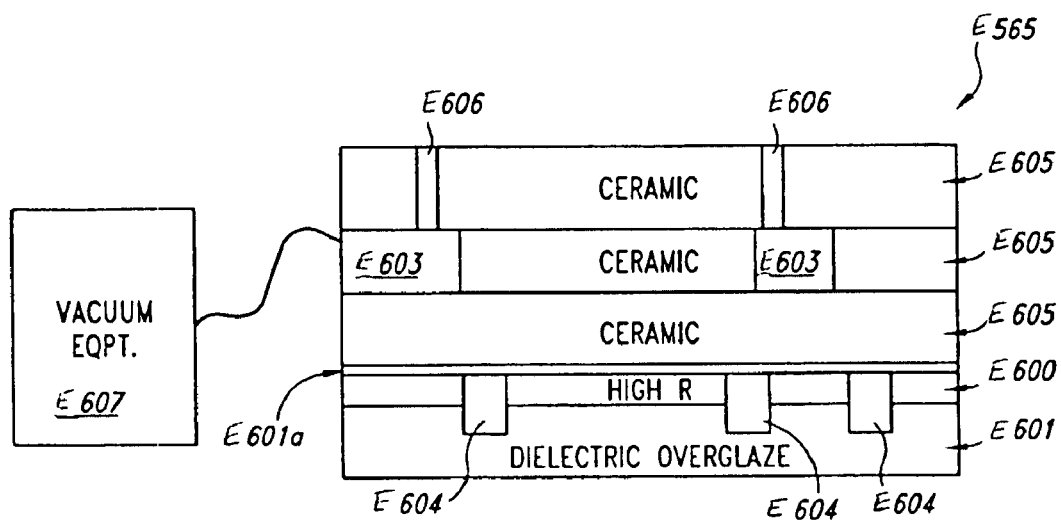
Fig. E2C

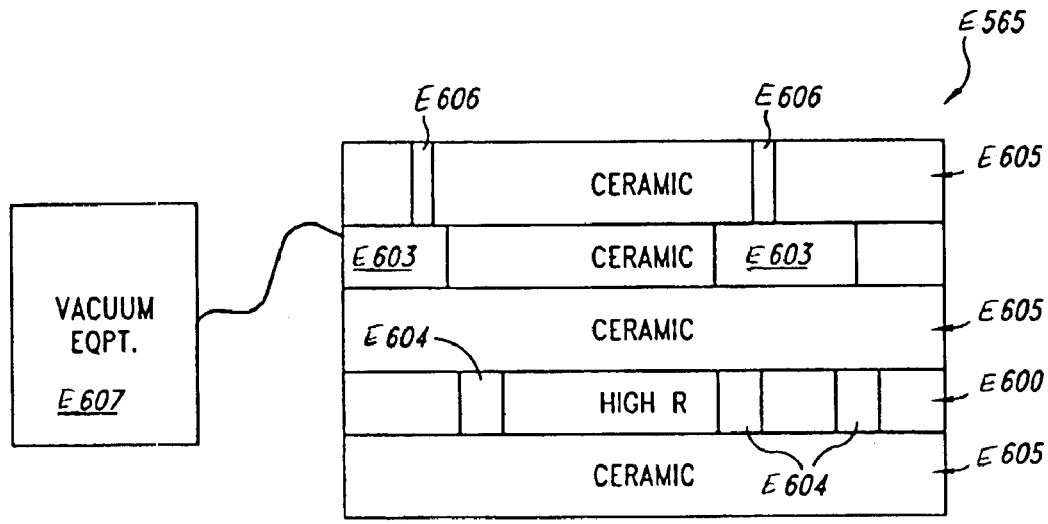
Fig. E2D
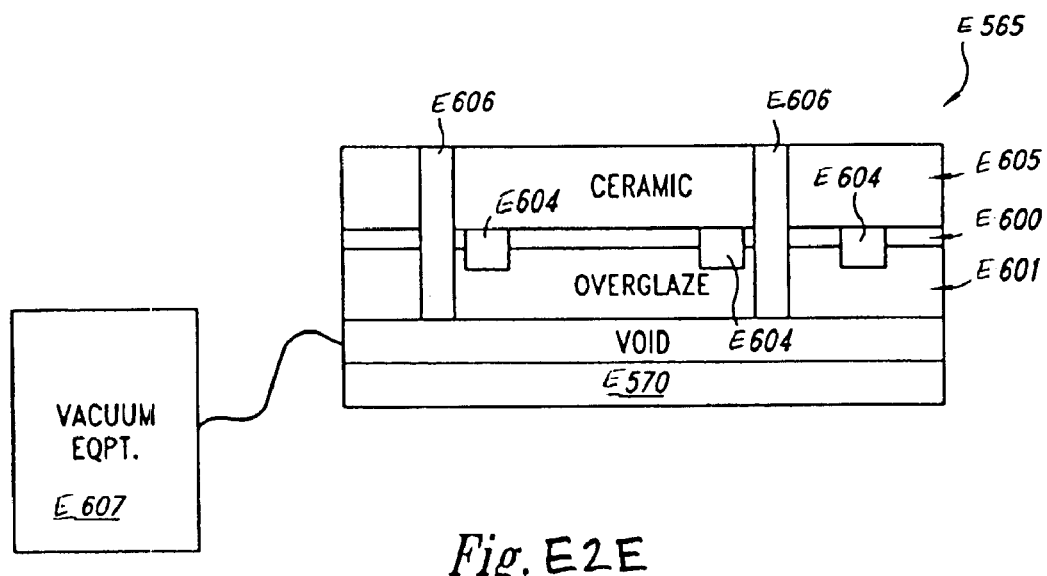
Fig. E2E

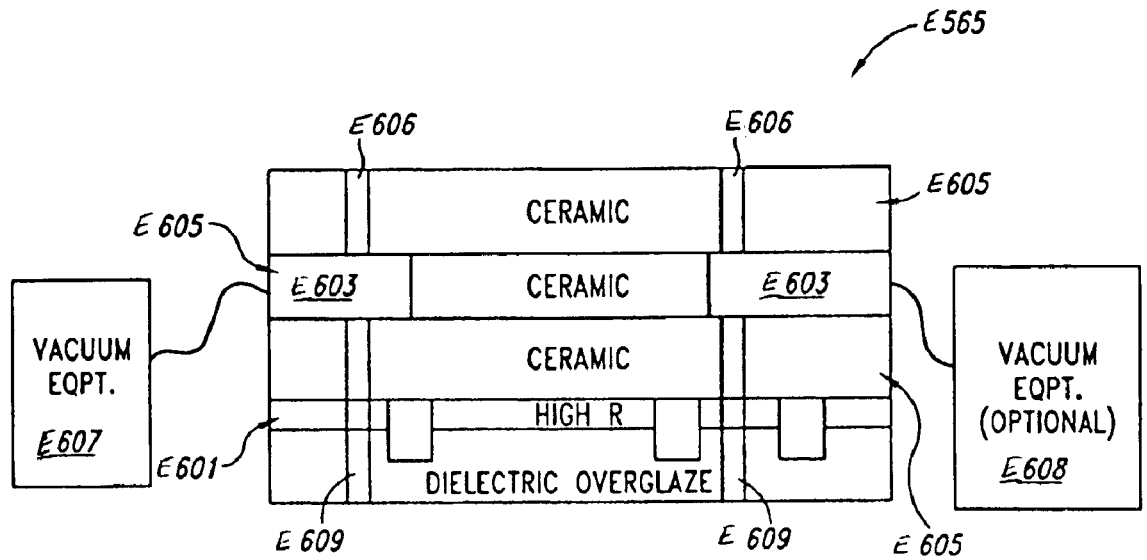
Fig. E2F
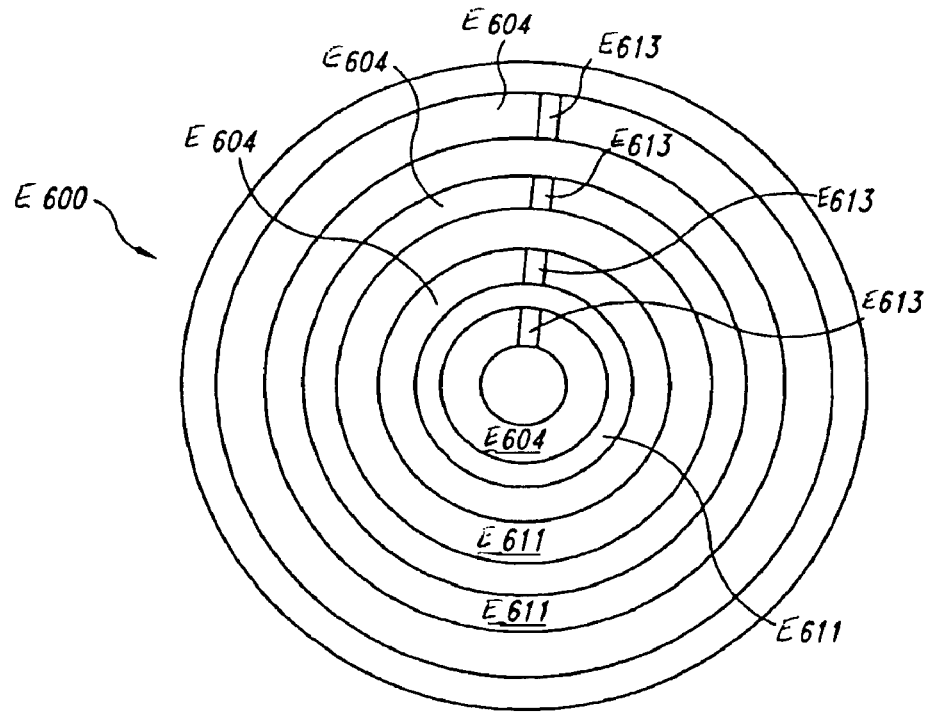
Fig. E2G

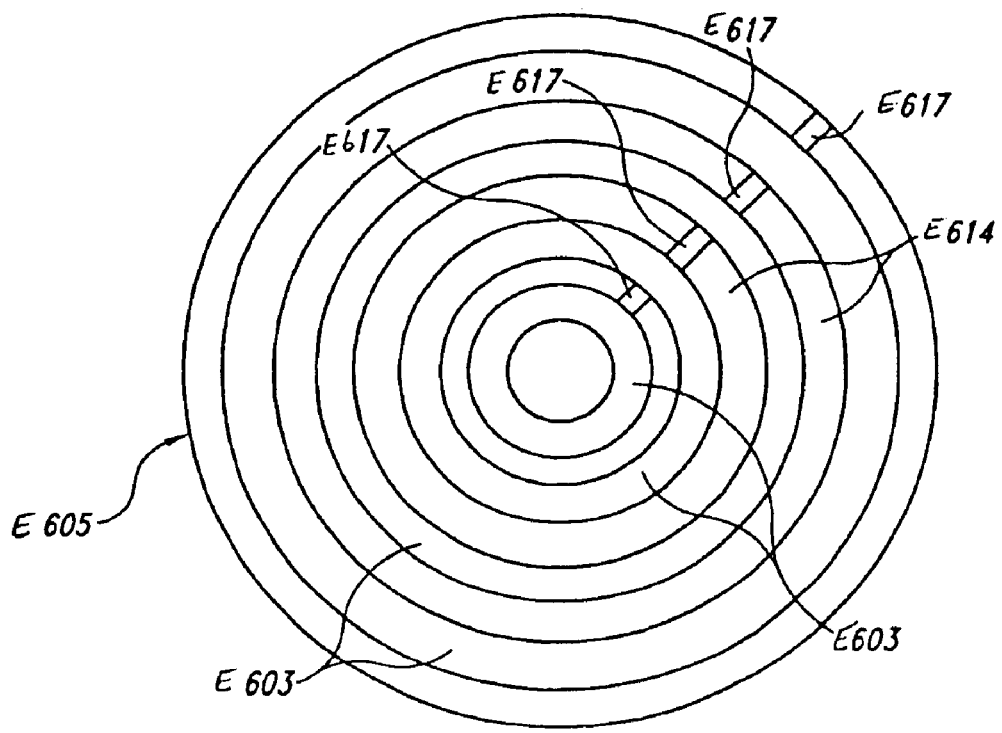
Fig. E2H
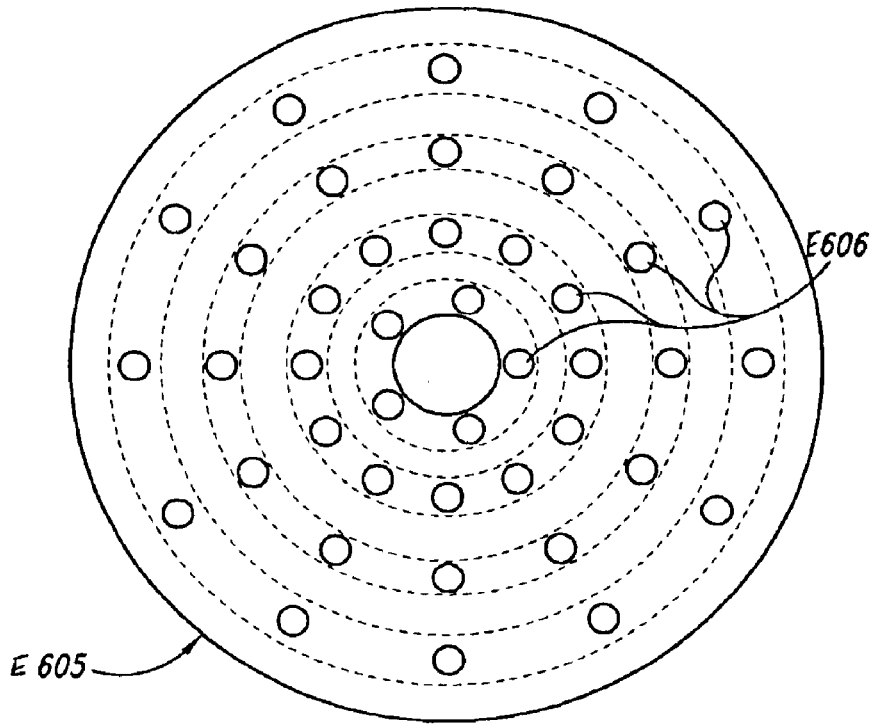
Fig. E2I

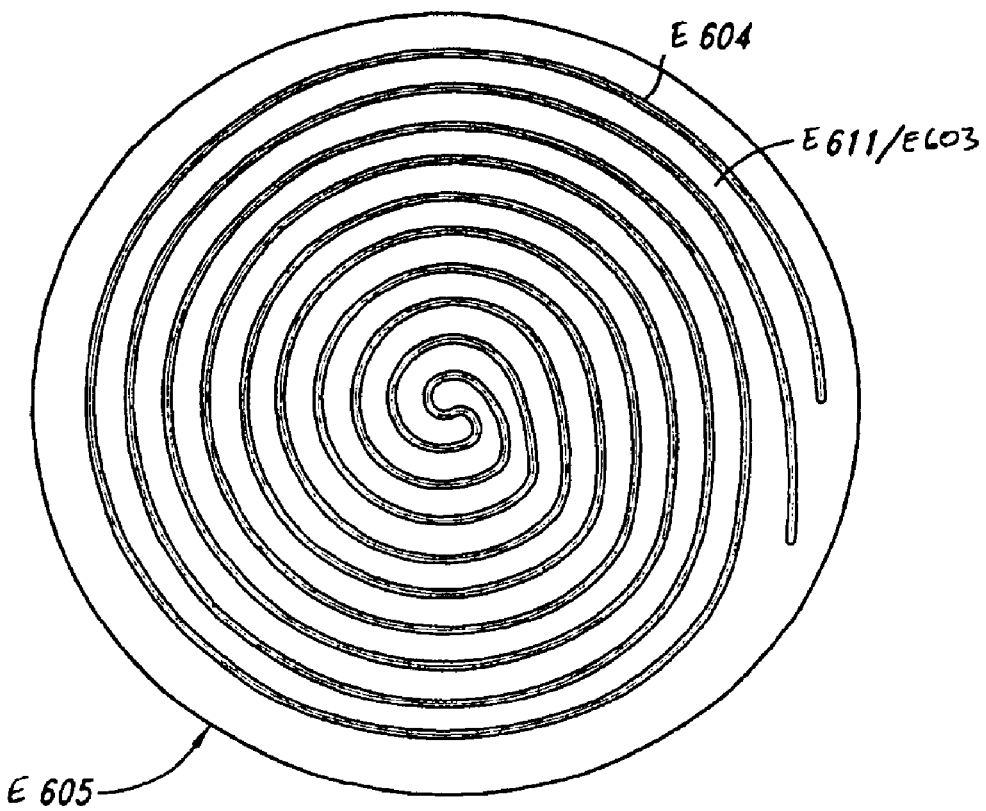
Fig. E2J

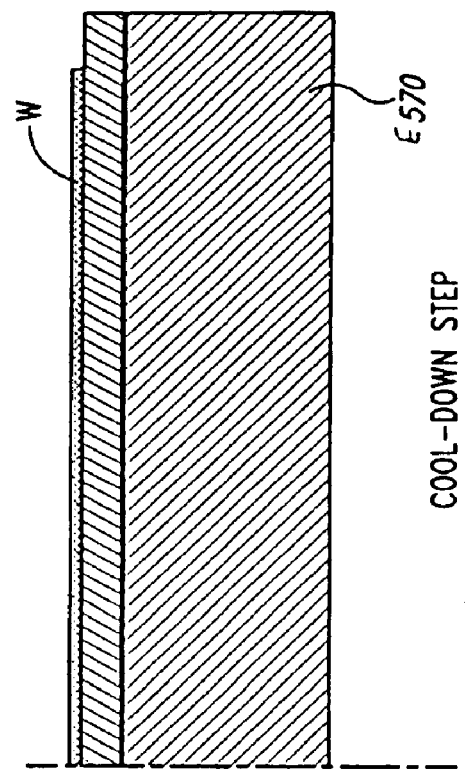
Fig. E3B
COOL-DOWN STEP
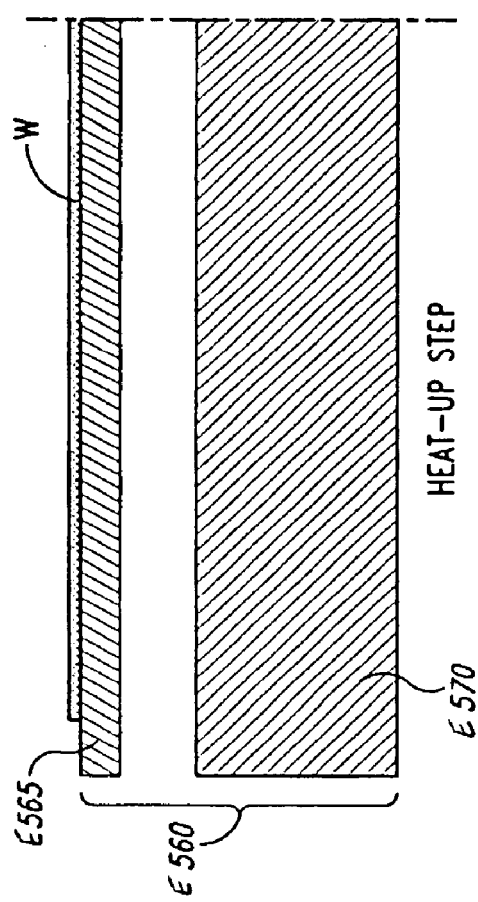
Fig. E3A
HEAT-UP STEP

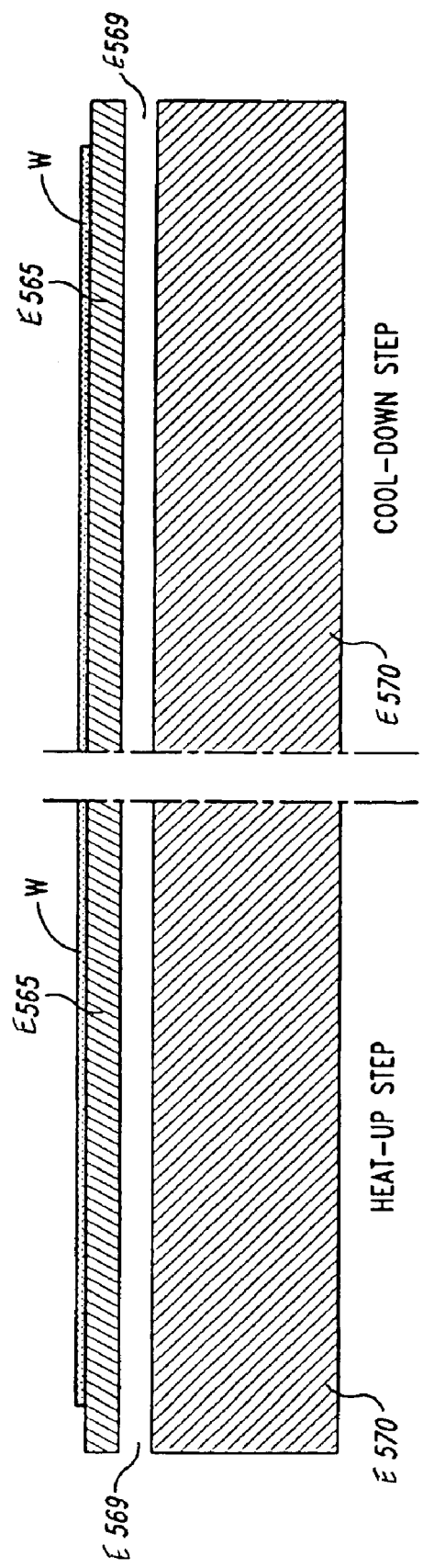

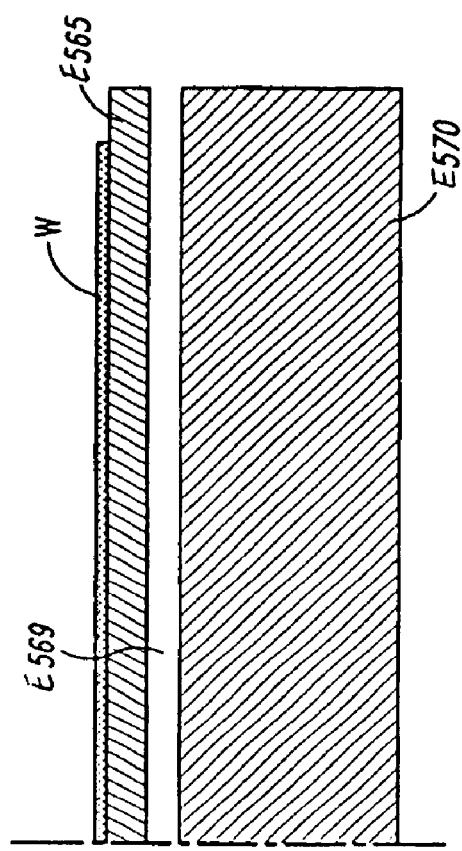
Fig. E5B
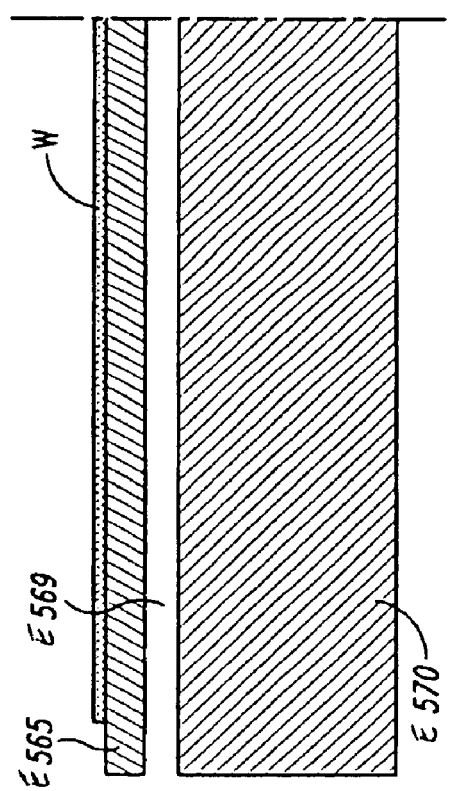
Fig. E5A

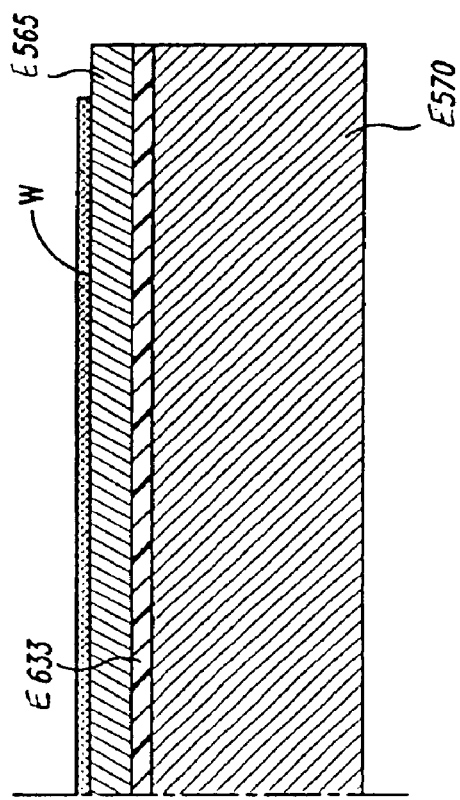
Fig. E6B
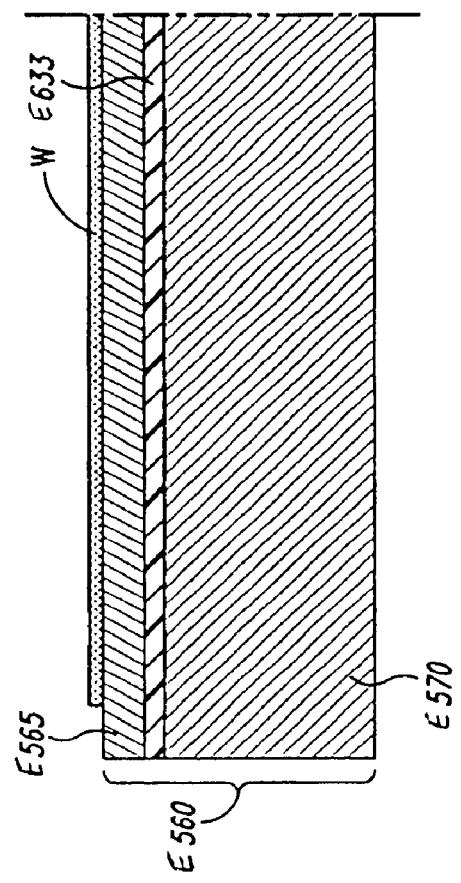
Fig. E6A

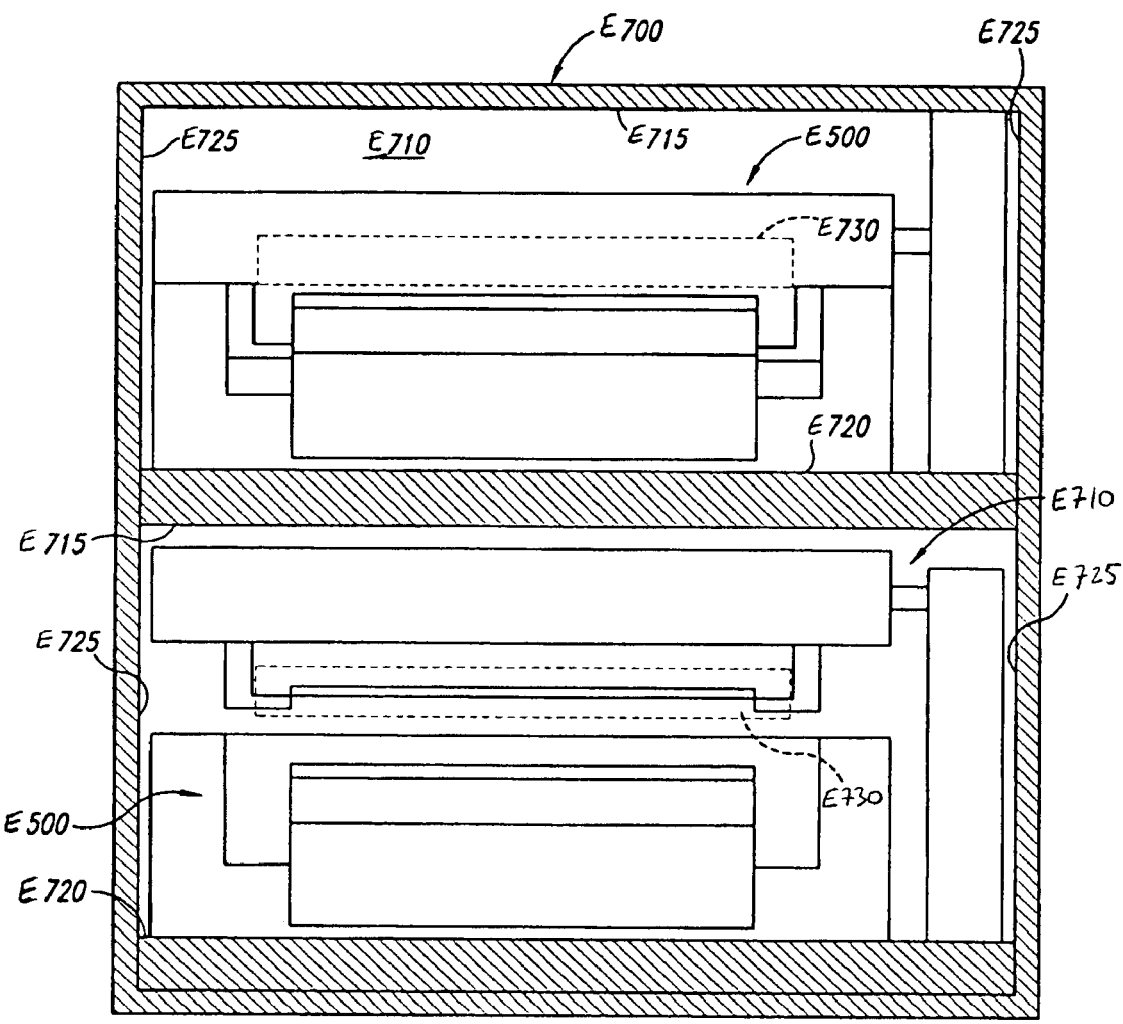
Fig. E7

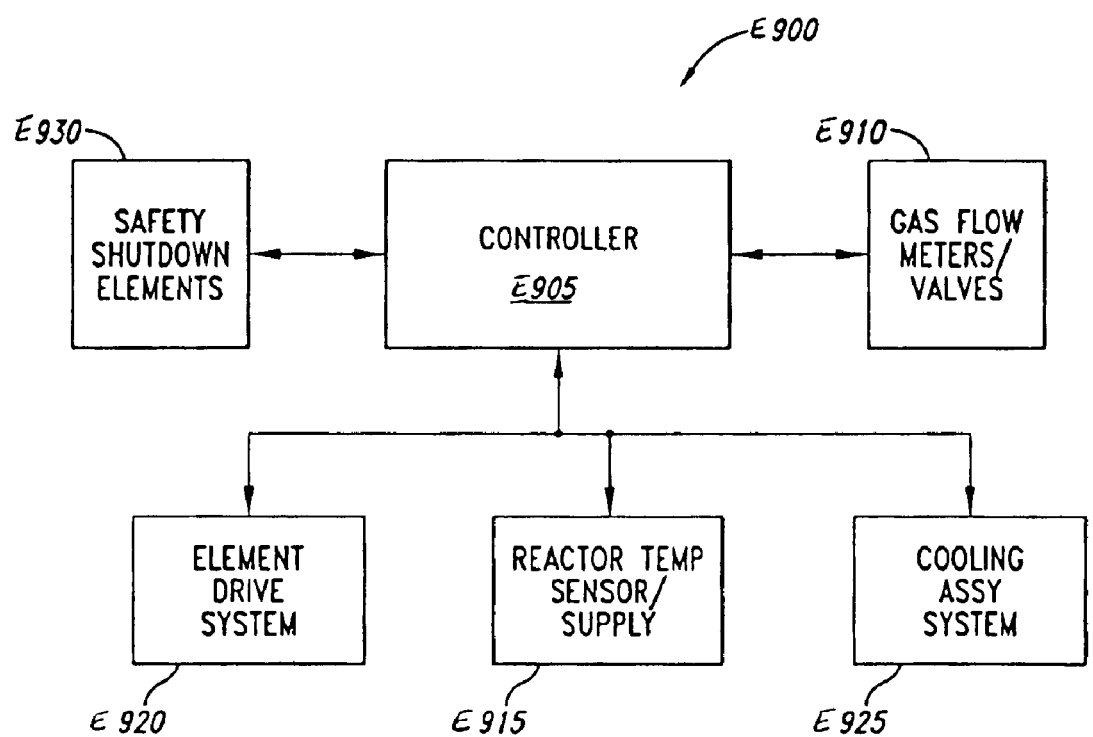
Fig. E8

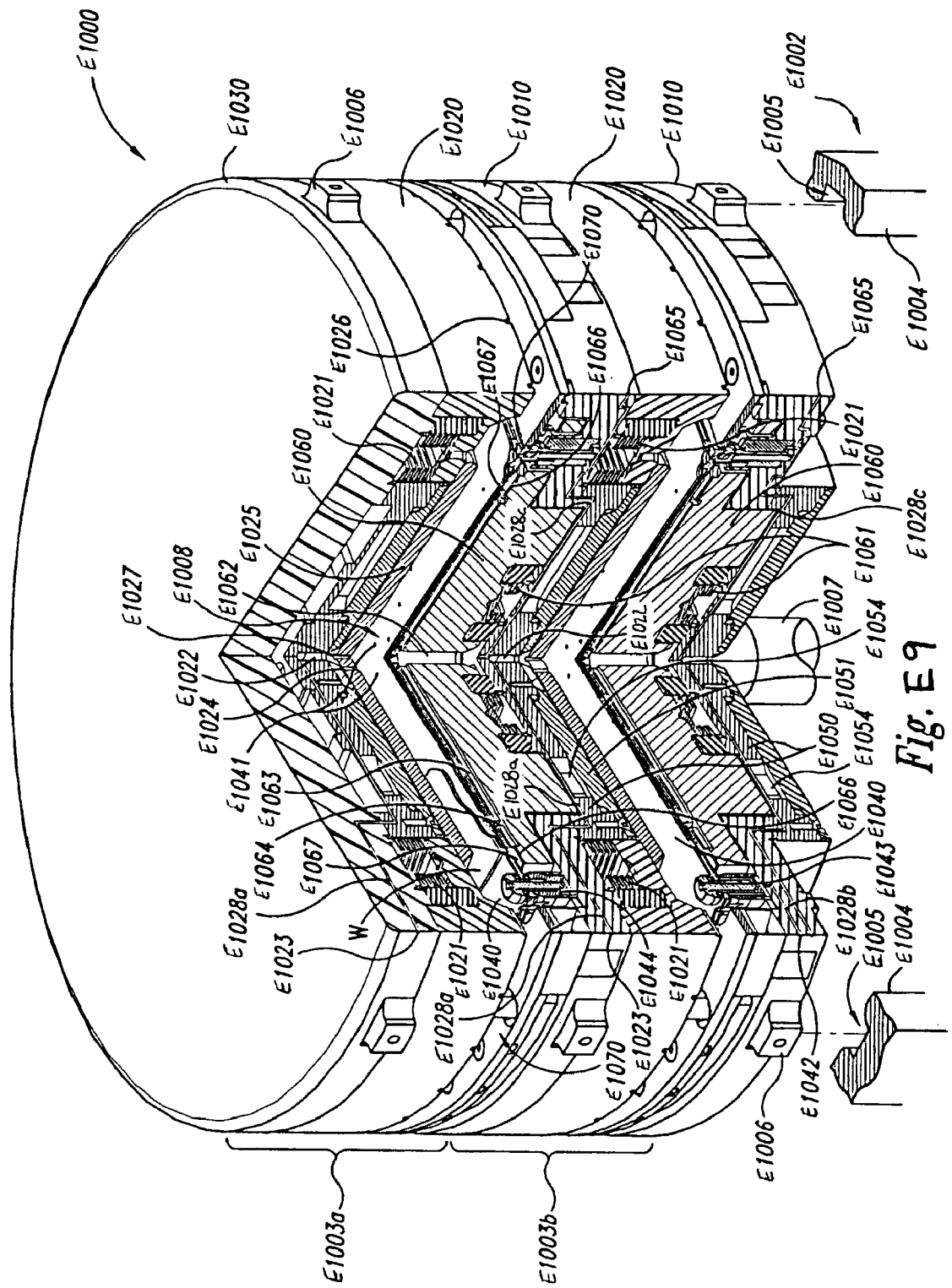
Fig. E9

METHODS AND APPARATUS FOR PROCESSING MICROELECTRONIC WORKPIECES USING METROLOGY

CROSS-REFERENCE TO RELATED APPLICATIONS

This application is a continuation in part of the following U.S. patent applications: U.S. patent application Ser. No. 09/612,176, filed Jul. 8, 2000; U.S. patent application Ser. No. 09/733,608, filed Dec. 8, 2000; U.S. patent application Ser. No. 09/866,463, filed May 24, 2001; and U.S. patent application Ser. No. 09/872,151, filed May 31, 2001.

BACKGROUND

The present invention is directed to apparatuses and methods for processing microelectronic workpieces. More particularly, the present invention is directed to an improved apparatus and method for processing microelectronic workpieces using a metrology result representative of a microelectronic workpiece condition.

The fabrication of microelectronic components from a microelectronic workpiece, such as a semiconductor wafer substrate, polymer or ceramic substrate, etc., involves a substantial number of operations performed on the microelectronic workpiece. Such operations include, for example, material deposition, patterning, doping, chemical mechanical polishing, electropolishing, and heat treatment.

Material deposition processing involves depositing, disposing, or otherwise forming thin layers of material on the surface of the microelectronic workpiece. Patterning provides deposition or removal of selected portions of these added layers. Doping of a microelectronic workpiece such as a semiconductor wafer, is the process of adding impurities known as "dopants" to the selected portions of the microelectronic workpiece to alter the electrical characteristics of the substrate material. Heat treatment of the microelectronic workpiece involves heating and/or cooling the microelectronic workpiece to achieve specific process results. Chemical mechanical polishing involves the removal of material through a combined chemical/mechanical process, while electropolishing involves the removal of material from a microelectronic workpiece surface using electrochemical reactions.

Production of semiconductor integrated circuits and other microelectronic devices from microelectronic workpieces, such as semiconductor wafers, typically requires the formation and/or electrochemical processing or one or more thin film layers on the microelectronic workpiece. The microelectronic manufacturing industry has applied a wide range of thin film layer materials to form such microelectronic structures. These thin film materials include metals and metal alloys such as, for example, nickel, tungsten, tantalum, solder, platinum, copper, aluminum, gold, etc., as well as dielectric materials, such as metal oxides, semiconductor oxides, and perovskite materials.

Electroplating and other electrochemical processes, such as electropolishing, electro-etching, anodization, etc., have become important in the production of semiconductor integrated circuits and other microelectronic devices from such microelectronic workpieces. For example, electroplating is often used in the formation of one or more metal layers on the microelectronic workpiece. These metal layers are typically used to electrically interconnect the various devices of the integrated circuit. Further, the structures formed from the metal layers may constitute microelectronic devices such as read/write heads, etc.

Electroplated metals typically include copper, nickel, gold, platinum, solder, nickel-iron, etc. Electroplating is generally effected by initial formation of a seed layer on the microelectronic workpiece in the form of a very thin layer of metal, whereby the surface of the microelectronic workpiece is rendered electrically conductive. This electroconductivity permits subsequent formation of a blanket or patterned layer of the desired metal by electroplating. Subsequent processing, such as chemical mechanical planarization, may be used to remove unwanted portions of the patterned or metal blanket layer formed during electroplating, resulting in the formation of the desired metallized structure.

Electropolishing of metals at the surface of a microelectronic workpiece involves the removal of at least some of the metal using an electrochemical process. The electrochemical process is effectively the reverse of the electroplating reaction and is often carried out using the same or similar reactors as electroplating.

Anodization typically involves oxidizing a thin-film layer at the surface of the microelectronic workpiece. For example, it may be desirable to selectively oxidize certain portions of a metal layer, such as a Cu layer, to facilitate subsequent removal of the selected portions in a solution that matches the oxidized material faster than the non-oxidized material. Further, anodization may be used to deposit certain materials, such as perovskite materials, onto the surface of the microelectronic workpiece.

As the size of various microelectronic circuits and components decreases, there is a corresponding decrease in the manufacturing tolerances that must be met by the manufacturing tools. It is desirable that electrochemical processes uniformly process the surface of a given microelectronic workpiece. It is also desirable that the electrochemical process meet microelectronic workpiece-to-microelectronic workpiece uniformity requirements.

Multiple processes must be executed upon a microelectronic workpiece to manufacture the desired microelectronic circuits, devices, or components. These processes are generally executed in processing tools that are specifically designed to implement one or more of the requisite processes. In order to automate the processing and minimize operator handling, tool architectures have been developed that incorporate multiple processing stations and automated transfer of the microelectronic workpieces from one processing station to the next.

In such tools, the microelectronic workpieces are processed individually at the various processing stations. Furthermore, multiple microelectronic workpieces are concurrently processed at different processing stations. Thus, one microelectronic workpiece may be processed in one of the processing stations while another microelectronic workpiece is concurrently processed in another one of the processing stations. In this way, a pipeline processing approach can be developed, which enhances production throughput. Additionally, processing steps that take longer to perform may have multiple processing stations devoted to performing that particular processing step, thereby enhancing production throughput.

Numerous processing tools have been developed to implement the foregoing processing operations. These tools take on different configurations depending on the type of microelectronic workpiece used in the fabrication process and the process or processes executed by the tool. An exemplary tool embodiment is disclosed in U.S. patent application Ser. No. 08/991,062, filed Dec. 15, 1997, entitled "Semiconductor Processing Apparatus Having Lift and Tilt Mechanism."

One tool configuration, known as the LT-210C™ processing tool and available from Semitool, Inc., of Kalispell, Mont., includes a plurality of microelectronic workpiece processing stations such as one or more rinsing/drying stations, one or more wet processing stations, and one or more thermal processing stations that includes a rapid thermal processing ("RTP") reactor. Such wet processing operations include electroplating, etching, cleaning, electroless deposition, electropolishing, etc.

In the processing of microelectronic workpieces, the output of one process is the input for the next process, and such output typically influences the output of the next process. This is true, for instance, in the case of a copper damascene interconnect process, with the barrier/seed layer process output influencing the output of the copper electrochemical deposition ("ECD") process, or the output of the copper ECD process influences the output of the copper chemical mechanical polishing ("CMP") process. This is also the case in most thin film ECD processes, where the thickness and the thickness uniformity of the seed layer affect the thickness uniformity of the plated film.

The present inventors have recognized the desirability of, in a process having a sequence of steps, automatically adjusting a workpiece processing step to affect its output in response to the output of a prior step or a subsequent step.

SUMMARY

The present invention is directed toward methods and apparatuses for processing microelectronic workpieces, such as semiconductor wafers. An apparatus in accordance with an embodiment of the invention includes a metrology unit that detects characteristics of a layered portion of the workpiece and transmits the characteristics to a control unit. The control unit transmits signals to a transport device or to processing chambers to direct where the workpiece goes next, and/or to influence the processes at either an upstream or downstream processing station. For example, this procedure can be implemented in a feed-forward fashion to influence the process carried out at the processing unit in advance of the arrival of the microelectronic workpiece. Alternatively, the process can be used in a feedback manner to influence a process carried out at the processing unit before the next microelectronic workpiece arrives at that processing unit. In either embodiment, metrology data obtained from a workpiece can automatically influence a subsequent process step for that workpiece or another workpiece.

In one embodiment, the apparatus includes a metrology unit that is configured to receive the microelectronic workpiece and detect a condition of a layered portion of the microelectronic workpiece. The metrology unit is further configured to transmit a condition signal that is representative of the condition of the layered portion of the microelectronic workpiece. The apparatus can further include a transport unit positioned to move the microelectronic workpiece, and a control unit that is operatively coupled to the metrology unit and at least one of the transport unit and another processing unit. The control unit is configured to receive the condition signal from the metrology unit and, based on the condition signal, transmit a first transmitted signal and/or a second transmitted signal. The first transmitted signal is configured to direct the transport unit to move the microelectronic workpiece, and the second transmitted signal is configured to influence a process that is carried out at the other processing unit. Accordingly, the apparatus can take results obtained at the metrology unit and, based on those results, send the microelectronic workpiece to the appropriate processing unit, and/or influence the process completed at that processing unit.

The processing unit to which the microelectronic workpiece is delivered, and which can be influenced by the control unit, can include, for example, a stripping unit, a deposition unit, or an anneal unit. These processing units can be integrated into a tool along with the metrology unit, or, alternatively, these processing units can be positioned in housings separate from the metrology unit.

In a further aspect of the invention, the stripping unit can be configured to chemically strip part of the layered portion from the microelectronic substrate. Accordingly, the stripping unit can include a rotor motor and a workpiece housing connected to the rotor motor so that it rotates with the rotor motor. The workpiece housing can define a closed processing space that is coupleable to sources of one or more processing fluids so as to distribute the processing fluids across at least one face one of the workpiece, for example, by centrifugal force as the housing rotates. Accordingly, the device can more accurately control the interaction between the processing fluid and the workpiece, and increase the yield of the workpiece.

In yet a further aspect of the invention, the processing unit can include a deposition unit, such as an electrochemical deposition unit, that is configured to dispose a layer of material on the microelectronic substrate. The deposition unit can include a reaction vessel having an outer container configured to introduce a primary flow and a secondary flow that is separate from the primary flow. The reaction vessel can further include a dielectric field shaping unit configured to contain the secondary flow separate from the primary flow, and can include an electrode compartment (with an electrode) through which the secondary flow can pass while remaining separate from the primary flow. The field shaping unit can create a virtual electrode such that the workpiece is shielded from the electrode. This allows for use of larger electrodes to increase electrode life, eliminates the need to "burn-in" electrodes to decrease downtime, and/or provides the capability of manipulating the electrical field by merely controlling the electrical current to one or more of the electrodes in the vessel.

In another aspect of the invention, the deposition unit can include a power control system connected to a power supply to control at least one electrical power parameter associated with independently connected electrodes in the reactor. The power control system can set the electrical power parameter for one of the independently connected electrodes based on one or more inputted parameters and a plurality of predetermined sensitivity values. The predetermined sensitivity values can correspond to process perturbations resulting from perturbations of the electrical power parameter for the given one of the independently connected electrodes. Accordingly, the electrical power provided to each workpiece can be tailored to that workpiece.

In still another aspect of the invention, the annealing unit can include an apparatus support, a heat source supported by the apparatus support, and a workpiece support positioned proximate to the heat source to engage and support the microelectronic workpiece relative to the heat source. The annealing unit can further include a heat sink that is positioned proximate to the heat source to selectively transfer heat from the heat source to cool a heat source and the microelectronic workpiece. In yet a further aspect of this embodiment, at least one of the heat sink and the heat source can be movable relative to the other in between an engaged position with the heat sink engaged to the heat source, and a disengaged position with the heat source heat sink spaced from the heat source.

Figure 1:
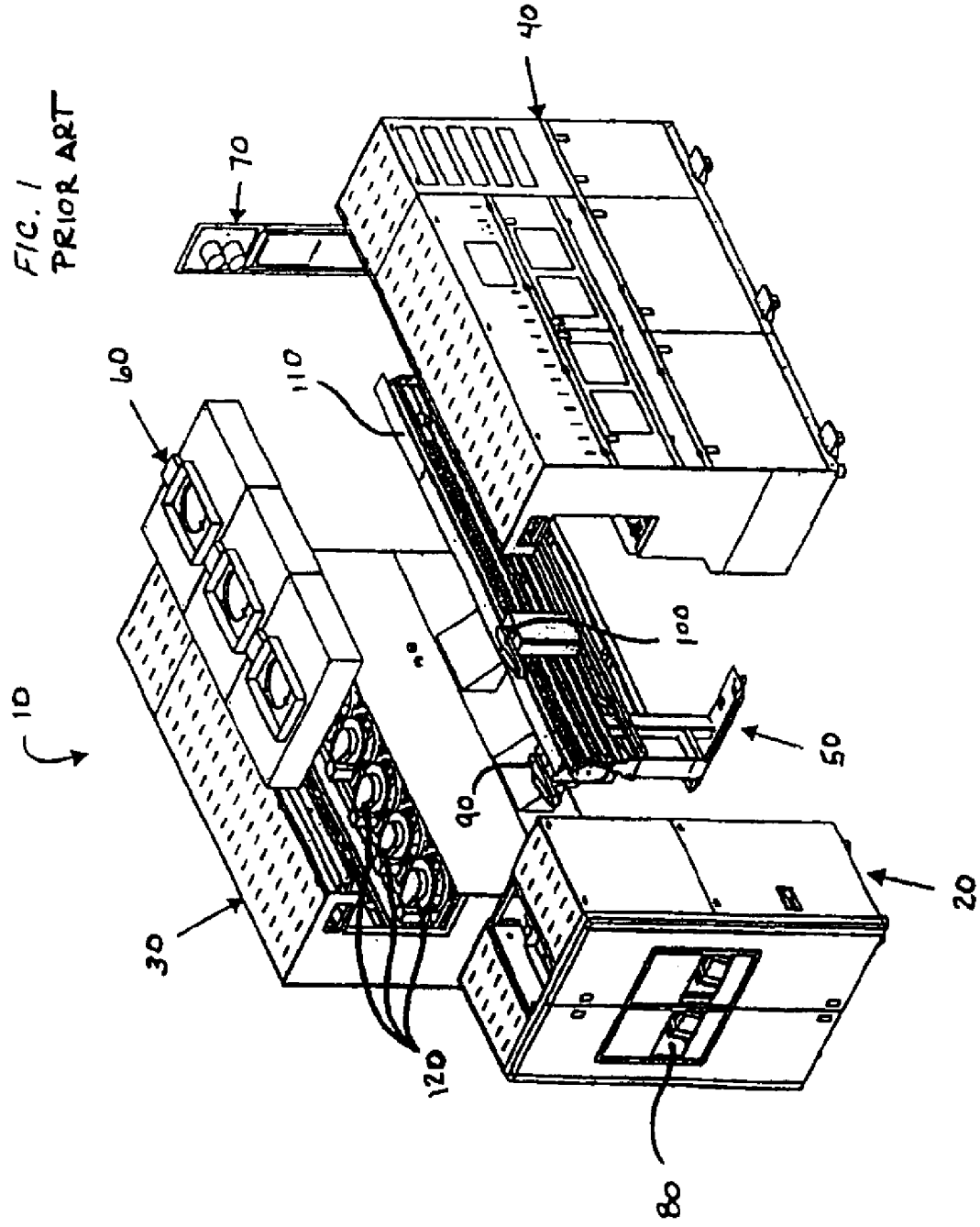
FIG. 1 is an exploded isometric view of a prior art processing tool.

FIGS. A1A, A1B, A1C, and A1D are fragmentary, cross-sectional views of a microelectronic workpiece, such as a silicon wafer, at various stages of a known sequence of processing steps in accordance with prior art.

FIGS. A2A, A2B, A2C, and A2D are fragmentary, cross-sectional views of a microelectronic workpiece, such as a silicon wafer, at various stages of a novel sequence of processing steps in accordance with an embodiment of the invention.

FIGS. A3 and A4 illustrate one embodiment of a reactor that can be used to implement a process of the present invention.

FIG. B1 is a cut-away, perspective view of a reactor in accordance with an embodiment of the invention.

FIG. B2 is a cross-sectional view of the reactor shown in FIG. B1, as taken through its central, vertical axis.

FIG. B3 is an enlarged detail of certain elements of the reactor, as taken within a circle drawn in FIG. B2.

FIGS. B4 and B5 are further enlarged details of a portion of what is illustrated in FIG. B3, as taken at different places around the reactor in accordance with an embodiment of the invention.

FIG. C1 is a process schematic diagram showing inputs and outputs of an optimizer in accordance with an embodiment of the invention.

FIG. C2 is a process schematic diagram showing a branched correction system utilized by some embodiments of the optimizer.

FIG. C3 is schematic block diagram of an electrochemical processing system constructed in accordance with one embodiment of the optimizer.

FIG. C4 is a flowchart illustrating one manner in which the optimizer of FIG. C3 can use a predetermined set of sensitivity values to generate a more accurate electrical parameter set for use in meeting targeted physical characteristics in the processing of a microelectronic workpiece.

FIG. C5 is a graph of a sample Jacobian sensitivity matrix for a multiple-electrode reaction chamber.

FIG. C6 is a spreadsheet diagram showing the new current outputs calculated from the inputs for the first optimization run.

FIG. C7 is a spreadsheet diagram showing the new current outputs calculated from the inputs for the second optimization run.

FIG. C8 is a schematic diagram of one embodiment of a process container that may be used in the reactor assembly shown in FIG. C3, and includes an illustration of the velocity flow profiles associated with the flow of the processing fluid through the reactor chamber.

FIGS. C9 and C10 illustrate one embodiment of a complete processing chamber assembly that may be used in connection with the present invention.

FIGS. C11 and C12 are cross-sectional views of computer-generated velocity flow contours of the processing chamber embodiment of FIGS. C9 and C10.

FIGS. C13 and C14 illustrate a modified version of the processing chamber of FIGS. C9 and C10.

FIGS. C15 and C16 illustrate two embodiments of processing tools that may incorporate one or more processing stations that are constructed and operate in accordance with the teachings of the present invention.

FIG. D1 is an isometric view of an electroprocessing machine having electroprocessing stations for processing microelectronic workpieces in accordance with an embodiment of the invention.

FIG. D2 is a cross-sectional view of an electroprocessing station having a processing chamber for use in an electroprocessing machine in accordance with an embodiment of the invention. Selected components in FIG. D2 are shown schematically.

FIG. D3 is an isometric view showing a cross-sectional portion of a processing chamber in accordance with an embodiment of the invention.

FIGS. E1A–E1D are schematic block diagrams of thermal reactors constructed in accordance with two embodiments of the present invention.

FIGS. E2A–E2F are cross-sectional views of further embodiments of a thick film heater that may be used in thermal transfer units of the thermal reactors shown in FIGS. E1A–E1D.

FIGS. E2G–E2J are plan views of various elements that can form the thick film heater constructions illustrated in FIGS. E3A–E3F.

FIGS. E3A–E6B illustrate various manners in which the thick film heater and a heat sink may cooperate with one another in a thermal transfer unit in accordance with an embodiment of the invention.

FIG. E7 illustrates one manner in which a plurality of thermal reactors of the type shown in FIGS. E1A–E1D may be integrated into a single annealing station.

FIG. E8 illustrates one embodiment of a programmable control system that may be used to coordinate the operation of the thermal reactor.

FIG. E9 is a partially schematic, partially cut-away, side isometric view of an apparatus for annealing microelectronic workpieces in accordance with an embodiment of the invention.

DETAILED DESCRIPTION

The present invention is directed to methods and apparatuses for processing microelectronic workpieces. In one aspect of the invention, the apparatus can include a metrology unit that is linked with other processing units via a control unit to influence processes performed at the other units. The other processing units can include electrochemical processing units (such as electrodeposition units, electrolytic units or electrophoretic units), stripping units, seed layer enhancement units, electroless units, annealing units, chemical mechanical polishing units, non-compliance units, and/or transfer devices for conveying the microelectronic workpieces among the units. Many of the processing units, including the metrology unit, can be positioned within a single housing that defines an at least partially enclosed processing environment. Alternatively, one or more of the foregoing processing units, including the metrology unit, can be positioned external to a housing that encloses one or more of the remaining units.

For purposes of the present application, a microelectronic workpiece is defined to include a workpiece formed from a substrate, such as a silicon wafer, upon which microelectronic circuits or components, data storage elements or layers, and/or micro-mechanical elements are or may be formed. Although the present invention is applicable to this wide range of products, the invention will be particularly described in connection with its use in the production of structures formed during the production of integrated circuits on a semiconductor wafer.

The following sections describe both systems for carrying out the invention (Section I) and components of those systems (Section II). The following Table of Contents is provided to outline the subsequent descriptions, and to identify figures relevant to each of the sections and subsections identified therein. Accordingly, the figures identified in the Table of Contents below are first described in the corresponding section or subsection, and may also be referred to in other sections.

DETAILED DESCRIPTION TABLE OF CONTENTS

| Section Heading | Figures |
|---|---|
| I. Systems | |
|    A. Integrated Processing Tool | FIG. 1 |
|    B. Metrology Controlled Processing Tool | FIG. 2 |
|    C. High Throughput Embodiment | FIG. 3 |
|    D. Process Development Embodiment | FIG. 4 |
|    E. Process Sequences | FIGS. 5–8 |
|    F. Multi-Tool Integrated Metrology Systems | FIGS. 9–10 |
| II. Components | |
|    A. Stripping Units | |
|       1. Process Example | FIGS. A1A–A4 |
|       2. Reactor Example | FIGS. B1–B5 |
|    B. Electrochemical Processing Units | |
|       1. Tuning Electrodes | FIGS. C1–C16 |
|       2 Electrochemical Processing Station | |
|          a. Integrated Tools | FIGS. D1–D2 |
|          b. Reaction Vessels | FIG. D3 |
|    C. Seed Layer Enhancement Units | |
|    D. Electroless Unit | |
|    E. Annealing Units | |
|       1. Annealing Chamber Examples | FIGS. E1A–E9 |
|    F. Metrology Unit | |
|    G. Input/Output Station | |
|    H. Non-Compliance Station | |
|    I. Linear Robot System | |
|    J. Chemical Mechanical Polishing Station | |

I. Systems

A. Integrated Processing Tool

FIG. 1 is an exploded isometric view of a prior art integrated microelectronic workpiece-processing tool 10. This exemplary tool embodiment is disclosed in U.S. patent application Ser. No. 08/991,062, filed Dec. 15, 1997, entitled "Semiconductor Processing Apparatus Having Lift and Tilt Mechanism," incorporated herein in its entirety by reference.

Although modularity is not necessary to the overall tool function, an embodiment of the tool 10 is shown as having been separated into individual modular components. The exemplary integrated microelectronic workpiece processing tool 10 of FIG. 1 comprises an input/output section 20, a processing section including first and second processing subsections 30 and 40, a microelectronic workpiece transfer apparatus 50, an exhaust assembly 60, and an end panel 70.

The input/output section 20 includes an opening 80 through which one or more cassettes can be received or removed. Generally stated, cassettes that are received at the input/output section 20 include microelectronic workpieces that are to be processed within the tool 10, while cassettes that are removed from the input/output section 20 include microelectronic workpieces that have already been processed within the tool 10. However, it will be recognized that a processed microelectronic workpiece may be returned directly to the cassette from which it was respectively provided to the tool.

In the embodiment of FIG. 1, the cassettes are received directly by one or more direct-access assemblies that, in turn, allow direct access to individual microelectronic workpiece slots of the cassettes. For example, in the specific tool shown here, the cassettes are directly received by and removed from one or more direct-access assemblies. The direct-access assemblies of the illustrated embodiment are constructed as lift/tilt assemblies that both lift the cassette and reorient it for presentation to a subsequent microelectronic workpiece transfer assembly. When the lift/tilt assemblies initially receive the cassettes, the microelectronic workpieces are in a first position with respect to horizontal, such as a substantially vertical position. Each lift/tilt assembly then reorients (i.e., tilts) the respective cassette to a second position with respect to horizontal, such as a microelectronic workpiece horizontal position. Each lift/tilt assembly is used to position the respective microelectronic workpiece cassettes to an orientation in which the microelectronic workpiece holding positions, such as microelectronic workpiece slot positions, of the cassette are individually accessible. While oriented in this second position, the microelectronic workpiece slots and corresponding microelectronic workpiece, if any, of each cassette are therefore generally accessible to the microelectronic workpiece transfer apparatus 50. In the illustrated tool, microelectronic workpiece transfer apparatus 50 includes one or more microelectronic workpiece transport units 90 and 100. The microelectronic workpiece transport units 90 and 100 may be used to transport individual microelectronic workpieces along the conveyor path 110, between the cassettes and one or more processing stations 120 of processing subsections 30 and 40 and, further, may be used to transport microelectronic workpieces between individual processing stations 120. The various sections of the integrated microelectronic workpiece processing tool 10 may define an enclosed space that is generally separate from the external environment. To this end, exhaust assembly 60 enables venting of airborne contaminants initially present or produced during processing of the microelectronic workpieces to thereby generate and/or maintain a relatively clean processing environment within the enclosed space.

After the microelectronic workpieces are processed, the transfer apparatus 50 places the microelectronic workpieces into a cassette, and the cassette containing the processed microelectronic workpieces are removed from the integrated microelectronic workpiece-processing tool 10 via the opening 80 in the input/output section 20.

B. Metrology Controlled Processing Tool

Figure 2:
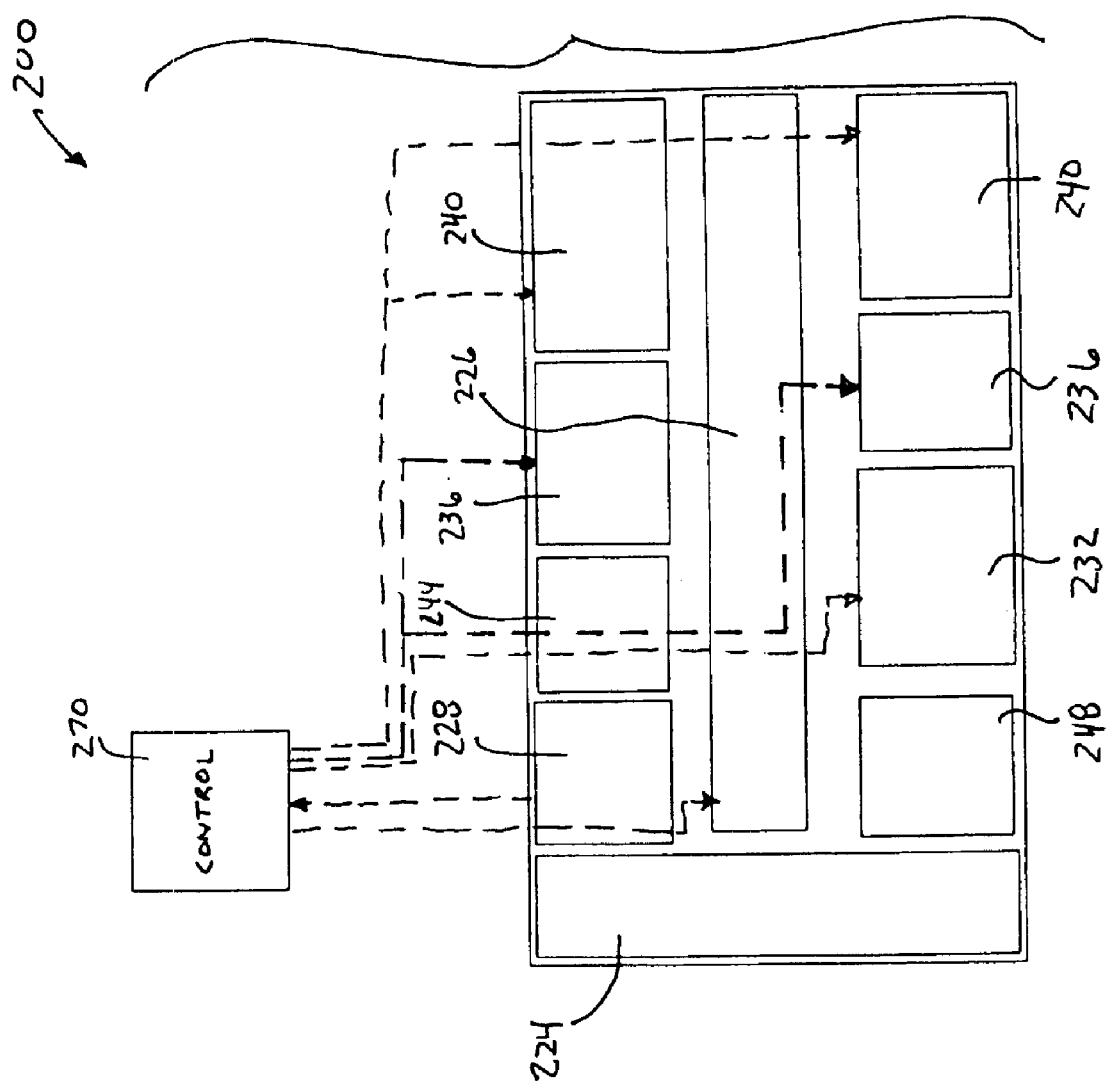
FIG. 2 is a schematic plan view of a microelectronic workpiece processing apparatus in accordance with an embodiment of the present invention.

FIG. 2 illustrates in schematic fashion a processing tool 200 in accordance with an embodiment of the present invention. The tool 200 can include an input/output station 224 at one end, a transfer device, such as a linear conveyor arrangement or linear robot 226 extending from the input/output station along a length of the tool 200, and a number of processing stations. The processing stations can include a metrology unit 228, one or more ECD seed layer enhancement units 232, one or more stripping units 236, and/or one or more plating or other deposition units 240. Additionally, the tool 200 can include one or more annealing units 244 and a non-process station or staging station 248.

The linear robot 226 can include a rail 250 (FIG. 3) which extends substantially the length of the processing units, and which carries a robot arm manipulator or transport unit 256 thereon. The robot arm manipulator 256 can remove a microelectronic workpiece from the input/output station 224 and deliver the microelectronic workpiece to and from any of the processing units 232, 236, 240, 244 or to and from the metrology unit 228 and to and from the non-process station 248.

In one mode of operation, the in-film metrology unit 228 can measure a seed layer thickness or uniformity on a workpiece and communicate the data to a controller 270. The controller 270 can be a programmable controller. Based on the data, decisions concerning the process parameters or recipe downstream from the metrology unit can be made. The process recipe for one or more downstream units can be modified based on the metrology results. Alternatively, or additionally, the process sequence can be modified according to the metrology results. For example, if the seed layer thickness or uniformity is insufficient, or less than a tolerance value, the microelectronic workpiece can be delivered to one of the seed layer enhancement units 232 before being delivered to one of the electroplating units 240. Alternatively, if the seed layer is defective or has a thickness out of tolerance by an unacceptable amount, such that the seed layer cannot be repaired or enhanced in the seed layer enhancement unit 232, the microelectronic workpiece can be delivered to one of the stripping units 236 wherein the microelectronic workpiece can be etched, including its process side surface and beveled edge, to be thereafter delivered by the manipulator 256 to the non-process station 248. The non-process station can be a non-compliance station, including a cassette 248a for holding microelectronic workpieces for returning microelectronic workpieces to a seed layer application station, typically a physical vapor deposition (PVD) apparatus external to the described tool 200. After the microelectronic workpiece has been plated according to the process recipe in one of the electroplating units 240, it can be delivered to the in-line anneal unit for annealing, and thereafter delivered to the input/output station 224 for exporting to a next process tool.

C. High Throughput Embodiment

Figure 3:
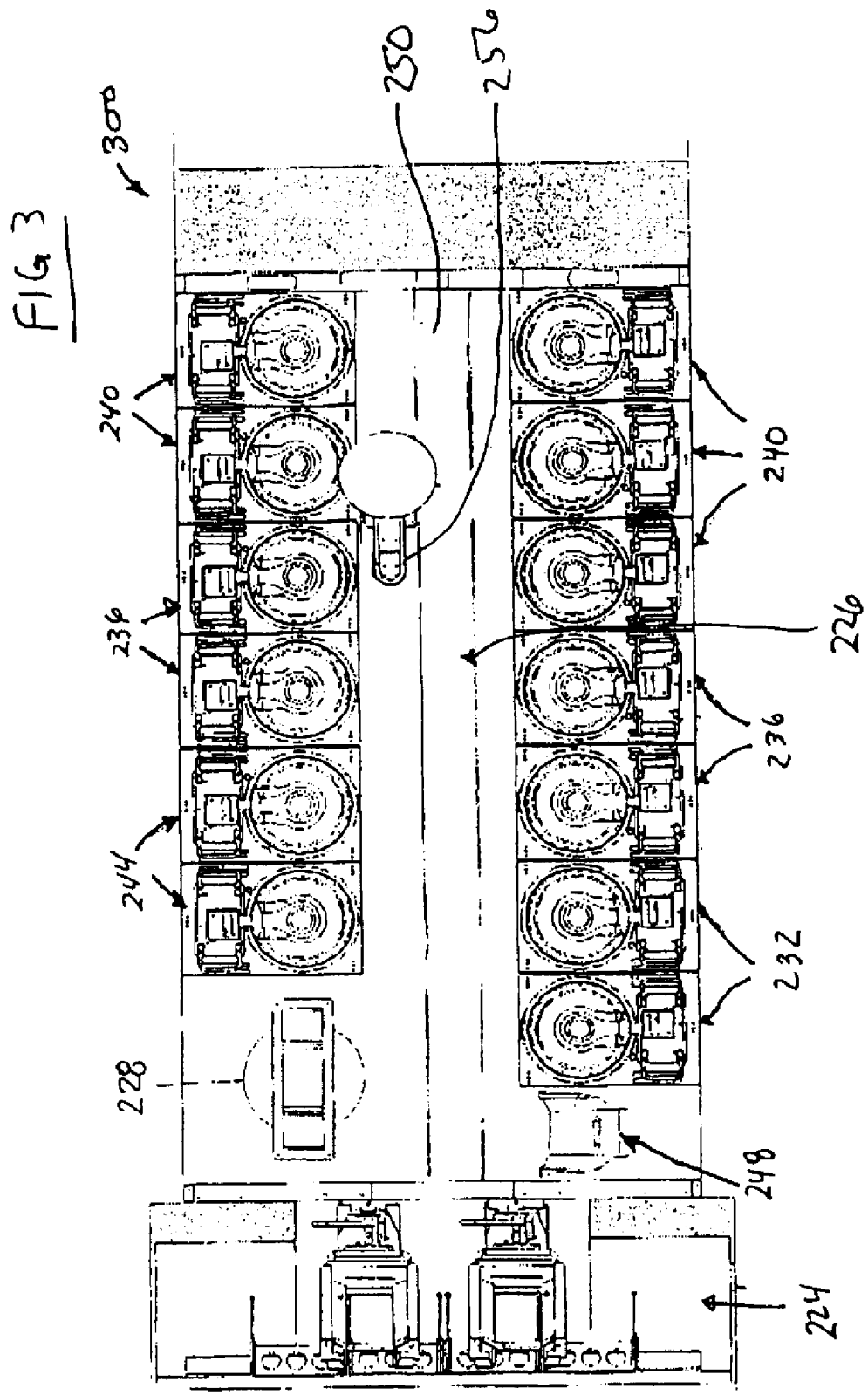
FIG. 3 is a schematic plan view of an apparatus in accordance with a first embodiment of the present invention.

An embodiment of a high volume or high throughput tool 300 is illustrated in FIG. 3. According to the high volume configuration, the tool can preserve high volume ECD capability while also adding a "repair or recovery" mode to maintain the finished plate integrity. Under normal operation, the tool may be used with or without periodic verification through in-line metrology at the metrology unit 228.

The metrology unit 228 can be used to measure the first substrate of a lot, or from a specific process location of the prior step (e.g., a given chamber on a seed layer sputtering tool) to verify good incoming quality of seed layers or other parameters. Likewise, the metrology unit 228 can feed forward or feed back uniformity and thickness data to drive the process recipe for the electroplating reactors 240. In other embodiments, the metrology unit 228 can be operatively coupled to other processing units (such as the seed layer enhancement unit 232, the annealing unit 244, and/or the stripping unit 236) to influence the processes carried out at these units. The metrology unit 228 can also be operatively coupled to the linear robot 226 to direct the linear robot or another transfer device to move the microelectronic workpiece to a particular station or processing unit. In any of these embodiments, the metrology unit 228 can be operatively coupled to the other units via the controller 270 or another control unit, which can receive first signals from the metrology unit 228 that represent characteristics of the workpiece, and transmit second signals to the other units to control, direct or influence the other units on the basis of the first signals received from the metrology unit 228.

The electroplating units 240 can include adjustable reactors (described below) or other type reactors that can adapt to varied electrochemical processing requirements while concurrently providing a controlled, substantially uniform diffusion layer and electrical potential at the surface of the microelectronic workpiece that assists in providing a corresponding substantially uniform processing of the microelectronic workpiece surface (e.g., uniform deposition or other application of the electroplated material). The electroplating units 240 can be controlled by the controller 270 (FIG. 2) to compensate for non-uniformities of the seed layer determined by the metrology unit. Such electrochemical processing techniques can be used in the deposition and/or alteration of blanket metal layers, blanket dielectric layers, patterned metal layers, and patterned dielectric layers.

The tool 300 can be controlled with increased flexibility when using the metrology unit. Based upon an output from the metrology unit 228 derived from the programmable recipe from the metrology unit 228, the user can decide to stop the subsequent microelectronic workpiece processing, such as the electroplating units 240, and resolve the issues driving the prior process, such as a seed layer deposition process. For example, the electroplating process can be stopped when seed layer thicknesses are below acceptable tolerances.

Alternately, the user can continue the subsequent processing and adjust the order of subsequent process steps, or insert a remedial process step, based upon the output from the metrology unit 228. For example, the user can first transport the microelectronic workpiece to a seed layer enhancement unit 232 to automatically "fix" or adjust a seed layer problem with the ECD seed layer enhancement process and then transport the microelectronic workpiece to an electroplating unit 240.

Rather than changing the order of the process steps or inserting an intermediate step, the user can also continue the processing and automatically adjust the process recipe in the electroplating unit 240, particularly using variable recipe reactors, for enhanced plating uniformity and thickness.

Still further, if a microelectronic workpiece seed layer is too far out of tolerance in thickness or uniformity, the microelectronic workpiece can be transported to one of the stripping units 236 where the microelectronic workpiece processing side is stripped. The microelectronic workpiece can then be transported to the non-compliance station 248, particularly to the cassette 248a, for recycling.

In one embodiment, tool 300 is also easily configured for high volume manufacturing with ECD seed layer enhancement integrated as part of the standard process, i.e., the number of ECD seed layer enhancement chambers 232 can correlate with the throughput requirement.

The stripping units 236 can also be used to clean copper contamination from the prior PVD seed layer process from the microelectronic workpiece back, edge and bevel to eliminate problems during chemical mechanical polishing (CMP).

The tool 300 can also include a microelectronic workpiece pre-aligner (not shown). The pre-aligner is described in "Semiconductor Processing Apparatus Having Lift And Tilt Mechanism", U.S. Ser. No. 08/991,062 filed Dec. 15, 1997, incorporated herein in its entirety by reference, and is used to rotationally align microelectronic workpieces initially for precise processing. This can be significant when the metrology unit is used to measure precise points in patterned film layers, e.g., when accurate positioning of the microelectronic workpiece is important to obtain an accurate reading.

D. Process Development Embodiment

Figure 4:
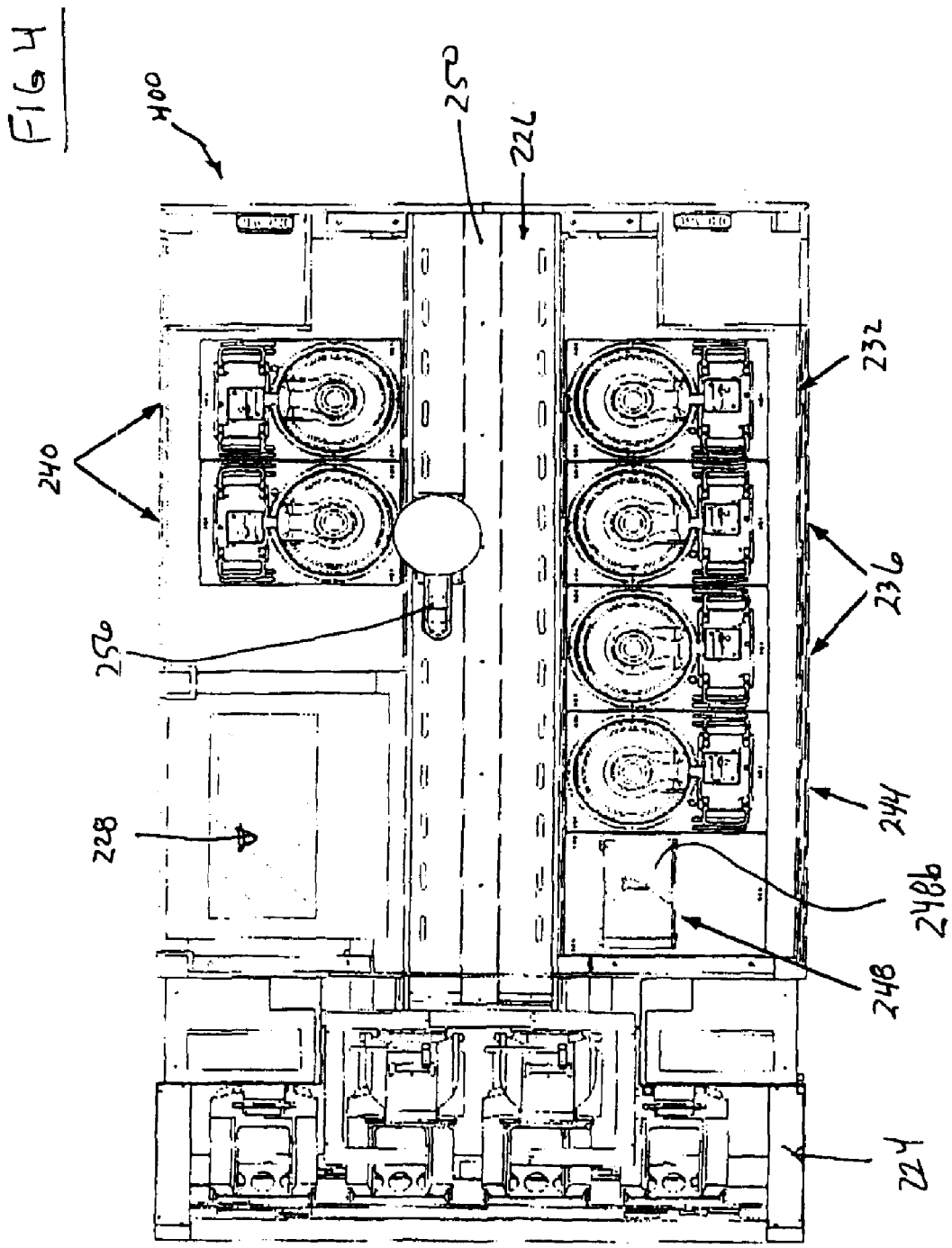
FIG. 4 is a schematic plan view of an apparatus in accordance with a second embodiment of the invention.

Another exemplary embodiment of the tool incorporating aspects of the present invention is a process development configuration tool 400 illustrated in FIG. 4. This tool 400 is directed to developing optimized processes, i.e., for research and development, and can accordingly have a compact layout. The tool configuration allows increased flexibility in process sequence and control. For example, a process engineer might want to measure any combination of incoming seed layer thickness, ECD seed layer deposition results, ECD fill results, and post annealing results. Since the plating solution reservoirs can be much smaller, the user may also quickly and easily interchange chemistries for rapid and low-cost experimentation. The user may want to run split lots with a wide variety of process combinations to determine feasibility of a production process.

An embodiment of the tool 400 includes fewer processing stations than the tool 300 shown in FIG. 3. The tool 400 can include two electroplating or other deposition units 240, an in-line metrology unit 228, an annealing unit 244, a seed layer enhancement unit 232, and two stripping and/or cleaning units 236 for stripping films or backside cleaning as needed. The tool 400 can also include a staging station 248, in this case configured as a wafer pre-aligner 248b.

E. Process Sequences

FIGS. 5 through 8 illustrate different process sequences which can be employed according to embodiments of the invention. The process sequences are examples, and the process order can be rearranged, and process steps can be eliminated or added in other embodiments of the invention.

Figure 5:
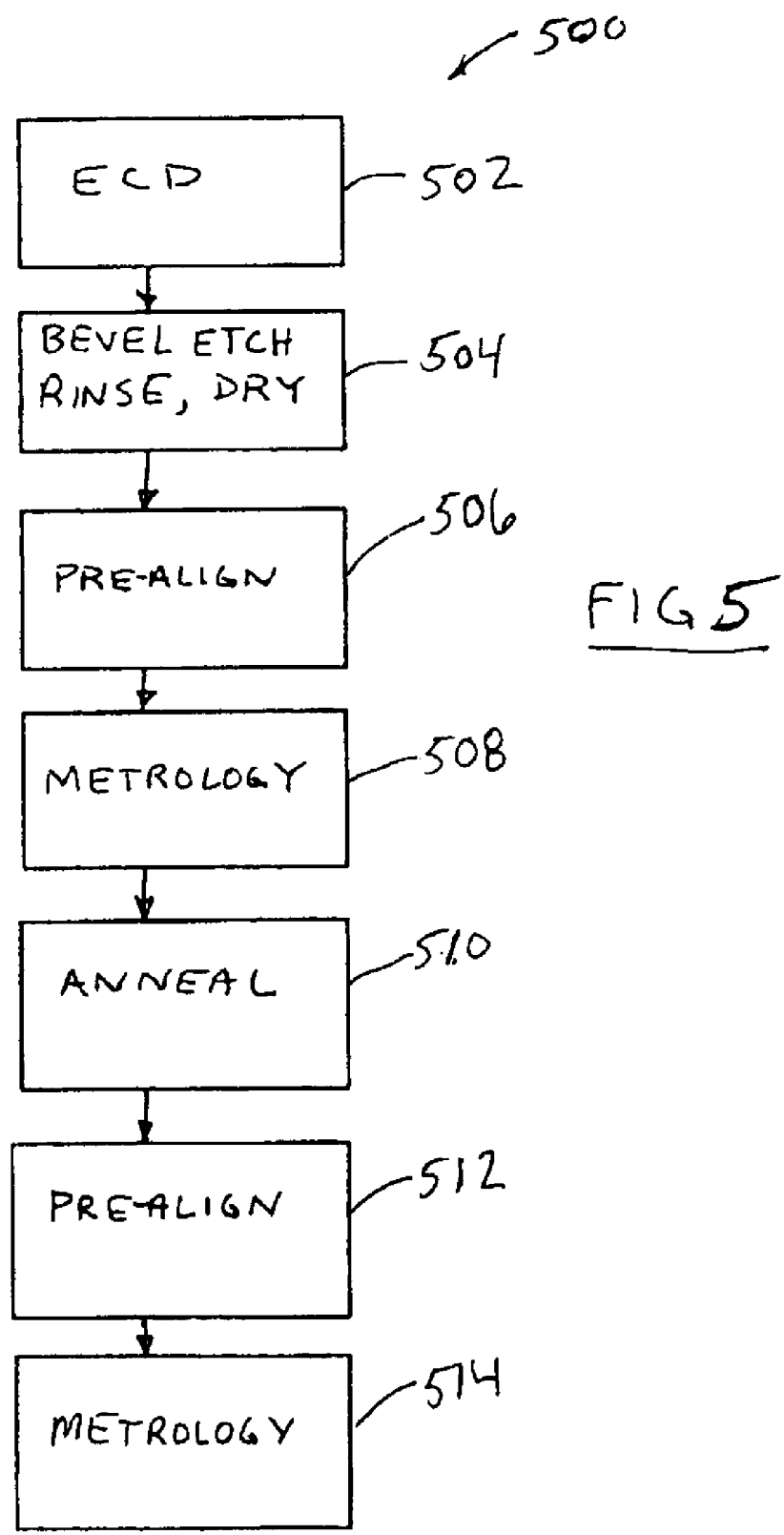
FIG. 5 is a block diagram of a sequence of processing steps in accordance with a first method of the present invention.

FIG. 5 illustrates a first process sequence in accordance with an embodiment of the invention wherein the microelectronic workpiece is first processed in an ECD unit such as an electroplating unit in step 502. Subsequently the workpiece is transferred to a stripping unit and the workpiece is bevel-etched, rinsed and dried in step 504.

Subsequent to step 504 the workpiece is transferred to a pre-align station to be accurately positioned, in step 506. The microelectronic workpiece is then transported to the metrology unit in step 508 and film thickness and/or other parameters are measured. In step 510 the workpiece is annealed in a annealing unit. The workpiece is thereafter transported to be pre-aligned in step 512 for accurate reference position. In step 514 the workpiece is transported to the metrology unit to have characteristics such as post annealing film thicknesses measured. The pre-align unit can be incorporated into the metrology unit which can eliminate the need to transport the workpiece to and from a pre-align unit. The metrology data derived from steps 508 and 514 can be used to feed back control information, for example, to the ECD (step 502) for controlling process recipe for subsequent workpieces.

Figure 6:
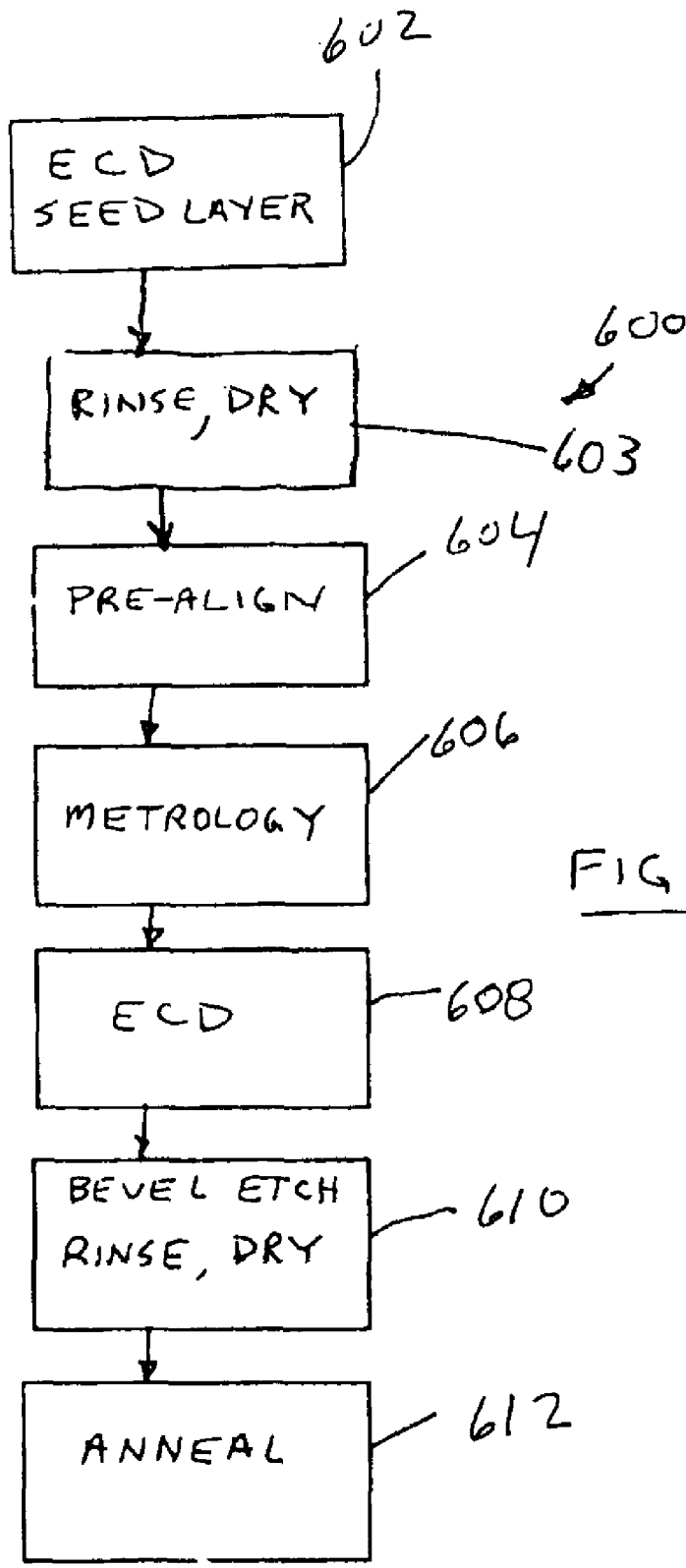
FIG. 6 is a block diagram of a sequence of processing steps in accordance with a second method of the present invention.

FIG. 6 illustrates a second sequence of process steps in accordance with an embodiment of the invention that includes step 602 in which a microelectronic workpiece has a seed layer applied by an ECD reactor. The workpiece is then transported to a rinse and dry station in step 603 and then to a pre-align station for accurate positioning in step 604. The workpiece is then transported to a metrology unit in step 606 for measuring characteristics such as film thickness. In step 608 the workpiece is then transported to an ECD unit, such as an electroplating unit, to be further processed. In step 610 the workpiece is then transported to a stripping unit for bevel etch, rinse and dry processing. Subsequently, in step 612 the microelectronic workpiece is annealed. The metrology measurement taken in step 606 can be used to control the recipe of the downstream ECD reactor (step 608).

Figure 7:
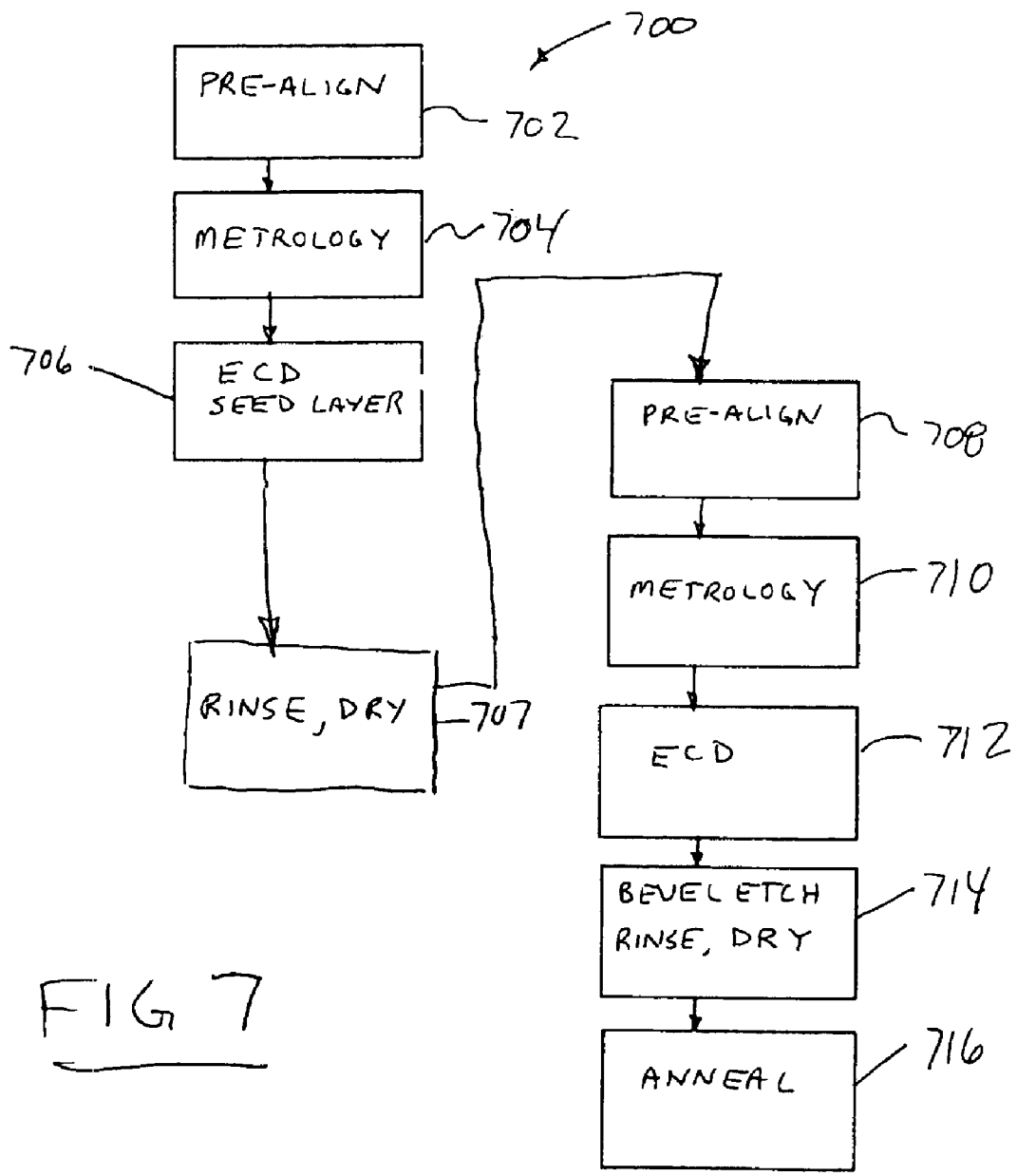
FIG. 7 is a block diagram of a sequence of processing steps in accordance with a third method of the present invention.

FIG. 7 illustrates a third sequence of process steps 700 in accordance with an embodiment of the invention which includes pre-aligning the workpiece in step 702. The workpiece is then transported to the metrology unit for accurate measuring in step 704. A barrier layer can be measured in this step. Subsequent to step 704 the workpiece is transported to an ECD seed layer unit for the deposition of a seed layer onto the workpiece. The workpiece is then transported to a rinse and dry station in step 707, and then to the pre-align station in step 708, for accurate reference positioning. The workpiece is then transported back to the metrology unit in step 710 for accurate measuring of the applied seed layer, for example. After the metrology measurements are taken, the workpiece is transported to an ECD unit, such as an electroplating unit, in step 712 and a further processing of the workpiece ensues. Upon completion of the ECD processing the workpiece is transported to a stripping unit for a bevel etch rinse and dry in step 714. The workpiece is then transported to an annealing unit in step 716 and the workpiece is annealed.

The metrology measurements taken in steps 704 and 710 can be used to control the recipe in steps 706, 712, 714, and/or 716 as a feed forward or feed back control.

Figure 8:
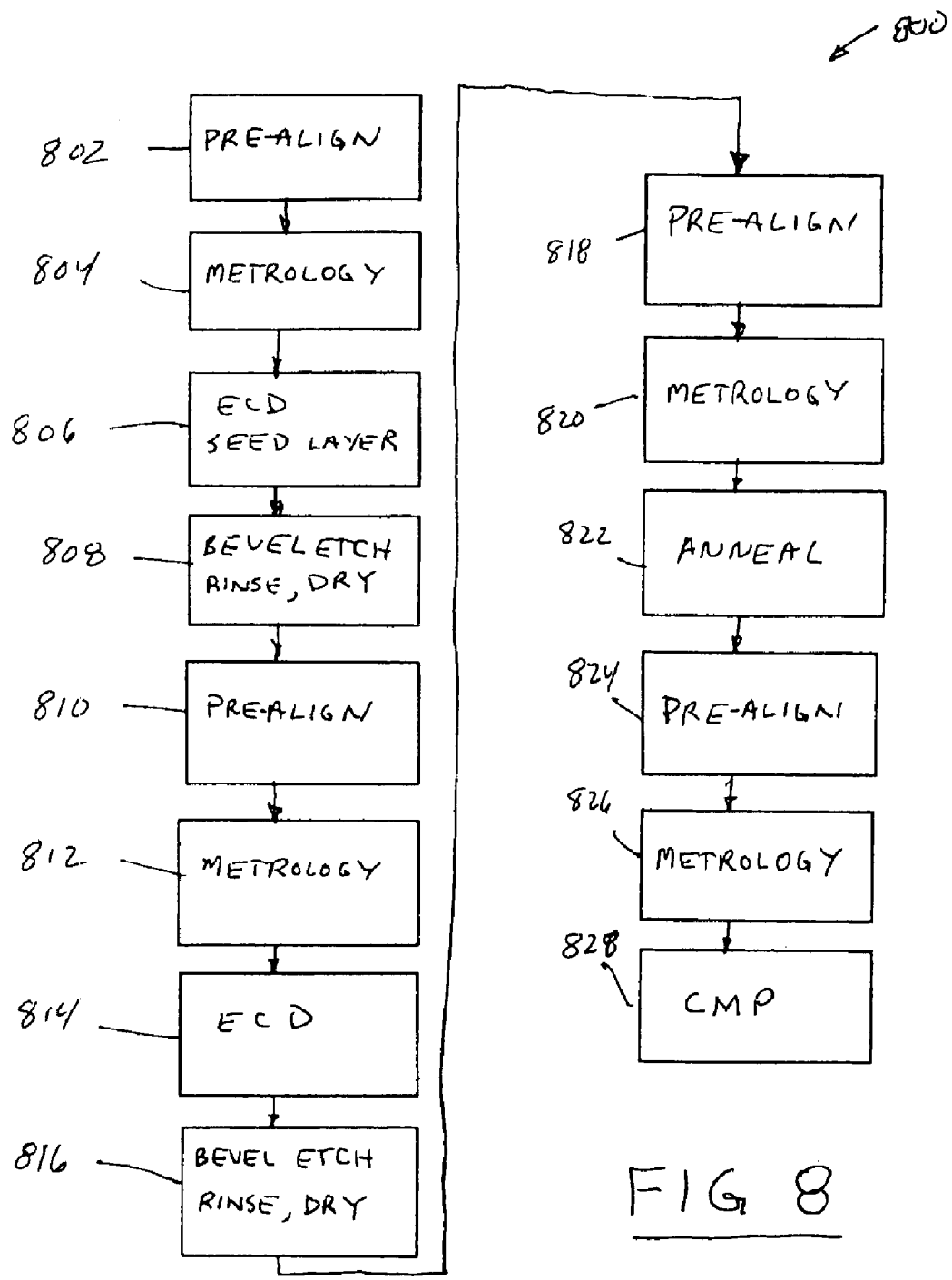
FIG. 8 is a block diagram of a sequence of processing steps in accordance with a fourth method of the present invention.

FIG. 8 illustrates a fourth process sequence of steps 800 in accordance with an embodiment of the invention which includes pre-aligning the microelectronic workpiece in step 802. The workpiece is then transported to the metrology unit for measurements in step 804. The workpiece is subsequently transported to and ECD seed layer unit wherein a seed layer is applied to the workpiece in step 806.

After the seed layer is applied, the workpiece is transported to a bevel etch rinse and dry station in step 808. The workpiece is then transported back to the pre-align station to be accurately reference positioned in step 810. After being accurately positioned the workpiece is transported to the metrology unit for further accurate measurements in step 812. The workpiece is thereupon transported to an ECD unit such as an electroplating reactor, wherein further processing of the workpiece ensues in step 814. After such processing, the workpiece is transported to the bevel etch, rinse and dry station and processed accordingly in step 816.

The workpiece is then transported to a pre-align station and accurately positioned in step 818. After being accurately positioned, the workpiece is returned to the metrology unit and in step 820 is accurately measured. The workpiece is then transported to an annealing unit in step 822 and is annealed.

After annealing, in step 824 the workpiece is transported to a pre-align station and is accurately reference positioned. After being accurately positioned, in step 826 the workpiece is transported back to the metrology unit and accurately measured. In step 828, the workpiece is transported to a chemical mechanical polishing unit ("CMP") for further processing.

The metrology steps 804, 812, 820 and/or 826 can be utilized to feed forward or feed back control of process recipes or control step sequences.

It should be noted that in FIGS. 5, 6, 7, and 8 the pre-align steps are optional depending on the tool configuration.

F. Multi-Tool Integrated Metrology Systems

Figure 9:
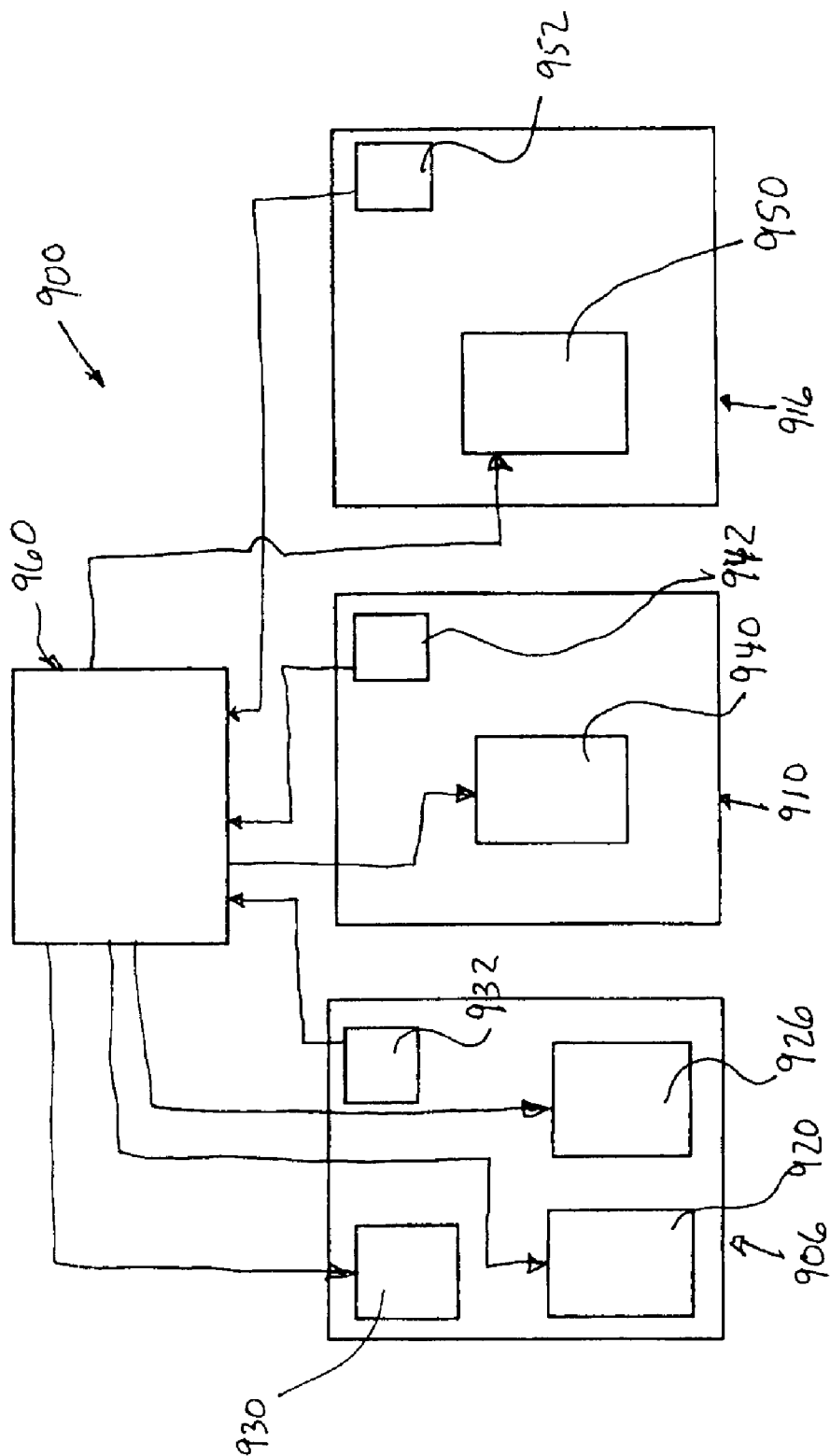
FIG. 9 is a schematic plan view of another embodiment of a microelectronic workpiece processing apparatus in accordance with the present invention.

FIG. 9 illustrates a system 900 in accordance with another embodiment of the invention for processing a microelectronic workpiece. The system 900 can include a seed layer tool 906, an ECD or other deposition tool 910, and a chemical mechanical polishing tool 916.

The seed layer tool 906 can include a barrier deposition station 920 and a seed layer deposition station 926. The seed layer tool 920 can also include a cleaning station 930 such as is generally known in the art. A metrology unit 932 can be incorporated as part of the seed layer station for in-line metrology monitoring.

The ECD tool 910 can be configured generally similarly to the tools 200, 300, 400 described above, and can include an ECD station 940, such as an electroplating unit 240. The ECD tool 910 can also include a metrology unit 942 for in-line metrology monitoring.

The chemical mechanical polishing tool 916 can include a chemical mechanical polishing station 950 and an in-line metrology unit 952 for in-line metrology monitoring.

After layers are formed on the microelectronic workpiece, there is a need to planarize the surface of the workpiece. One method of planarizing is chemical mechanical polishing ("CMP"). In one aspect of this method, the workpiece is mounted to a carrier or polishing head and a surface of the workpiece is placed against a rotating polishing pad. A polishing-slurry, including at least one chemically reactive agent, is supplied to the surface of the pad as the workpiece rotates to remove material from the workpiece.

Chemical mechanical polishing must be carefully controlled to polish the workpiece to a desired flatness or thickness to reach the polishing endpoint. Process variations in the initial thickness of the layer to be polished, the slurry composition, the polishing pad condition, the relative speed between the pad and the workpiece, and the pad load on the workpiece, can cause variations in the material removal rate or polishing rate. The polishing time to reach the polishing endpoint is thus a process variable.

A controller 960 can be provided to coordinate the processing of the workpiece as it progresses from the seed layer tool 906 to the ECD tool 910 to the chemical mechanical polishing tool 916. The controller can be a programmable controller. The metrology units 932, 942, 952 can be configured to send measurement data to the controller 960. The controller 960 can control the process recipes or the sequence of process steps on the three tools 906, 910, 916 based on the metrology results from one or more of the metrology units 932, 942, 952.

In one embodiment, a metrology result obtained from the metrology unit 932 and relating to the condition of the seed layer applied sequentially by the barrier deposition station 920 and by the seed layer deposition station 926 can be used to control the process recipe in the ECD station 940 and/or the process recipe in the CMP tool 916. In the CMP tool, the polishing time, the rotational speed of the workpiece or pad, the pressure exerted by the pad on the workpiece, and/or the radial distribution of pad pressure on the workpiece are process recipe variables which can be controlled or adjusted. If the film to be polished is center thick, the CMP process may be tuned to polish the center faster.

Also as examples, the metrology result from the metrology unit 952 can be used as feedback to control the process recipes on any of the tools 906, 910, 916. The metrology result from the metrology unit 942 could be used as feed back to control the process recipe in the seed layer tool 906 and/or as feed forward to control the process recipe in the chemical mechanical polishing tool 916.

These configurations are exemplary only. In other embodiments, a separate metrology station in lieu of units 932, 942 and 952 can perform process parameter control functions. The separate metrology station can accordingly be positioned external to a housing or enclosure that at least partially encloses the other processing stations and units.

Figure 10:
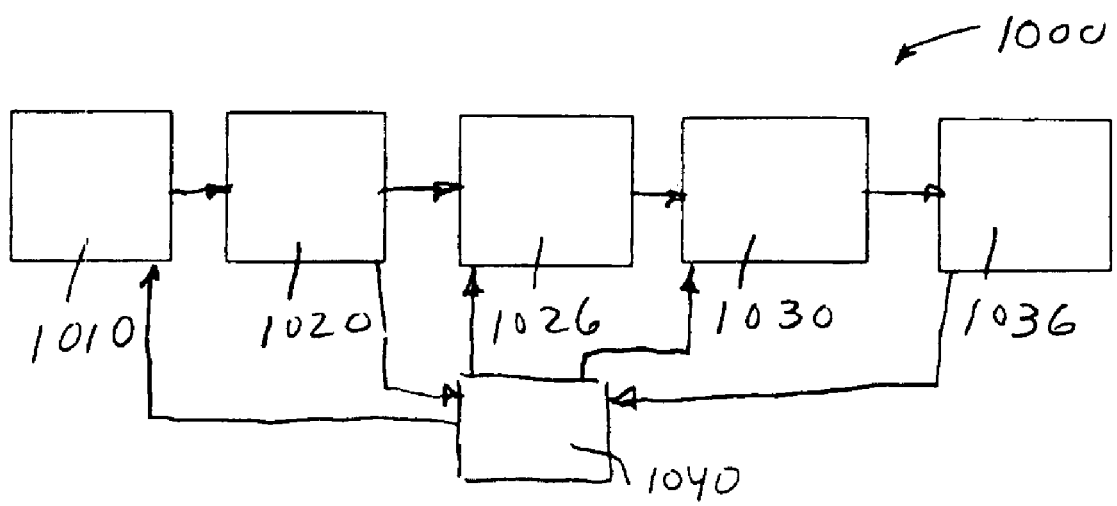
FIG. 10 is a schematic plan view of a further alternate embodiment microelectronic workpiece processing apparatus of the present invention.

FIG. 10 illustrates another multi-tool or multi-station system 1000 wherein metrology control can be used. A photoresist deposition station 1010 applies photoresist to a workpiece. The workpiece photoresist layer thickness can then be measured by a metrology unit 1020. The workpiece is then exposed in a photoresist exposure station 1026 and then developed in a photoresist develop station 1030. A further metrology unit 1036 can then measure the workpiece layer thickness, or pattern dimension. Through a controller 1040, the metrology unit 1020 can feed forward to control the photoresist develop station 1026 or feed back to control the photoresist deposition station 1010. The further metrology unit 1036 can feed back to control the photoresist develop station 1030, via the controller 1040. The controller can be a programmable controller.

II. Components

The following sections describe embodiments of components that can be incorporated into the systems described above. In other embodiments, the components can have arrangements different than those described below.

A. Stripping Units

Examples of embodiments of the stripping unit 236 (FIGS. 2–4) are described in "Micro-Environment For Processing A Workpiece", PCT/US99/05676 filed Mar. 15, 1999 and in "Selective Treatment Of A Microelectronic Workpiece", PCT/US99/05674 filed Mar. 15, 1999, both herein incorporated by reference. The "stripping units" can be multifunctional processing capsules which can perform cleaning, stripping, bevel etching, rinsing and drying. In one embodiment, the stripping unit can include a rotor motor connected to a microelectronic workpiece housing to rotate the housing. The microelectronic workpiece housing can define an at least partially closed processing chamber therein in which one or more processing fluids are distributed across at least one face of the microelectronic workpiece, for example, by centrifugal forces generated during rotation of the housing.

The microelectronic workpiece housing can include an upper chamber member having a fluid inlet opening and a lower chamber member having a fluid inlet opening. The upper chamber member and the lower chamber member are joined to one another to form the substantially closed processing chamber. The processing chamber generally conforms to the shape of the microelectronic workpiece and includes at least one fluid outlet disposed at a peripheral region thereof. At least one microelectronic workpiece support is provided. The support is adapted to support a microelectronic workpiece in the processing chamber in a position to allow centrifugal forces to distribute a fluid supplied through the inlet opening of the upper chamber member across at least an upper face of the microelectronic workpiece when the microelectronic workpiece housing is rotated. The wafer is further positioned by the support to allow centrifugal force distribution of a fluid supplied through the inlet opening of the lower chamber member across at least a lower face of the microelectronic workpiece during the rotation. The at least one fluid outlet is positioned to allow extraction of fluid in the processing chamber through the action of centrifugal forces.

An etchant capable of removing one or more of the thin film layers, such as the seed layer, can be caused to flow over the front side and an outer margin of the back side while the etchant is prevented from flowing over the back side except for the outer margin. Thus, a non-uniform seed layer, for example, can be stripped from the workpiece.

Further examples of stripper units are provided below with reference to FIGS. A1A–A4 (Process Example) and FIGS. B1–B5 (Reactor Example).

1. Process Example

FIGS. A1A–A1D illustrate aspects of a method in accordance with the prior art for depositing a conductive layer on a silicon wafer A10, in which microelectronic devices (not shown) have been fabricated. As illustrated in FIG. A1A, the wafer A10 has a front, device side A12, a back, non-device side A14, and a beveled, outer perimeter A16. Via physical vapor deposition (sputtering) or chemical vapor deposition, a barrier layer A20 is applied over the front side A12 and over an upper portion A18 of the outer perimeter A16. A thin-film seed layer, such as a copper film A30, is applied over the barrier layer A20. Conventionally, the seed layer A30 is only deposited within the bounds of an outer margin A22 of the barrier layer A20, as illustrated in FIG. A1B. At an outer edge A32 of the copper film A30, one or more electrical contacts A40 to be used in providing electroplating power to the seed layer are placed in electrical contact with the copper film A30, as illustrated in FIG. A1C.

After the one or more electrical contacts A40 have been connected to the seed layer copper film A30 a further copper layer A50 from which interconnect structures and/or metallized devices are fabricated is electroplated onto the wafer A110 as illustrated in FIG. A1C. The electrical contact(s) A40 are then removed to provide the resultant multi-film structure, shown generally at A60 in FIG. A1D. Beyond an inner boundary A34 of the outer margin A32 of the copper layer A50, an annular region A62 of the front side A12 is not available for fabricating such interconnect structures or metallized devices.

A sequence of processing steps in accordance with an embodiment of the present invention begins with a silicon wafer A110, which is similar to the silicon wafer A10 before processing, on which microelectronic devices (not shown) have been fabricated, and which has a front, device side A112, a back, non-device side A114, and a beveled, outer perimeter A116, as illustrated in FIG. A2A. Via physical vapor deposition (sputtering) or chemical vapor deposition, a barrier layer A120 is applied over the front side A112 and over an upper portion A118 of the outer perimeter A116 and a thin seed layer, such as a copper film A130 is applied over the entire barrier layer A120, without exclusion from a peripheral outer margin, so as to cover the barrier layer A120 where applied over the front side A112 and over the upper portion A118 of the outer perimeter A116, as illustrated in FIG. A1B. At an outer edge A132 of the copper seed layer A130, one or more electrical contacts A140 to be used in electroplating are connected to provide electroplating power to the copper film A130, as illustrated in FIG. A2C. As illustrated, the outer edge A132 at which contact may be made for the supply of electroplating power illustrated in FIG. A2C is substantially closer to the peripheral edge than the process as illustrated in FIG. A1C.

A further copper film A150 from which metallized interconnects and/or microelectronic devices are fabricated is then applied using an electrochemical deposition process. As illustrated in FIG. A2C, the further copper film A150 is deposited within the outer margin A132 of the copper film A130. The electrical contact A140 is then removed leaving the resultant multi-layer structure shown generally at A160 of FIG. A2D. Metallized devices (not shown) and/or interconnects are formed by known techniques, from the resultant structure A160. After the copper layer A150 has been deposited, the seed layer A130, film A150, and/or barrier layer A120 may be removed from the outer margin A132 and, if desired peripheral edge A116 of the workpiece A110. Removal of at least layer A130 from the outer margin assists in preventing film flaking and cross-contamination problems that may occur during subsequent workpiece processing.

In accordance with an embodiment of the process, processing fluid is selectively applied to the outer peripheral margin of at least the front side of the workpiece. Exclusion and/or application of the processing fluid occurs by applying one or more processing fluids to the workpiece as the workpiece and corresponding reactor are spinning about an axis of rotation that is generally parallel (or antiparallel) to the vector defining the face of the workpiece being processed. The flow rate of the one or more processing fluids, fluid pressure, and/or spin rate are used to control the extent to which the processing fluid is selectively applied to the outer peripheral margin.

A reactor suitable for executing the foregoing removal process may generally be comprised of upper and lower members that define an upper chamber and a lower chamber with respect to the workpiece contained therein. A centrally disposed inlet is provided to each of the upper and lower chambers for supplying one or more processing fluids. Fluid outlets are disposed at peripheral portions of the chambers and are adapted to assist in the exclusion of one processing fluid from the outer margin of the workpiece while allowing intrusion of an etchant thereat. The upper and lower chambers are rotated conjointly so as to distribute a processing fluid in the upper chamber across an upper side of the workpiece through centrifugal forces and so as to distribute a processing fluid in the lower chamber across a lower side of the workpiece through centrifugal forces. Depending upon the processes being performed, however, the processing fluids in the upper and lower chambers may be the same fluid or different fluids.

Also, rather than relying on the rotation of the workpiece, the processing fluid could also be selectively driven by pumps.

Through control of the respective pressures of the processing fluids entering the respective chambers and of the rotational speed of the rotating chambers, it is possible to control the reactor so as to cause the processing fluid entering the inlet of the lower chamber to flow over the near side of the wafer, over the outer perimeter of the workpiece, and over an outer margin of the far side of the workpiece, and so as to prevent the same processing fluid from flowing over the far side except for the outer margin. The control of the fluid pressures may be achieved for example through the use of a pump for liquids, or a pressure regulator for a pressurized gas source.

As shown in FIGS. A3 and A4, a reactor A1100 for processing a microelectronic workpiece, such as a silicon wafer A1010 having an upper side A1012, a lower side A1014, and an outer, circular perimeter A1016, in a microenvironment constitutes a platform for the practice of a process in accordance with an aspect of this invention. For certain applications, the upper side A1012 is the front side, which may be otherwise called the device side, and the lower side A1014 is the back side, which may be otherwise called the non-device side. However, for other applications, the silicon wafer A1010 is inverted.

The reactor A1100 can have an upper chamber member that includes an upper chamber wall A1120 and a lower chamber member that includes a lower chamber wall A1140. These walls A1120, A1140 can be arranged to open so as to permit a wafer A1010 to be loaded into the reactor A1100 for processing, by a loading and unloading mechanism (not shown) that, for example, may be in the form of a robot having an end effector. These walls A1120, A1140 can be arranged to close so as to define a capsule A1160 supporting a wafer A1010 in a processing position, between these walls A1120, A1140.

The reactor A1010, which defines a vertical axis A, can have a head A1200 containing a rotor A1210, which mounts the upper chamber wall A1120, and mounting a motor A1220 for rotating the rotor A1210 and the upper and lower chamber walls A1120, A1140, when closed, around the vertical axis A, conjointly with a wafer A1010 supported in the processing position. The head A1200 is arranged to be raised for opening these walls A1120, A1140, and to be lowered for closing these walls A1120, A1140.

The upper chamber wall A1120 has an inlet A1122 for processing fluids, which may be liquid, vaporous, or gaseous, and the lower chamber wall A1140 has an inlet A1142 for such fluids, which for a given application may be similar fluids or different fluids. The head A1200 mounts an upper nozzle A1210, which extends axially through the sleeve A1222 so as not to interfere with the rotation of the sleeve A1222. The upper nozzle A1210 directs streams of processing fluids downwardly through the inlet A1122 of the upper chamber wall A1120.

The upper chamber wall A1120 includes an array of similar outlets A1124, which are spaced similarly at uniform angular spacings around the vertical axis A. In the disclosed embodiment, thirty-six such outlets A1124 are employed. Each outlet A1124 is spaced outwardly from the vertical axis A by a comparatively larger radial distance and is spaced inwardly from the outer perimeter A1016 of a wafer A1010 supported in the processing position by a comparatively smaller radial distance, such as a distance of approximately 1.5 millimeters.

When the upper and lower chamber walls A1120, A1140, are closed, they define a micro-environment reactor A1160 having an upper processing chamber A126 that is defined by the upper chamber wall A120 and by a first generally planar surface of the supported wafer A1010, and a lower processing chamber A146 that is defined by the lower chamber wall A140 and a second generally planar surface of the supported wafer opposite the first side. The upper and lower processing chambers A1126, A1146, are in fluid communication with each other in an annular region A1130 beyond the outer perimeter A16 of the supported wafer A1010 and are sealed by an annular, compressible seal (e.g., O-ring) A1132 bounding a lower portion A1134 of the annular region A1130. The seal A1132 allows processing fluids entering the lower inlet A1142 to remain under sufficient pressure to flow toward the outlets A1134.

As compared to other types of reactors, the reactor A1100 is particularly suitable for executing a range of unique microfabrication processes. For example, reactor A1100 is particularly suited to execute a process such as the one set forth herein that requires complete contact of a processing fluid at a first side of a workpiece and at only a peripheral margin portion of the second side thereof. Such processes may be realized because processing fluids entering the inlet A1142 of the lower chamber wall A1140 can act on the lower side A1014 of a supported wafer A1010, on the outer periphery A1016 of the supported wafer A1010, and on an outer margin A1018 of the upper side A1012 of the supported wafer A10 before reaching the outlets A1124, and because processing fluids entering the inlet A1122 of the upper chamber wall A120 can act on the upper side A1012 of the supported wafer A1010, except for the outer margin A1018 of the upper side A1012, before reaching the outlets A1124.

When an embodiment of the reactor illustrated and described above is employed to practice the process provided by this invention for treating a silicon wafer having a front, device side, a back, non-device side, and an outer perimeter, so as to remove a thin film, such as a copper film, the silicon wafer is placed into the reactor with its back side being the lower side. An etchant capable of removing the copper can be included in the processing fluid. The etchant is delivered by a pump to the lower chamber and inert gas is used as the processing fluid entering the upper chamber. The etchant is caused to flow over the back side, over an outer perimeter of the silicon wafer, and over an outer margin of the front side, but is prevented from flowing over the front side except for the outer margin. After the etchant removes the thin film, any residual etchant is rinsed away, as with deionized water.

The processing fluid can include a mixture of an acid and an oxidizing agent. For example, if the thin film is a metal film, such as a copper film, the etchant can include a mixture of hydrofluoric acid and hydrogen peroxide, as an oxidizing agent, most preferably 0.5% hydrofluoric acid and 10% hydrogen peroxide, by volume, with the remainder being deionized water. An alternative reagent is approximately 10% sulfuric acid, although other concentrations of sulfuric acid from approximately 5% to approximately 98%, along with approximately 0% to 20% of an oxidizing agent, can be instead used to remove a metal film, such as a copper film. The processing fluid can also be a mixture of sulfuric acid and ammonium persulfate.

Other alternative enchants that can be used to remove a metal film, such as a copper film, include mixtures of hydrofluoric acid and a surfactant, mixtures of hydrofluoric and hydrochloric acids, mixtures of nitric and hydrofluoric acids, and EKC 5000, which is a proprietary chemical available commercially from EKC of Hayward, Calif.

When the resultant structure A160 illustrated in FIG. A2D is compared to the resultant structure A60 illustrated in FIG. A1D, it is evident that the annular region A162 not available for fabricating such interconnect structures and/or metallized components from the resultant structure A160 is smaller than the annular region A62 that is not available for fabricating such interconnect structures and/or metallized components on the resultant structure A60, all other dimensions being alike. It follows that this invention enables a greater yield of microelectronic devices from a silicon wafer of a given size. Advantageously, the process provided by this invention not only removes a thin film, such as a copper film, but also removes any contaminant, such as any copper or other metal, that the reagent is capable of solvating from the back side of the silicon wafer. The thin film removed by the process of the present invention could also be substantially comprised of silicon nitride, silicone oxide, polysilicon, or photoresist.

2. Reactor Example

With reference to FIGS. B1–B5, there is shown an embodiment of a reactor B2100 for processing a microelectronic workpiece, such as a silicon wafer B10 having an upper side B12, a lower side B14, and an outer, circular perimeter B16, in a micro-environment. For certain applications, the upper side B12 is the front side, which may be otherwise called the device side, and the lower side B14 is the back side, which may be otherwise called the non-device side. However, for other applications, the silicon wafer B10 is inverted.

The reactor B2100 can have an upper chamber member that includes an upper chamber wall B2120 and a lower chamber member that includes a lower chamber wall B2140. These walls B2120, B2140, are arranged to open so as to permit a wafer B10 to be loaded into the reactor B100 for processing, by a loading and unloading mechanism (not shown) that, for example, may be in the form of a robot having an end effector. These walls B2120, B2140, are arranged to close so as to define a capsule B2160 supporting a wafer B10 in a processing position, between these walls B2120, B2140.

The reactor B2100, which defines a rotation axis A, has a head B2200 containing a rotor B2210, which mounts the upper chamber wall B2120, and mounting a motor B2220 for rotating the rotor B2210 and the upper and lower chamber walls B2120, B2140, when closed, around the axis A, conjointly with a wafer B10 supported in the processing position. The motor B2220 is arranged to drive a sleeve B2222, which is supported radially in the head B2200, by rolling-element bearings B2224. The head B2200 is arranged to be raised for opening these walls B2120, B2140, and to be lowered for closing these walls B2120, B2140.

The upper chamber wall B2120 has an inlet B2122 for processing fluids, which may be liquid, vaporous, or gaseous, and the lower chamber wall B2140 has an inlet B2142 for such fluids, which for a given application may be similar fluids or different fluids. The head B2200 mounts an upper nozzle B2210, which extends axially through the sleeve B2222 so as not to interfere with the rotation of the sleeve B2222. The upper nozzle B2210 directs streams of processing fluids downwardly through the inlet B2122 of the upper chamber wall B2120.

The upper chamber wall B2120 includes an array of similar outlets B2124, which are spaced similarly at uniform angular spacings around the vertical axis A. In the disclosed embodiment, thirty-six such outlets B2124 are employed. Each outlet B2124 is spaced outwardly from the vertical axis A by a comparatively larger radial distance and is spaced inwardly from the outer perimeter B16 of a wafer B10 supported in the processing position by a comparatively smaller radial distance, such as a distance of approximately 1.5 millimeters.

When the upper and lower chamber walls B2120, B2140, are closed, they define a micro-environment reactor B2160 having an upper processing chamber B2126 that is defined by the upper chamber wall B2120 and by a first generally planar surface of the supported wafer B10, and a lower processing chamber B2146 that is defined by the lower chamber wall B2140 and a second generally planar surface of the supported wafer opposite the first side. The upper and lower processing chambers B2126, B2146, are in fluid communication with each other in an annular region B2130 beyond the outer perimeter B16 of the supported wafer B10 and are sealed by an annular, compressible seal (e.g., O-ring) B2132 bounding a lower portion B2134 of the annular region B2130. The seal B2132 allows processing fluids entering the lower inlet B2142 to remain under sufficient pressure to flow toward the outlets B2134.

As compared to reactors of the type disclosed in the previously described embodiments, the reactor B2100 is particularly suitable for executing a range of unique microfabrication processes. For example, reactor B2100 is particularly suited to execute a process that requires complete contact of a processing fluid at a first side of a workpiece and at only a peripheral margin portion of the second side thereof. Such processes may be realized because processing fluids entering the inlet B2142 of the lower chamber wall B2140 can act on the lower side B14 of a supported wafer B10, on the outer periphery B16 of the supported wafer B10, and on an outer margin B18 of the upper side B12 of the supported wafer B10 before reaching the outlets B2124 and because processing fluids entering the inlet B2122 of the upper chamber wall B2120 can act on the upper side B12 of the supported wafer B10, except for the outer margin B18 of the upper side B12, before reaching the outlets B2124.

As a significant example of one such process, the reactor B2100 can be used with control of the respective pressures of processing fluids entering the respective inlets B2122, B2142, to carry out a process in which a processing fluid is allowed to contact a first side of the workpiece, the peripheral edge of the workpiece, and a peripheral region of the opposite side of the workpiece. Such fluid flow/contact can also be viewed as a manner of excluding a processing fluid that is applied to the opposite side from a peripheral region of that side. In accordance with one embodiment of such a process, a thin film of material is etched from the first side, peripheral edge of the workpiece, and peripheral region of the opposite side of the workpiece.

In a more specific embodiment of such a process, the process may be employed in a metallization process that is used to form a microelectronic component and/or interconnect structures on a semiconductor wafer or the like. To this end, a thin film, such as the seed layer, is applied over a barrier layer on the front side and over at least a portion of the outer perimeter. After one or more intervening steps, such as electroplating of a copper layer or the like thereover, an etchant capable of etching the electroplating material, thin film material, and/or the barrier layer material is caused to flow selectively over only an outer margin of the first side while being concurrently prevented from flowing over other radial interior portions of the first side. Thus, one or more of the layers are removed from the outer margin of the first side while the layers remain intact at the portions of the first side that are disposed interior of the outer margin. If the etchant is driven over the opposite side and over the outer perimeter, as well as over the outer margin of the first side, the one or more layers are also removed from the outer perimeter of the wafer and, further, any contaminant that the etchant is capable of removing is stripped from the back side.

Based on the description of the foregoing process, it will be recognized that other layers and/or materials may be selectively etched, cleaned, deposited, protected, etc., based on selective contact of a processing fluid with the outer margin and/or opposing side of the workpiece. For example, oxide may be removed from the opposite side and outer margin of the first side of a workpiece through selective contact with an oxide etchant, such as hydrofluoric acid. Similarly, the oxide etchant may be controlled in the reactor so that it contacts all of the front side of the workpiece except for the outer margin thereby leaving the oxide at the outer margin intact. It will also be recognized that removal of the outlets B2124 allows the reactor B2100 to be used for processes in which selective outer margin inclusion or exclusion is unnecessary or otherwise undesirable.

B. Electrochemical Processing Units

The electroplating (or other electrical or non-electrical) deposition units 240, 940 of the tools 200, 300, 400, 910 can each include a plating reactor such as described in "Improved Anode Assembly For Electroplating Apparatus", U.S. Ser. No. 09/112,300 filed Jul. 9, 1998, or an adjustable plating reactor as described in "Workpiece Processor Having Processing Chamber With Improved Processing Fluid Flow", PCT/US00/10210 filed Apr. 13, 2000 or "System For Electrochemically Processing A Workpiece", PCT/US00/10120 filed Apr. 13, 2000, WO 00/14308 Mar. 16, 2000, all herein incorporated by reference. Alternate reactor types are described in WO 00/20663, published Apr. 13, 2000; WO 99/10566, published Mar. 4, 1999; WO 99/54527, published Oct. 28, 1999; WO 99/54920, published Oct. 28, 1999; and WO 99/25904, published May 27, 1999, and are encompassed by the invention and incorporated herein by reference.

In one embodiment, the plating reactor is an adjustable reactor (as referenced above) that includes a processing container for providing a flow of a processing fluid during immersion processing of at least one surface of a microelectronic workpiece. The processing container can include a principal fluid flow chamber providing a flow of processing fluid to at least one surface of the microelectronic workpiece. The fluid flow inlets can be arranged and directed to provide vertical and radial fluid flow components that combine to generate a generally uniform normal flow component radially across the surface of the microelectronic workpiece.

The reactor can include a reactor head having a microelectronic workpiece support that has one or more electrical contacts positioned to make electrical contact with the microelectronic workpiece. A plurality of anodes are disposed at different elevations in the principal fluid flow chamber so as to place them at different distances from a microelectronic workpiece being processed. One or more of the plurality of anodes may be in close proximity to the microelectronic workpiece under process. Still further, one or more of the plurality of anodes may be a virtual anode. The anodes used in the electroplating reactor can be placed in close proximity to the surface of the microelectronic workpiece to thereby provide substantial control over local electrical field/current density parameters used in the electroplating process. This substantial degree of control over the electrical parameters allows the reactor to be readily adapted to meet a wide range of electroplating requirements (e.g., seed layer thickness, seed layer type, electroplated material, electrolyte bath properties, etc.) without a corresponding change in the reactor hardware. Rather, adaptations can be implemented by altering the electrical parameters used in the electroplating process through, for example, software control of the power provided to the anodes.

Advantage can be taken of this increased control to achieve greater uniformity of the resulting electroplated film. Such control is exercised, for example, by placing the electroplating power provided to the individual anodes under the control of a programmable controller or the like. Adjustments to the electroplating power can thus be made subject to software control based on a metrology-based signal, representing seed layer thickness, for example.

It will be recognized that the particular currents that are to be provided to the anodes depends upon numerous factors including, but not necessarily limited to, the desired thickness and material of the electroplated film, the thickness and material of the initial seed layer, the distances between anodes and the surface of the microelectronic workpiece, electrolyte bath properties, etc.

Although the aforementioned adjustable reactor controls electroplating power to individual anodes, other methods of controlling electroplating film uniformity in response to metrology results are encompassed by the invention including adjusting current density, using current thieves or controlling workpiece rotation and/or fluid flow. Specific examples of apparatuses and methods for electrochemically processing microelectronic workpieces are provided below.

1. Tuning Electrodes

The following section describes methods and apparatuses for tuning electrodes (such as those described below with reference to FIGS. D1–D3). The following references are incorporated herein in their entireties by reference:

(a) U.S. patent application Ser. No. 09/849,505, filed May 4, 2001;

(b) U.S. Provisional Patent Application No. 60/206,663, filed May 24, 2000;

(c) International Patent Application No. PCT/US00/10120; filed Apr. 13, 2000, (d) U.S. Provisional Patent Application No. 60/182,160; filed Feb. 14, 2000, (e) U.S. Provisional Patent Application No. 60/143,769; filed Jul. 12, 1999;

(f) U.S. Provisional Patent Application No. 60/129,055; filed Apr. 13, 1999;

(g) U.S. Provisional Patent Application No. 60/206,663; filed May 24, 2000;

(h) U.S. patent application Ser. No. 09/866,463, filed May 24, 2001.

A facility for automatically selecting and refining electrical parameters for processing a microelectronic workpiece ("the optimizer") is disclosed. In many embodiments, the optimizer determines process parameters affecting the processing of a round workpiece (such as a semiconductor wafer) as a function of processing results at various radii on the workpiece. In some embodiments, the optimizer adjusts the electrode currents for a multiple electrode electroplating chamber, such as multiple anode reaction chambers of the Paragon tool provided by Semitool, Inc. of Kalispell, Mont., in order to achieve a specified thickness profile (i.e., flat, convex, concave, etc.) of a coating, such as a metal or other conductor, applied to a semiconductor wafer. The optimizer adjusts electrode currents for successive workpieces to compensate for changes in the thickness of the seed layer of the incoming workpiece (a source of feed forward control), and/or to correct for non-uniformities produced in prior wafers at the anode currents used to plate them (a source of feedback control). In this way, the optimizer is able to quickly achieve a high level of uniformity in the coating deposited on workpieces without substantial manual intervention.

The facility typically operates an electroplating chamber containing a principal fluid flow chamber, and a plurality of electrodes disposed in the principal fluid flow chamber. The electroplating chamber typically further contains a workpiece holder positioned to hold at least one surface of the microelectronic workpiece in contact with an electrochemical processing fluid in the principal fluid flow chamber, at least during electrochemical processing of the microelectronic workpiece. One or more electrical contacts are configured to contact the at least one surface of the microelectronic workpiece, and an electrical power supply is connected to the one or more electrical contacts and to the plurality of electrodes. At least two of the plurality of electrodes are independently connected to the electrical power supply to facilitate independent supply of power thereto. The apparatus also includes a control system that is connected to the electrical power supply to control at least one electrical power parameter respectively associated with each of the independently connected electrodes. The control system sets the at least one electrical power parameter for a given one of the independently connected electrodes based on one or more user input parameters and a plurality of predetermined sensitivity values; wherein the sensitivity values correspond to process perturbations resulting from perturbations of the electrical power parameter for the given one of the independently connected electrodes.

For example, although the present invention is described in the context of electrochemical processing of the microelectronic workpiece, the teachings herein can also be extended to other types of microelectronic workpiece processing. In effect, the teachings herein can be extended to other microelectronic workpiece processing systems that have individually controlled processing elements that are responsive to control parameters and that have interdependent effects on a physical characteristic of the microelectronic workpiece that is processed using the elements. Such systems may employ sensitivity tables or matrices as set forth herein and use them in calculations with one or more input parameters sets to arrive at control parameter values that accurately result in the targeted physical characteristic of the microelectronic workpiece.

FIG. C1 is a process schematic diagram showing inputs and outputs of the optimizer. FIG. C1 shows that the optimizer C140 uses up to three sources of input: baseline currents C110, seed change C120, and thickness error C130. The baseline currents C110 are the anode currents used to plate the previous workpiece or another set of currents for which plating thickness results are known. For the first workpiece in a sequence of workpieces, the baseline currents used to plate the workpiece are typically specified by a source other than the optimizer. For example, they may be specified by a recipe used to plate the workpieces, or may be manually determined.

The seed change C120 is the difference between the thickness of the seed layer of the incoming workpiece C121 and the thickness of the seed layer of the previous plated workpiece C122. The seed change input C120 is said to be a source of feed-forward control in the optimizer, in that it incorporates information about the upcoming plating cycle, as it reflects the measurement the workpiece to be plated in the upcoming plating cycle. Thickness error C130 is the difference in thickness between the previous plated workpiece C132 and the target thickness profile C131 specified for the upcoming plating cycle. The thickness error C130 is said to be a source of feedback control, because it incorporates information from an earlier plating cycle, that is, the thickness of the workpiece plated in the previous plating cycle.

FIG. C1 further shows that the optimizer outputs new plating charges C150 for each electrode in the upcoming plating cycle, expressed in amp-minute units. The new plating charges output is combined with a recipe schedule and a current waveform C161 to generate the currents C162, in amps, to be delivered through each electrode at each point in the recipe schedule. These new currents are used by the plating process to plate a workpiece in the next plating cycle. In embodiments in which different types of power supplies are used, other types of control parameters are generated by the optimizer for use in operating the power supply. For example, where a voltage control power supply is used, the control parameters generated by the optimizer are voltages, expressed in volts. The workpiece so plated is then subjected to post-plating metrology to measure its plated thickness C132.

While the optimizer is shown as receiving inputs and producing outputs at various points in the processing of these values, it will be understood by those in the art that the optimizer may be variously defined to include or exclude aspects of such processing. For example, while FIG. C1 shows the generation of seed change from baseline workpiece seed thickness and seed layer thickness outside the optimizer, it is contemplated that such generation may alternatively be performed within the optimizer.

FIG. C2 is a process schematic diagram showing a branched correction system utilized by some embodiments of the optimizer. The branched adjustment system utilizes two independently-engageable correction adjustments, a feedback adjustment (C230,C240,C272) due to thickness errors and a feed forward adjustment C220,C240,C271) due to incoming seed layer thickness variation. When the anode currents produce an acceptable uniformity, the feedback loop may be disengaged from the transformation of baseline currents C210 to new currents C280. The feed forward compensation may be disengaged in situations where the seed layer variations are not expected to affect thickness uniformity. For example, after the first workpiece of a similar batch is corrected for, the feed-forward compensation may be disengaged and the corrections may be applied to each sequential workpiece in the batch.

FIG. C3 is schematic block diagram of an electrochemical processing system constructed in accordance with one embodiment of the optimizer. FIG. C3 shows a reactor assembly C20 for electrochemically processing a microelectronic workpiece C25, such as a semiconductor wafer, that can be used in connection with the present invention. Generally stated, an embodiment of the reactor assembly C20 includes a reactor head C30 and a corresponding reactor base or container shown generally at C35. The reactor base C35 can be a bowl and cup assembly for containing a flow of an electrochemical processing solution. The reactor C20 of FIG. C3 can be used to implement a variety of electrochemical processing operations such as electroplating, electropolishing, anodization, etc., as well as to implement a wide variety of other material deposition techniques. For purposes of the following discussion, aspects of the specific embodiment set forth herein will be described, without limitation, in the context of an electroplating process.

The reactor head C30 of the reactor assembly C20 can include a stationary assembly (not shown) and a rotor assembly (not shown). The rotor assembly may be configured to receive and carry an associated microelectronic workpiece C25, position the microelectronic workpiece in a process-side down orientation within reactor container C35, and to rotate or spin the workpiece. The reactor head C30 can also include one or more contacts C85 (shown schematically) that provide electroplating power to the surface of the microelectronic workpiece. In the illustrated embodiment, the contacts C85 are configured to contact a seed layer or other conductive material that is to be plated on the plating surface microelectronic workpiece C25. It will be recognized, however, that the contacts C85 can engage either the front side or the backside of the workpiece depending upon the appropriate conductive path between the contacts and the area that is to be plated. Suitable reactor heads C30 with contacts C85 are disclosed in U.S. Pat. No. 6,080,291 and U.S. application Ser. Nos. 09/386,803; 09/386,610; 09/386,197; 09/717,927; and 09/823,948, all of which are expressly incorporated herein in their entirety by reference.

The reactor head C30 can be carried by a lift/rotate apparatus that rotates the reactor head C30 from an upwardly-facing orientation in which it can receive the microelectronic workpiece to a downwardly facing orientation in which the plating surface of the microelectronic workpiece can contact the electroplating solution in reactor base C35. The lift/rotate apparatus can bring the workpiece C25 into contact with the electroplating solution either coplanar or at a given angle. A robotic system, which can include an end effector, is typically employed for loading/ unloading the microelectronic workpiece C25 on the head C30. It will be recognized that other reactor assembly configurations may be used with the inventive aspects of the disclosed reactor chamber, the foregoing being merely illustrative.

The reactor base C35 can include an outer overflow container C37 and an interior processing container C39. A flow of electroplating fluid flows into the processing container C39 through an inlet C42 (arrow I). The electroplating fluid flows through the interior of the processing container C39 and overflows a weir C44 at the top of processing container C39 (arrow F). The fluid overflowing the weir C44 then passes through an overflow container C37 and exits the reactor C20 through an outlet C46 (arrow O). The fluid exiting the outlet C46 may be directed to a recirculation system, chemical replenishment system, disposal system, etc.

The reactor C20 also includes an electrode in the processing container 39 to contact the electrochemical processing fluid (e.g., the electroplating fluid) as it flows through the reactor C20. In the embodiment of FIG. C3, the reactor C20 includes an electrode assembly C50 having a base member C52 through which a plurality of fluid flow apertures C54 extend. The fluid flow apertures C54 assist in disbursing the electroplating fluid flow entering inlet C42 so that the flow of electroplating fluid at the surface of microelectronic workpiece C25 is less localized and has a desired radial distribution. The electrode assembly C50 also includes an electrode array C56 that can comprise a plurality of individual electrodes C58 supported by the base member C52. The electrode array 56 can have several configurations, including those in which electrodes are disposed at different distances from the microelectronic workpiece. The particular physical configuration that is utilized in a given reactor can depend on the particular type and shape of the microelectronic workpiece C25. In the illustrated embodiment, the microelectronic workpiece C25 is a disk-shaped semiconductor wafer. Accordingly, the present inventors have found that the individual electrodes C58 may be formed as rings of different diameters and that they may be arranged concentrically in alignment with the center of microelectronic workpiece C25. It will be recognized, however, that grid arrays or other electrode array configurations may also be employed without departing from the scope of the present invention. One suitable configuration of the reactor base C35 and electrode array C56 is disclosed in U.S. Ser. No. 09/804,696, filed Mar. 12, 2001, while another suitable configuration is disclosed in U.S. Ser. No. 09/804,697, filed Mar. 12, 2001, both of which are hereby incorporated by reference.

When the reactor C20 electroplates at least one surface of microelectronic workpiece C25, the plating surface of the workpiece C25 functions as a cathode in the electrochemical reaction and the electrode array C56 functions as an anode. To this end, the plating surface of workpiece C25 is connected to a negative potential terminal of a power supply C60 through contacts C85 and the individual electrodes C58 of the electrode array C56 are connected to positive potential terminals of the supply C60. In the illustrated embodiment, each of the individual electrodes C58 is connected to a discrete terminal of the supply C60 so that the supply C60 may individually set and/or alter one or more electrical parameters, such as the current flow, associated with each of the individual electrodes C58. As such, each of the individual electrodes C58 of FIG. C3 is an individually controllable electrode. It will be recognized, however, that one or more of the individual electrodes C58 of the electrode array C56 may be connected to a common node/terminal of the power supply C60. In such instances, the power supply C60 will alter the one or more electrical parameters of the commonly connected electrodes C58 concurrently, as opposed to individually, thereby effectively making the commonly connected electrodes C58 a single, individually controllable electrode. As such, individually controllable electrodes can be physically distinct electrodes that are connected to discrete terminals of power supply C60 as well as physically distinct electrodes that are commonly connected to a single discrete terminal of power supply C60. The electrode array C56 preferably comprises at least two individually controllable electrodes.

The electrode array C56 and the power supply C60 facilitate localized control of the electrical parameters used to electrochemically process the microelectronic workpiece C25. This localized control of the electrical parameters can be used to enhance the uniformity of the electrochemical processing across the surface of the microelectronic workpiece when compared to a single electrode system. Unfortunately, determining the electrical parameters for each of the electrodes C58 in the array C56 to achieve the desired process uniformity can be difficult. The optimizer, however, simplifies and substantially automates the determination of the electrical parameters associated with each of the individually controllable electrodes. In particular, the optimizer determines a plurality of sensitivity values, either experimentally or through numerical simulation, and subsequently uses the sensitivity values to adjust the electrical parameters associated with each of the individually controllable electrodes. The sensitivity values may be placed in a table or may be in the form of a Jacobian matrix. This table/matrix holds information corresponding to process parameter changes (i.e., thickness of the electroplated film) at various points on the workpiece C25 due to electrical parameter perturbations (i.e., electrical current changes) to each of the individually controllable electrodes. This table/ matrix is derived from data from a baseline workpiece plus data from separate runs with a perturbation of a controllable electrical parameter to each of the individually controllable electrode.

The optimizer typically executes in a control system C65 that is connected to the power supply C60 in order to supply current values for a plating cycle. The control system C65 can take a variety of forms, including general- or special-purpose computer systems, either integrated into the manufacturing tool containing the reaction chamber or separate from the manufacturing tool, such as a laptop or other portable computer system. The control system may be communicatively connected to the power supply C60, or may output current values that are in turn manually inputted to the power supply. Where the control system is connected to the power supply by a network, other computer systems and similar devices may intervene between the control system and the power supply. In many embodiments, the control system contains such components as one or more processors, a primary memory for storing programs and data, a persistent memory for persistently storing programs and data, input/output devices, and a computer-readable medium drive, such as a CD-ROM drive or a DVD drive.

Once the values for the sensitivity table/matrix have been determined, the values may be stored in and used by control system C65 to control one or more of the electrical parameters that power supply C60 uses in connection with each of the individually controllable electrodes C58. FIG. C4 is a flow diagram illustrating one manner in which the sensitivity table/matrix may be used to calculate an electrical parameter (i.e., current) for each of the individually controllable electrodes C58 that may be used to meet a process target parameter (i.e., target thickness of the electroplated film).

In the steps shown in FIG. C4, the optimizer utilizes two sets of input parameters along with the sensitivity table/matrix to calculate the required electrical parameters. In step C70, the optimizer performs a first plating cycle (a "test run") using a known, predetermined set of electrical parameters. For example, a test run can be performed by subjecting a microelectronic workpiece C25 to an electroplating process in which the current provided to each of the individually controllable electrodes C58 is fixed at a predetermined magnitude for a given period of time.

In step C72, after the test run is complete, the optimizer measures the physical characteristics (i.e., thickness of the electroplated film) of the test workpiece to produce a first set of parameters. For example, in step C72, the test workpiece may be subjected to thickness measurements using a metrology station, producing a set of parameters containing thickness measurements at each of a number of points on the test workpiece. In step C74, the optimizer compares the physical characteristics of the test workpiece measured in step C72 against a second set of input parameters. In the illustrated embodiment of the method, the second set of input parameters corresponds to the target physical characteristics of the microelectronic workpiece that are to be ultimately achieved by the process (i.e., the thickness of the electroplated film). Notably, the target physical characteristics can either be uniform over the surface of the microelectronic workpiece C25 or vary over the surface. For example, in the illustrated embodiment, the thickness of an electroplated film on the surface of the microelectronic workpiece C25 can be used as the target physical characteristic, and the user may expressly specify the target thicknesses at various radial distances from the center of the workpiece, a grid relative to the workpiece, or other reference systems relative to fiducials on the workpiece.

In step C74, the optimizer uses the first and second set of input parameters to generate a set of process error values. In step C80, the optimizer derives a new electrical parameter set based on calculations including the set of process error values and the values of the sensitivity table/matrix. In step C82, once the new electrical parameter set is derived, the optimizer directs power supply C60 to use the derived electrical parameters in processing the next microelectronic workpiece. Then, in step C404, the optimizer measures physical characteristics of the test workpiece in a manner similar to step C72. In step 406, the optimizer compares the characteristics measured in step C404 with a set of target characteristics to generate a set of process error values. The set of target characteristics may be the same set of target characteristics as used in step C74, or may be a different set of target characteristics. In step C408, if the error values generated in step C406 are within a predetermined range, then the optimizer continues in step C410, else the facility continues in C80. In step C80, the optimizer derives a new electrical parameter set. In step C410, the optimizer uses the newest electrical parameter derived in step C80 in processing subsequent microelectronic workpieces. In some embodiments (not shown), the processed microelectronic workpieces, and/or their measured characteristics are examined, either manually or automatically, in order to further troubleshoot the process.

With reference again to FIG. C3, the first and second set of input parameters may be provided to the control system C65 by a user interface C64 and/or a metrics tool C86. The user interface C64 can include a keyboard, a touch-sensitive screen, a voice recognition system, and/or other input devices. The metrics tool C86 may be an automated tool that is used to measure the physical characteristics of the test workpiece after the test run, such as a metrology station. When both a user interface C64 and a metrics tool C86 are employed, the user interface C64 may be used to input the target physical characteristics that are to be achieved by the process while metrics tool 86 may be used to directly communicate the measured physical characteristics of the test workpiece to the control system C65. In the absence of a metrics tool that can communicate with control system C65, the measured physical characteristics of the test workpiece can be provided to control system C65 through the user interface C64, or by removable data storage media, such as a floppy disk. It will be recognized that the foregoing are only examples of suitable data communications devices and that other data communications devices may be used to provide the first and second set of input parameters to control system C65.

In order to predict change in thickness as a function of change in current, the optimizer generates a Jacobian sensitivity matrix. An example in which the sensitivity matrix generated by the optimizer is based upon a mathematical model of the reaction chamber is discussed below. In additional embodiments, however, the sensitivity matrix used by the optimizer is based upon experimental results produced by operating the actual reaction chamber. The data modeled in the sensitivity matrix includes a baseline film thickness profile and as many perturbation curves as anodes, where each perturbation curve involves adding roughly 0.05 amps to one specific anode. The Jacobian is a matrix of partial derivatives, representing the change in thickness in microns over the change in current in amp minutes. Specifically, the Jacobian is an m×n matrix where m, the number of rows, is equal to the number of radial location data points in the modeled data and n, the number of columns, is equal to the number of anodes on the reactor. Typically, the value of m is relatively large (>100) due to the computational mesh chosen for the model of the chamber. The components of the matrix are calculated by taking the quotient of the difference in thickness due to the perturbed anode and the current change in amp-minutes, which is the product of the current change in amps and the run time in minutes.

As one source of feedback control, the optimizer uses the thickness of the most-recently plated workpiece at each of a number of radial positions on the plated wafer. These radial positions may either be selected from the radial positions corresponding to the rows of the matrix, or may be interpolated between the radial positions corresponding to the rows of the matrix. A wide range of numbers of radial positions may be used. As the number of radial positions used increases, the optimizer's results in terms of coating uniformity improves. However, as the number of radial positions used increases, the amount of time required to measure the workpiece, to input the measurement results, and/or to operate the optimizer to generate new currents can increase. Accordingly, the smallest number of radial positions that produce acceptable results is typically used. One approach is to use the number of radial test points within a standard metrology contour map (4 for 200 mm diameter workpiece and 4 or 6 for 300 mm diameter workpiece) plus one, where the extra point is added to better the 3 sigma uniformity for all the points (i.e., to better the diameter scan).

A specific measurement point map may be designed for the metrology station, which will measure the appropriate points on the workpiece corresponding with the radial positions necessary for the optimizer operation.

The optimizer can further be understood with reference to a specific embodiment in which the electrochemical process is electroplating, the thickness of the electroplated film is the target physical parameter, and the current provided to each of the individually controlled electrodes C58 is the electrical parameter that is to be controlled to achieve the target film thickness. In accordance with this specific embodiment, a Jacobian sensitivity matrix is first derived from experimental or numerically simulated data. FIG. C5 is a graph of a sample Jacobian sensitivity matrix for a multiple-electrode reaction chamber. In particular, FIG. C5 is a graph of a sample change in electroplated film thickness per change in current-time as a function of radial position on the microelectronic workpiece C25 for each of a number of individually controlled electrodes, such as anodes A1–A4 shown in FIG. C3. A first baseline workpiece is electroplated for a predetermined period of time by delivering a predetermined set of current values to electrodes in the multiple anode reactor. The thickness of the resulting electroplated film is then measured as a function of the radial position on the workpiece. These data points are then used as baseline measurements that are compared to the data acquired as the current to each of the anodes A1–A4 is perturbated. Line C90 is a plot of the Jacobian terms associated with a perturbation in the current provided by power supply C60 to anode A1 with the current to the remaining anodes A2–A4 held at their constant predetermined values. Line C92 is a plot of the Jacobian terms associated with a perturbation in the current provided by power supply C60 to anode A2 with the current to the remaining anodes A1 and A3–A4 held at their constant predetermined values. Line C94 is a plot of the Jacobian terms associated with a perturbation in the current provided by power supply C60 to anode A3 with the current to the remaining anodes A1–A2 and A4 held at their constant predetermined values. Lastly, line C96 is a plot of the Jacobian terms associated with a perturbation in the current provided by power supply C60 to anode A4 with the current to the remaining anodes A1–A3 held at their constant predetermined values.

The data for the Jacobian parameters shown in FIG. C5 may be computed using the following equations:

$$J_{ij} = \frac{\partial t_i}{\partial AM_j} \cong \frac{t_i(AM + \varepsilon_j) - t_i(AM)}{|\varepsilon_j|} \quad \text{Equation (1)}$$

$$t(AM) = [t_1(AM) \quad t_2(AM) \quad \ldots \quad t_m(AM)] \quad \text{Equation (2)}$$

$$AM = [AM_1 \quad AM_2 \quad \ldots \quad AM_n] \quad \text{Equation (3)}$$

$$\varepsilon_1 = \begin{bmatrix} \Delta AM_1 \\ 0 \\ \vdots \\ 0 \end{bmatrix} \quad \varepsilon_2 = \begin{bmatrix} 0 \\ \Delta AM_2 \\ 0 \\ \vdots \\ 0 \end{bmatrix} \quad \ldots \quad \varepsilon_n = \begin{bmatrix} 0 \\ \vdots \\ 0 \\ \Delta AM_n \end{bmatrix} \quad \text{Equation (4)}$$

where:
t represents thickness [microns];
AM represents current [amp-minutes];
$\varepsilon$ represents perturbation [amp-minutes];
i is an integer corresponding to a radial position on the workpiece;
j is an integer representing a particular anode;
m is an integer corresponding to the total number of radial positions on the workpiece; and
n is an integer representing the total number of individually-controllable anodes.

The Jacobian sensitivity matrix, set forth below as Equation (5), is an index of the Jacobian values computed using Equations (1)–(4). The Jacobian matrix may be generated either using a simulation of the operation of the deposition chamber based upon a mathematical model of the deposition chamber, or using experimental data derived from the plating of one or more test wafers. Construction of such a mathematical model, as well as its use to simulate operation of the modeled deposition chamber, is discussed in detail in G. Ritter, P. McHugh, G. Wilson and T. Ritzdorf, "Two- and three-dimensional numerical modeling of copper electroplating for advanced ULSI metallization," Solid State Electronics, volume 44, issue 5, pp. 797–807 (May 2000), available from http://www.elsevier.nl/gej-ng/10/30/25/29/28/27/article.pdf, also available from http://journals.ohiolink.edu/pdflinks/01040215463800982.pdf.

$$J = \begin{vmatrix} 0.192982 & 0.071570 & 0.030913 & 0.017811 \\ 0.148448 & 0.084824 & 0.039650 & 0.022264 \\ 0.066126 & 0.087475 & 0.076612 & 0.047073 \\ 0.037112 & 0.057654 & 0.090725 & 0.092239 \\ 0.029689 & 0.045725 & 0.073924 & 0.138040 \end{vmatrix} \quad \text{Equation (5)}$$

The values in the Jacobian matrix are also presented as highlighted data points in the graph of FIG. C5. These values correspond to the radial positions on the surface of a semiconductor wafer that are typically chosen for measurement. Once the values for the Jacobian sensitivity matrix have been derived, they may be stored in control system C65 for further use.

Table 1 below sets forth exemplary data corresponding to a test run in which a 200 mm wafer is plated with copper in a multiple anode system using a nominally 2000 Å thick initial copper seed-layer. Identical currents of 1.12 Amps (for 3 minutes) were provided to all four anodes A1–A4. The resulting thickness at five radial locations was then measured and is recorded in the second column of Table 1. The 3 sigma uniformity of the wafer is 9.4% using a 49 point contour map. Target thickness were then provided and are set forth in column 3 of Table 1. In this example, because a flat coating is desired, the target thickness is the same at each radial position. The thickness errors (processed errors) between the plated film and the target thickness were then calculated and are provided in the last column of Table 1.

These calculated thickness errors are used by the optimizer as a source of feedback control.

TABLE 1

DATA FROM WAFER PLATED WITH 1.12 AMPS TO EACH ANODE.

| Radial Location (m) | Measured Thickness (microns) | Target Thickness (microns) | Error (microns) |
|---|---|---|---|
| 0 | 1.1081 | 1.0291 | −0.0790 |
| 0.032 | 1.0778 | 1.0291 | −0.0487 |
| 0.063 | 1.0226 | 1.0291 | 0.0065 |
| 0.081 | 1.0169 | 1.0291 | 0.0122 |
| 0.098 | 0.09987 | 1.0291 | 0.0304 |

The Jacobian sensitivity matrix may then be used along with the thickness error values to provide a revised set of anode current values that should yield better film uniformity. The equations summarizing this approach are set forth below:

$$\Delta AM = J^{-1} \Delta t \qquad \text{Equation (6)}$$

(for a square system in which the number of measured radial positions corresponds to the number of individually controlled anodes in the system); and $$\Delta AM = (J^T J)^{-1} J^T \Delta t \qquad \text{Equation (7)}$$

(for a non-square system in which the number of measured radial positions is different than the number of individually controlled anodes in the system).

$$\Delta t_i = t_i^{target} - t_i^{old} - (t_i^{newseed} - t_i^{old\ seed}) + t_i^{specified} \qquad \text{Equation (8)}$$

In Equation (8), $t_i^{target}$ is the target thickness required to obtain a wafer of desired profile while considering the total current adjustment, $t_i^{old}$ is the old overall thickness, $t_i^{newseed}$ is the thickness of the new seed layer, $t_i^{old\ seed}$ is the thickness of the old seed layer, and $t_i^{specified}$ is the thickness specification relative to the center of the wafer, that is, the thickness specified by the target plating profile. In particular, the term $t_i^{specified}$ represents the target thickness, while the quantity $t_i^{target} - t_i^{old}$ represents feedback from the previous wafer, and the quantity $t_i^{newseed} - t_i^{old\ seed}$ represents feedforward from the thickness of the seed layer of the incoming wafer—to disable feedback control, the first quantity is omitted from equation (8); to disable feedforward control, the second quantity is omitted from equation (8).

Table 2 shows the foregoing equations as applied to the given data set and the corresponding current changes that have been derived from the equations to meet the target thickness at each radial location (best least square fit). Such application of the equations, and construction of the Jacobian matrix is in some embodiments performed using a spreadsheet application program, such as Microsoft Excel®, in connection with specialized macro programs. In other embodiments, different approaches are used in constructing the Jacobian matrix and applying the above equations.

The wafer uniformity obtained with the currents in the last column of Table 2 was 1.7% (compared to 9.4% for the test run wafer). This procedure can be repeated again to try to further improve the uniformity. In this example, the differences between the seed layers were ignored since the seed layers are substantially the same.

TABLE 2

CURRENT ADJUSTMENT

| Anode # | Anode Currents for Run #1 (Amps) | Change to Anode Currents (Amps) | Anode Currents for Run #2 (Amps) |
|---|---|---|---|
| 1 | 1.12 | −0.21 | 0.91 |
| 2 | 1.12 | 0.20 | 1.32 |
| 3 | 1.12 | −0.09 | 1.03 |
| 4 | 1.12 | 0.10 | 1.22 |

Once corrected values for the anode currents have been calculated, control system C65 of FIG. C3 directs power supply C60 to provide the corrected current to the respective anode A1–A4 during subsequent processes to meet the target film thickness and uniformity.

In some instances, it may be desirable to iteratively apply the foregoing equations to arrive at a set of current change values (the values shown in column 3 Table 2) that add up to zero. For example, doing so enables the total plating charge—and therefore the total mass of plated material—to be held constant without having to vary the recipe time.

The Jacobian sensitivity matrix in the foregoing example quantifies the system response to anode current changes about a baseline condition. Ideally, a different matrix may be employed if the processing conditions vary significantly from the baseline. The number of system parameters that may influence the sensitivity values of the sensitivity matrix is quite large. Such system parameters include the seed layer thickness, the electrolyte conductivity, the metal being plated, the film thickness, the plating rate, the contact ring geometry, the wafer position relative to the chamber, and the anode shape/current distribution. Anode shape/current distribution is included to accommodate chamber designs where changes in the shape of consumable anodes over time affect plating characteristics of the chamber. Changes to all of these items can change the current density across the wafer for a given set of anode currents and, as a result, can change the response of the system to changes in the anode currents. It is expected, however, that small changes to many of these parameters will not require the calculation of a new sensitivity matrix. Nevertheless, a plurality of sensitivity tables/matrices may be derived for different processing conditions and stored in control system 65. Which of the sensitivity tables/matrices is to be used by the control system 65 can be entered manually by a user, or can be set automatically depending on measurements taken by certain sensors or the like (i.e., temperature sensors, chemical analysis units, etc.) that indicate the existence of one or more particular processing conditions.

The optimizer may also be used to compensate for differences and non-uniformities of the initial seed layer of the microelectronic workpiece. Generally stated, a blanket seed layer can affect the uniformity of a plated film in two ways:

1. If the seed layer non-uniformity changes, this non-uniformity is added to the final film. For example, if the seed layer is 100 Å thinner at the outer edge than expected, the final film thickness may also be 100 Å thinner at the outer edge.

2. If the average seed-layer thickness changes significantly, the resistance of the seed-layer will change resulting in a modified current density distribution across the wafer and altered film uniformity. For example, if the seed layer decreases from 2000 Å to 1000 Å, the final film will not only be thinner (because the initial film is thinner) but it will also be relatively thicker at the outer edge due to the higher resistivity of the 1000 Å seed-layer compared to the 2000 Å seed-layer (assuming an edge contact).

The optimizer can be used to compensate for such seed-layer deviations, thereby utilizing seed-layer thicknesses as a source of feed-forward control. In the first case above, the changes in seed-layer uniformity may be handled in the same manner that errors between target thickness and measured thickness are handled. A pre-measurement of the wafer quantifies changes in the seed-layer thickness at the various radial measurement locations and these changes (errors) are figured into the current adjustment calculations. Using this approach, excellent uniformity results can be obtained on the new seed layer, even on the first attempt at electroplating.

In the second case noted above, an update of or selection of another stored sensitivity/Jacobian matrix can be used to account for a significantly different resistance of the seed-layer. A simple method to adjust for the new seed layer thickness is to plate a film onto the new seed layer using the same currents used in plating a film on the previous seed layer. The thickness errors measured from this wafer can be used with a sensitivity matrix appropriate for the new seed-layer to adjust the currents.

To further illuminate the operation of the optimizer, a second test run is described. In the second test run, the optimization process begins with a baseline current set or standard recipe currents. A wafer must be pre-read for seed layer thickness data, and then plated using the indicated currents. After plating, the wafer is re-measured for the final thickness values. The following wafer must also be pre-read for seed layer thickness data. Sixty-seven points at the standard five radial positions (0 mm, 31.83 mm, 63.67 mm, 80 mm, 95.5 mm) are typically measured and averaged for each wafer reading.

The thickness data from the previous wafer, and the new wafer seed layer, in addition to the anode currents, are entered into the input page of the optimizer. The user may also elect to input a thickness specification, or chose to modify the plating thickness by adjusting the total current in amp-minutes. After all the data are correctly inputted, the user activates the optimizer. In response, the optimizer predicts thickness changes and calculates new currents.

The new wafer is then plated with the adjusted anode currents and then measured. A second modification may be required if the thickness profile is not satisfactory.

When a further iteration is required, the optimization is continued. As before, the post-plated wafer is measured for thickness values, and another wafer is pre-read for a new seed set of seed layer thickness values. Then, the following quantities are entered on the input page:

1. plated wafer thickness,
2. anode currents,
3. plated wafer seed layer thickness, and
4. new wafer seed layer thickness The recipe time and thickness profile specification should be consistent with the previous iteration. The program is now ready to be run again to provide a new set of anode currents for the next plating attempt.

After plating with the new currents, the processed wafer is measured and if the uniformity is still not acceptable, the procedure may be continued with another iteration. The standard value determining the uniformity of a wafer is the 3-$\sigma$, which is the standard deviation of the measured points relative to the mean and multiplied by three. Usually a forty-nine point map is used with measurements at the radial positions of approximately 0 mm, 32 mm, 64 mm, and 95 mm to test for uniformity.

The above procedure will be demonstrated using a multi-iteration example. Wafer #3934 is the first plated wafer using a set of standard anode currents: 0.557/0.818/1.039/0.786 (anode1/anode2/anode3/anode4 in amps) with a recipe time of 2.33 minutes (140 seconds). Before plating, the wafer is pre-read for seed layer data. These thickness values, in microns, from the center to the outer edge, are shown in Table 3:

TABLE 3

SEED LAYER THICKNESS VALUES FOR WAFER #3934

| Radius (mm) | Thickness (µm) |
|---|---|
| 0.00 | 0.130207 |
| 31.83 | 0.13108 |
| 63.67 | 0.131882 |
| 80.00 | 0.129958 |
| 95.50 | 0.127886 |

The wafer is then sent to the plating chamber, and then re-measured after being processed. The resulting thickness values (in microns) for the post-plated wafer #3934 are shown in Table 4:

TABLE 4

THICKNESS VALUES FOR POST-PLATED WAFER #3934

| Radius (mm) | Thickness (µm) |
|---|---|
| 0.00 | 0.615938 |
| 31.83 | 0.617442 |
| 63.67 | 0.626134 |
| 80.00 | 0.626202 |
| 95.50 | 0.628257 |

The 3-$\sigma$ for the plated wafer is calculated to be 2.67% over a range of 230.4 Angstroms. Since the currents are already producing a wafer below 3%, any adjustments are going to be minor. The subsequent wafer has to be pre-read for seed layer values in order to compensate for any seed layer differences. Wafer #4004 is measured and the thickness values in microns are shown in Table 5:

TABLE 5

SEED LAYER THICKNESS VALUES FOR WAFER #4004

| Radius (mm) | Thickness (µm) |
|---|---|
| 0.00 | 0.130308 |
| 31.83 | 0.131178 |
| 63.67 | 0.132068 |
| 80.00 | 0.13079 |
| 95.50 | 0.130314 |

For this optimization run, there is no thickness profile specification, or overall thickness adjustment. All of the preceding data is inputted into the optimizer, and the optimizer is activated to generate a new set of currents. These currents will be used to plate the next wafer. FIG. C6 is a spreadsheet diagram showing the new current outputs calculated from the inputs for the first optimization run. It can be seen that the input values C601 have generated output C602, including a new current set. The optimizer has also predicted the absolute end changed thicknesses C603 that this new current set will produce.

The new anode currents are sent to the process recipe and run in the plating chamber. The run time and total currents (amp-minutes) remain constant, and the current density on the wafer is unchanged. The new seed layer data from this run for wafer #4004 will become the old seed layer data for the next iteration.

The thickness (microns) resulting from the adjusted currents plated on wafer #4004 are shown in Table 6:

TABLE 6

THICKNESS VALUES FOR POST-PLATED WAFER #4004

| Radius (mm) | Thickness (μm) |
|---|---|
| 0.00 | 0.624351 |
| 31.83 | 0.621553 |
| 63.67 | 0.622704 |
| 80.00 | 0.62076 |
| 95.50 | 0.618746 |

The post-plated wafer has a 3-σ of 2.117% over a range of 248.6 Angstroms. To do another iteration, a new seed layer measurement is required, unless notified that the batch of wafers has equivalent seed layers. Wafer #4220 is pre-measured and the thickness values in microns are shown in Table 7:

TABLE 7

SEED LAYER THICKNESS VALUES FOR WAFER #4220

| Radius (mm) | Thickness (μm) |
|---|---|
| 0.00 | 0.127869 |
| 31.83 | 0.129744 |
| 63.67 | 0.133403 |
| 80.00 | 0.134055 |
| 95.50 | 0.1335560 |

Again, all of the new data is inputted into the optimizer, along with the currents used to plate the new wafer and the thickness of the plated wafer's seed. The optimizer automatically transfers the new currents into the old currents among the inputs. The optimizer is then activated to generate a new set of currents. FIG. C7 is a spreadsheet diagram showing the new current outputs calculated from the inputs for the second optimization run. It can be seen that, from input value C701, the optimizer has produced output C702 including a new current set. It can further be seen that that the facility has predicted absolute and changed thicknesses C703 that will be produced using the new currents.

The corrected anode currents are again sent to the recipe and applied to the plating process. The $2^{nd}$ adjustments on the anode currents produce the thickness values in microns shown in Table 8:

TABLE 8

THICKNESS VALUES FOR POST-PLATED WAFER #4220

| Radius (mm) | Thickness (μm) |
|---|---|
| 0.00 | 0.624165 |
| 31.83 | 0.622783 |
| 63.67 | 0.626911 |
| 80.00 | 0.627005 |
| 95.50 | 0.623823 |

The 3-σ for wafer #4220 is 1.97% over a range of 213.6 Angstroms. The procedure may continue to better the uniformity, but the for the purpose of this explanation, a 3-σ below 2% is acceptable.

The optimizer may also be used to compensate for reactor-to-reactor variations in a multiple reactor system, such as the LT-210C™ available from Semitool, Inc., of Kalispell, Mont. In such a system, there is a possibility that the anode currents required to plate a specified film might be different on one reactor when compared to another. Some possible sources for such differences include variations in the wafer position due to tolerances in the lift-rotate mechanism, variations in the current provided to each anode due to power supply manufacturing tolerances, variations in the chamber geometry due to manufacturing tolerances, variations in the plating solution, etc.

In a single anode system, the reactor-to-reactor variation is typically reduced either by reducing hardware manufacturing tolerances or by making slight hardware modifications to each reactor to compensate for reactor variations. In a multiple anode reactor constructed in accordance with the teachings of the present invention, reactor-to-reactor variations can be reduced/eliminated by running slightly different current sets in each reactor. As long as the reactor variations do not fundamentally change the system response (i.e., the sensitivity matrix), the self-tuning scheme disclosed herein is expected to find anode currents that meet film thickness targets. Reactor-to-reactor variations can be quantified by comparing differences in the final anode currents for each chamber. These differences can be saved in one or more offset tables in the control system C65 so that the same recipe may be utilized in each reactor. In addition, these offset tables may be used to increase the efficiency of entering new processing recipes into the control system C65. Furthermore, these findings can be used to trouble-shoot reactor set up. For example, if the values in the offset table are over a particular threshold, the deviation may indicate a hardware deficiency that needs to be corrected.

As mentioned above, embodiments of the optimizer may be used to set currents and other parameters for complex deposition recipes that specify changes in current during the deposition cycle. As an example, embodiments of the optimizer may be used to determine anode currents in accordance with recipe having two different steps. Step 1 of the recipe lasts for 0.5 minutes, during which a total of +1 amp of current is delivered through four electrodes. Step 2 of the recipe, which immediately follows step 1, is 1.25 minutes long. During step 2, a total current of +9 amps is delivered for 95 milliseconds. Immediately afterwards, a total current of −4.3 amps is delivered for 25 milliseconds. Ten milliseconds after delivery of the −4.3 amp current is concluded, the cycle repeats, delivering +9 amps for another 95 milliseconds. The period during which a positive current is being delivered is known as the "forward phase" of the step, while the time during which a negative current is being delivered is known as the "backward phase" of the step. Backward phases may be used, for example, to reduce irregularities formed in the plated surface as the result of organic substances within the plating solution.

In order to apply the optimizer to optimize currents for this recipe, initial currents are chosen in accordance with the recipe. These are shown below in Table 9.

TABLE 9

INITIAL MULTI-STEP RECIPE

| | | Step 1 | Step 2 |
|---|---|---|---|
| 1. | time | 0.5 | 1.25 |
| 2. | forward fraction | 1 | 0.730769 |

TABLE 9-continued

INITIAL MULTI-STEP RECIPE

| | | Step 1 | Step 2 |
|---|---|---|---|
| 3. | anode 1 current | 0.2 | 1.8 |
| 4. | anode 2 current | 0.24 | 2.16 |
| 5. | anode 3 current | 0.34 | 3.06 |
| 6. | anode 4 current | 0.22 | 1.98 |
| 7. | backward fraction | | 0.192307 |
| 8. | anode 1 current | | −0.86 |
| 9. | anode 2 current | | −1.03 |
| 10. | anode 3 current | | −1.46 |
| 11. | anode 4 current | | −0.95 |
| 12. | forward amp-min | 0.5 | 8.221153 |
| 13. | backward amp-min | 0 | −1.033653 |
| 14. | Total Amp-min | | 7.6875 |

The left-hand column of Table 9 shows currents and other information for the first step of the recipe, while the right-hand column shows currents and other information for the second step of the recipe. In line 1, it can be seen that step 1 has a duration of 0.5 minutes, while step 2 has a duration of 1.25 minutes. In line 2, it can be seen that, in step 1, forward plating is performed for 100% of the duration of the step, while in step 2, forward plating is performed for about 73% of the duration of the step (95 milliseconds out of the 130 millisecond period of the step). Lines 3–6 show the currents delivered through each of the anodes during the forward phase of each of the two steps. For example, it can be seen that 0.24 amps are delivered through anode 2 for the duration of step 1. In line 7, it can be seen that a negative current is delivered for about 19% of the duration of step 2 (25 milliseconds out of the total period of 130 milliseconds). Lines 8–11 show the negative currents delivered during the backward phase of step 2. Line 12 shows the charge, in amp-minutes, delivered in the forward phase of each step. For step 1, this is 0.5 amp-minutes, computed by multiplying the step 1 duration of 0.5 minutes by the forward fraction of 1, and by the sum of step 1 forward currents, 1 amp. The forward plating charge for step 2 is about 8.22 amp-minutes, computed by multiplying the duration of step 2, 1.25 minutes, by the forward fraction of about 73%, and by the sum of the forward currents in step 2, 9 amps. Line 13 shows the results of a similar calculation for the backward phase of step 2. Line 14 shows the net plating charge, 7.6875 amp-minutes obtained by summing the signed charge values on lines 12 and 13.

The deposition chamber is used to deposit a wafer in accordance with these initial currents. That is, during the first half-minute of deposition (step 1), +0.2 amps are delivered through anode 1. During the next 1.25 minutes of the process (step 2), +1.8 amps are delivered through anode 1 for 95 milliseconds, then −0.86 amps are delivered through anode 1 for 25 milliseconds, then no current flows through 1 for 10 milliseconds, and then the cycle is repeated until the end of the 1.25 minute duration of step 2. Overall, the charge of 1.537 amp-minutes is delivered through anode 1. This value is determined by multiplying duration, forward fraction, and anode 1 current from step 1, then adding the product of the duration of step 2, the forward fraction of step 2, and the forward anode 1 current of step 2, then adding the product of the duration of step 2, the backward fraction of step 2, and the backward anode 1 current of step 2. Such net plating charges may be calculated for each of the anodes, as shown below in Table 10.

TABLE 10

NET PLATING CHARGES IN INITIAL MULTI-STEP RECIPE

| Anode 1 | 1.537 Amp-min |
|---|---|
| Anode 2 | 1.845 Amp-min |
| Anode 3 | 2.614 Amp-min |
| Anode 4 | 1.690 Amp-min |

These plating charge values are submitted to the optimizer together with thicknesses measured from the wafer plated using the initial current. In response, the optimizer generates a set of new net plating charges for each electrode. These new net plating charges are shown below in Table 11.

TABLE 11

NEW NET PLATING CHARGES FOR REVISED RECIPE

| Anode 1 | 1.537 Amp-min + 0.171286 Amp-min = 1.709 Amp-min |
|---|---|
| Anode 2 | 1.845 Amp-min − 0.46657 Amp-min = 1.379 Amp-min |
| Anode 3 | 2.614 Amp-min + 0.106337 Amp-min = 1.271 Amp-min |
| Anode 4 | 1.690 Amp-min + 0.188942 Amp-min = 1.879 Amp-min |

The optimizer then computes for each anode a share of the current to be delivered through the anode by dividing the new net plating charge determined for the anode by the sum of the net plating charges determined for all of the anodes. These current shares are shown below in Table 12.

TABLE 12

CURRENT SHARES FOR REVISED RECIPE

| Anode 1 | 1.709/7.6875 = 22.2% |
|---|---|
| Anode 2 | 1.379/7.6875 = 17.9% |
| Anode 3 | 1.271/7.6875 = 35.5% |
| Anode 4 | 1.879/7.6875 = 24.4% |

The optimizer then determines a new current for each anode in each step and phase of the recipe by multiplying the total current for the step and phase by the current share computed for each anode. These are shown in Table 13A below.

TABLE 13A

REVISED MULTI-STEP RECIPE

| | | Step 1 | Step 2 |
|---|---|---|---|
| 1. | time | 0.5 | 1.25 |
| 2. | forward fraction | 1 | 0.730769 |
| 3. | anode 1 current | 0.222281 | 2.000530 |
| 4. | anode 2 current | 0.179371 | 1.614339 |
| 5. | anode 3 current | 0.353895 | 3.185055 |
| 6. | anode 4 current | 0.244452 | 2.200075 |
| 7. | backward fraction | | 0.192307 |
| 8. | anode 1 current | 0 | −0.955808 |
| 9. | anode 2 current | 0 | −0.771295 |
| 10. | anode 3 current | 0 | −1.521748 |
| 11. | anode 4 current | 0 | −1.051147 |
| 12. | forward amp-min | 0.5 | 8.221153 |
| 13. | backward amp-min | 0 | −1.033653 |
| 14. | Total Amp-min | | 7.6875 |

For example, it can be seen in line 4 of Table 13A that the forward anode 2 current for step 2 is about 1.61 amps, computed by multiplying the +9 amps total current for the forward phase of step 2 by the current share of 17.9% computed for anode 2 shown in Table 12.

By comparing Table 13A to Table 9, it can be seen that the net plating charge changes specified by the optimizer for the revised recipe are distributed evenly across the steps and phases of this recipe. It can also be seen that the total plating charge for each step and phase of the revised recipe, as well as the total plating charge, is unchanged from the initial multistep recipe. The optimizer may utilize various other schemes for distributing plating charge changes within the recipe. For example, it may alternatively distribute all the changes to step 2 of the recipe, leaving step 1 of the recipe unchanged from the initial multi-step recipe. In some embodiments, the optimizer maintains and applies a different sensitivity matrix for each step in a multi-step recipe.

In some embodiments, the facility utilizes a form of predictive control feedback. In these embodiments, the optimizer generates, for each set of revised currents, a set of predicted plating thicknesses. The optimizer determines the difference between these predicted thicknesses and the actual plated thicknesses of the corresponding workpiece. For each workpiece, this set of differences represents the level of error produced by the optimizer in setting currents for the workpiece. The optimizer uses the set of differences for the previous workpiece to improve performance on the incoming workpiece by subtracting these differences from the target thickness changes to be effected by current changes for the incoming workpiece. In this way, the optimizer is able to more quickly achieve the target plating profile.

Further sample wafer processing processes employing the optimizer are discussed below. It should be noted that no attempt is made to exhaustively list such processes, and that those included are merely exemplary.

Table 13B below shows a sample wafer processing process employing the optimizer, from which a subset of the steps may be selected and/or modified to define additional such processes.

TABLE 13B

SAMPLE WAFER PROCESSING PROCESS
EMPLOYING OPTIMIZER

Step  Tool/Process

1. Deposit metal seed layer using one or more physical vapor deposition ("PVD") tools, different chambers on the same PVD tool, or CVD chambers or electroless deposition chambers.
2. Measure seed layer film thickness using metrology station, either on the tool or an independent station - metrology stations can infer film thickness from sheet resistance measurements or from optical measurements of the film
3. Apply optimizer -- residing on tool or off tool on a personal computer -- in a seed layer enhancement ("SLE") chamber using measurements from step 2 (feedforward) and measurement results from previous SLE wafer on step 6 or 8 (feedback)
4. Deposit metal layer in SLE chamber
5. Rinse wafer in SRD/Capsule chamber
6. Measure wafer thickness using Metrology Station
7. Anneal wafer in annealing chamber on the tool or in independent stations
8. Measure wafer thickness using Metrology Station
9. Apply optimizer in ECD chamber using measurements from step 7 (feedforward) and measurement results from previous ECD wafer on step 12 or 14 (feedback)
10. Deposit final metal layer in ECD chamber
11. Clean and bevel etch wafer in Capsule chamber
12. Measure wafer thickness using Metrology Station
13. Anneal wafer in anneal chamber
14. Measure wafer thickness using Metrology Station These steps may be qualified in a variety of ways including: the measurement/optimizer sequence steps can be performed during tool qualification or "dial-in"; the measurement/optimizer sequence steps sequence can be performed periodically to monitor performance; the measurement/optimizer sequence steps sequence can be performed on each wafer; SLE process may be optional depending upon the measurement results in step 2 (i.e., this wafer may routed around this and associated process steps); wafer sequence may be terminated, rerouted, or restarted based upon the measurement results of step 2, 6, 8, 12, and 14; measurement/optimizer steps may be performed only after process/hardware changes; measurements before and after annealing (e.g., sheet resistance) may be used to determine effectiveness of annealing process; metal deposition steps 4 and 10 may be deposition of same metals or different metals—they could deposit the same metal using different baths; one or more metal deposition steps could be used, which deposit one or more different metals; the optimization steps may adjust currents to generate a flat thickness profile or one with a specified shape; the optimization steps may adjust current to generate a desired current density profile for future filling; the wafer may be returned to a deposition chamber for additional metal deposition if the film thickness is insufficient, based upon metrology results.

Table 14 below shows an additional sample process:

TABLE 14

SAMPLE WAFER PROCESSING PROCESS
EMPLOYING OPTIMIZER

Step  Tool/Process

1. Deposit metal seed layer using PVD tool
2. Measure seed layer film thickness using metrology station
3. Apply optimizer in ECD chamber using measurements from step 2 (feedforward) and measurement results from previous ECD wafer on step 7 (feedback)
4. Deposit final metal layer in ECD chamber
5. Anneal wafer in anneal chamber
6. Clean and bevel etch wafer in Capsule chamber
7. Measure wafer thickness using Metrology Station Table 15 below shows an additional sample process:

TABLE 15

SAMPLE WAFER PROCESSING PROCESS
EMPLOYING OPTIMIZER

Step  Tool/Process

1. Deposit metal seed layer using PVD tool
2. Measure seed layer film thickness using metrology station
3. Apply optimizer in ECD chamber using measurements from step 2 (feedforward) and measurement results from previous ECD wafer on step 6 (feedback)
4. Deposit final metal layer in ECD chamber
6. Clean and bevel etch wafer in Capsule chamber
7. Measure wafer thickness using Metrology Station Table 16 below shows an additional sample process:

TABLE 16

SAMPLE WAFER PROCESSING PROCESS
EMPLOYING OPTIMIZER

Step  Tool/Process

1. Deposit metal seed layer using PVD tool
2. Measure seed layer film thickness using metrology station
3. Apply optimizer in ECD chamber using measurements from step 2 (feedforward) and measurement results from previous SLE wafer on step 6 (feedback)

TABLE 16-continued

SAMPLE WAFER PROCESSING PROCESS
EMPLOYING OPTIMIZER

Step   Tool/Process

4. Deposit metal layer in SLE chamber
6. Clean and bevel etch wafer in Capsule chamber
7. Measure wafer thickness using Metrology Station As an additional sample process, the thickness uniformity of a wafer with a PVD-deposited seed layer is measured on a dedicated metrology tool, after which the wafer is brought to the plating tool and placed in an SLE process chamber. Using the measurements from the dedicated metrology tool, the optimizer is used to select an SLE recipe that will augment the PVD-deposited seed layer to yield a seed layer with improved thickness uniformity, and the SLE process is performed on the wafer. After the wafer has been cleaned and dried in one of the plating tool capsule chambers, the wafer is transferred to a plating chamber where the optimizer is then used to select a plating recipe that will yield a uniform bulk film, at the desired thickness, based on the nominal seed layer thickness. After the bulk film plating process has completed, the wafer is transferred to a capsule cleaning chamber, whereupon it is removed from the tool.

As an additional sample process, a wafer is brought to the plating tool and placed in the on-board metrology station to determine the thickness profile of the CVD-deposited seed layer. The wafer is then transferred to a plating chamber. Using the seed layer measurements from the on-board metrology station, the optimizer is used to select a plating recipe that will yield a convex (center-thick) bulk film, at the desired nominal thickness. After the plating process has completed, the wafer is transferred to a capsule cleaning chamber, whereupon it is removed from the tool.

As an additional sample process, a wafer comes to an electroplating tool with a seed layer, applied using physical vapor deposition, that is non-uniform. A metrology station is used to measure the non-uniformity, and the optimizer operates the multiple-electrode reactor to correct the measured non-uniformity. Seed layer repair is then performed using an electroless ion plating process to produce a final, more uniform, seed layer. The optimizer then operates to deposit bulk metal onto the repaired seed layer.

As an additional sample process, a semiconductor fabricator has two physical vapor deposition tools ("PVD tools"), each of which has its own particular characteristics. A wafer processed by the first PVD tool and having a seed layer non-uniformity is directed to a first multiple-electrode reactor for seed layer repair. A wafer from the second PVD tool that has a different seed layer non-uniformity is directed to a second multiple-electrode reactor for seed layer repair. Bulk metal is then deposited onto the repaired seed layers of the two wafers in a third CFD reactor under the control of the optimizer.

Additional applications of the optimizer include:

Single plating example: The production environment can involve many recipes on a tool because each wafer may require multiple processing steps. For example, there may be 5–7 metal interconnect layers and each of the layers have different process parameters. Furthermore, a tool may be processing several different products. The advantage having a multiple anode reactor on the tool (like the CFD reactor) is that unique anode currents and optimal performance may be specified for all the different recipes on all the different chambers on the tool.

A basic application of the optimizer is to aid in the initial dial-in process for all of the recipes that are going to be run on a tool in production. In this mode, recipes will be written and tested experimentally prior to production, using the optimizer as an aid to obtained uniformity specifications. In this picture of workpiece production, the optimizer is used during the set-up phase only, saving the process engineer much time in setting up the tool and each of the recipes. If seed-layers coming into the tool are identical and stable, the above picture is sufficient.

If the seed-layers are not consistent, then off-tool metrology or integrated metrology can be used to monitor the changes in the seed-layers and the optimizer can be used to modify the anode currents in the recipe to compensate for these variations.

ECD seed followed by bulk ECD: In the case of sequential plating steps, metrology before and after each plating step allows for recipe current adjustments with the optimizer to each process. In the case of ECD seed, the initial PVD or CVD layer of metal can be measured and adjusted for using the feed-forward feature of the optimizer. Note: In this process the resistance of the barrier layer under the seed layer can also have a large influence on the plating uniformity, if the resistance of this layer can be measured, then the optimizer can be used to compensate for this effect (it may take more than one iteration of the optimizer).

Dial-In Uniform Current Density Recipes: Using the optimizer and metrology the optimizer can be used to help dial in recipes that insure uniform current density during the feature filling step.

Table Look-Up: The optimal currents to plate uniformly on different thickness seed-layers (assuming the seed layers are substantially uniform) can be determined in advance, using the optimizer to find these currents. Then the currents can be pulled from a table, when the resistivity of the seed layer is measured. This may be quite useful for platen plating (solder) where the seed layer resistance is constant for the whole plating run.

The optimizer may be used to control process parameters for a wide variety of types and designs of microelectronic workpiece processing devices. Various illustrative examples of such devices are discussed below.

FIG. C8 illustrates the basic construction of one embodiment of interior processing container C39, including a plurality of individually controlled electrodes. It also illustrates the corresponding flow velocity contour pattern resulting from the processing container construction. As shown, the processing container C39 generally comprises a main fluid flow chamber C505, an antechamber C510, a fluid inlet C515, a plenum C520, a flow diffuser C525 separating the plenum C520 from the antechamber C510, and a nozzle/slot assembly C530 separating the plenum C520 from the main chamber C505. These components cooperate to provide a flow of electrochemical processing fluid (here, of the electroplating solution) at the microelectronic workpiece C25 that has a substantially radially independent normal component. In the illustrated embodiment, the impinging flow is centered about central axis C537 and possesses a nearly uniform component normal to the surface of the microelectronic workpiece C25. This results in a substantially uniform mass flux to the microelectronic workpiece surface that, in turn, enables substantially uniform processing thereof.

Notably, this desirable flow characteristic is achieved without the use of a diffuser disposed between the electrodes/anode(s) and surface of the microelectronic workpiece that is to be electrochemically processed (e.g., electroplated). As such, the anodes used in the electroplating reactor can be placed in close proximity to the surface of the microelectronic workpiece to thereby provide substantial control over local electrical field/current density parameters used in the electroplating process. This substantial degree of control over the electrical parameters allows the reactor to be readily adapted to meet a wide range of electroplating requirements (e.g., seed layer thickness, seed layer type, electroplated material, etc.) without a corresponding change in the reactor hardware. Rather, adaptations can be implemented by altering the electrical parameters used in the electroplating process through, for example, software control of the power provided to the anodes.

The reactor design thus effectively de-couples the fluid flow from adjustments to the electric field. An advantage of this approach is that a chamber with nearly ideal flow for electroplating and other electrochemical processes (i.e., a design which provides a substantially uniform diffusion layer across the microelectronic workpiece) may be designed that will not be degraded when electroplating or other electrochemical process applications require significant changes to the electric field.

The processing container C39, as noted above, is provided with a plurality of individually controlled electrodes (referenced hereinafter, without limitation, as "anodes"). In the illustrated embodiment, a principal anode C580 is disposed in the lower portion of the main chamber C505. If the peripheral edges of the surface of the microelectronic workpiece C25 extends radially beyond the extent of contoured sidewall C560, then the peripheral edges are electrically shielded from principal anode C580 and reduced plating will take place in those regions. As such, a plurality of annular anodes C585 are disposed in a generally concentric manner on slanted sidewall C565 to provide a flow of electroplating current to the peripheral regions.

Anodes C580 and C585 of the illustrated embodiment are disposed at different distances from the surface of the microelectronic workpiece C25 that is being electroplated. More particularly, the anodes C580 and C585 are concentrically disposed in different horizontal planes. Such a concentric arrangement combined with the vertical differences allow the anodes C580 and C585 to be effectively placed close to the surface of the microelectronic workpiece C25 without generating a corresponding adverse impact on the flow pattern as tailored by nozzles C535.

The effect and degree of control that an anode has on the electroplating of microelectronic workpiece C25 is dependent on the effective distance between that anode and the surface of the microelectronic workpiece that is being electroplated. More particularly, all other things being equal, an anode that is effectively spaced a given distance from the surface of microelectronic workpiece C25 will have an impact on a larger area of the microelectronic workpiece surface than an anode that is effectively spaced from the surface of microelectronic workpiece C25 by a lesser amount. Anodes that are effectively spaced at a comparatively large distance from the surface of microelectronic workpiece C25 thus have less localized control over the electroplating process than do those that are spaced at a smaller distance. It is therefore desirable to effectively locate the anodes in close proximity to the surface of microelectronic workpiece C25 since this allows more versatile, localized control of the electroplating process. Advantage can be taken of this increased control to achieve greater uniformity of the resulting electroplated film. Such control is exercised, for example, by placing the electroplating power provided to the individual anodes under the control of a programmable controller or the like. Adjustments to the electroplating power can thus be made subject to software control based on manual or automated inputs.

In the illustrated embodiment, anode C580 is effectively "seen" by microelectronic workpiece C25 as being positioned a distance B1 from the surface of microelectronic workpiece C25. This is because the relationship between the anode C580 and sidewall C560 creates a virtual anode having an effective area defined by the innermost dimensions of sidewall C560. In contrast, anodes C585 are at effective distances B2, B3, and B4 proceeding from the innermost anode to the outermost anode, with the outermost anode being closest to the microelectronic workpiece C25. All of the anodes C585 in this embodiment are in close proximity (i.e., about 1 in. or less, with the outermost anode being spaced from the microelectronic workpiece by about 10 mm) to the surface of the microelectronic workpiece C25 that is being electroplated. Since anodes C585 are in close proximity to the surface of the microelectronic workpiece 25, they can be used to provide effective, localized control over the radial film growth at peripheral portions of the microelectronic workpiece. Such localized control is particularly desirable at the peripheral portions of the microelectronic workpiece since it is those portions that are more likely to have a high uniformity gradient (most often due to the fact that electrical contact is made with the seed layer of the microelectronic workpiece at the outermost peripheral regions resulting in higher plating rates at the periphery of the microelectronic workpiece compared to the central portions thereof).

The foregoing anode arrangement is particularly well-suited for plating microelectronic workpieces having highly resistive seed layers as well as for plating highly resistive materials on microelectronic workpieces. Generally stated, the more resistive the seed layer or material that is to be deposited, the more the magnitude of the current at the central anode C580 (or central anodes) should be increased to yield a uniform film.

FIGS. C9–C12 illustrate a further embodiment of an improved reactor chamber. The embodiment illustrated in these figures retains the advantageous electric field and flow characteristics of the foregoing reactor construction while concurrently being useful for situations in which anode/electrode isolation is desirable. Such situations include, but are not limited to, the following:

instances in which the electrochemical electroplating solution must pass over an electrode, such as an anode, at a high flow rate to be optimally effective;

instances in which one or more gases evolving from the electrochemical reactions at the anode surface must be removed in order to insure uniform electrochemical processing; and instances in which consumable electrodes are used.

With reference to FIGS. C9 and C10, the reactor includes an electrochemical electroplating solution flow path into the innermost portion of the processing chamber that is very similar to the flow path of the embodiment illustrated in FIG. C4. As such, components that have similar functions are not further identified here for the sake of simplicity. Rather, only those portions of the reactor that significantly differ from the foregoing embodiment are identified and described below.

One significant distinction between the embodiments exists in connection with the anode electrodes and the appertaining structures and fluid flow paths. More particularly, the processing container C39 includes a plurality of ring-shaped anodes C1015, C1020, C1025 and C1030 that are concentrically disposed with respect to one another in respective anode chamber housings C1017, C1022, C1027 and C1032. As shown, each anode C1015, C1020, C1025 and C1030 has a vertically oriented surface area that is greater than the surface area of the corresponding anodes shown in the foregoing embodiments. Four such anodes are employed in the disclosed embodiment, but a larger or smaller number of anodes may be used depending upon the electrochemical processing parameters and results that are desired. Each anode C1015, C1020, C1025 and C1030 is supported in the respective anode chamber housing C1017, C1022, C1027 and C1032 by at least one corresponding support/conductive member C1050 that extends through the bottom of the processing base C37 and terminates at an electrical connector C1055 for connection to an electrical power source.

In accordance with the disclosed embodiment, fluid flow to and through the three outer most chamber housings C1022, C1027 and C1032 is provided from an inlet C1060 that is separate from inlet C515, which supplies the fluid flow through an innermost chamber housing C1017. As shown, fluid inlet C515 provides electroplating solution to a manifold C1065 having a plurality of slots C1070 disposed in its exterior wall. Slots C1070 are in fluid communication with a plenum C1075 that includes a plurality of openings C1080 through which the electroplating solution respectively enters the three anode chamber housings C1022, C1027 and C1032. Fluid entering the anode chamber housings C1017, C1022, C1027 and C1032 flows over at least one vertical surface and, preferably, both vertical surfaces of the respective anode C1015, C1020, C1025 and C1030.

Each anode chamber housing C1017, C1022, C1027 and C1032 includes an upper outlet region that opens to a respective cup C1085. Cups C1085, as illustrated, are disposed in the reactor chamber so that they are concentric with one another. Each cup includes an upper rim C1090 that terminates at a predetermined height with respect to the other rims, with the rim of each cup terminating at a height that is vertically below the immediately adjacent outer concentric cup. Each of the three innermost cups further includes a substantially vertical exterior wall C1095 and a slanted interior wall C1200. This wall construction creates a flow region C1205 in the interstitial region between concentrically disposed cups (excepting the innermost cup that has a contoured interior wall that defines the fluid flow region C1205 and than the outer most flow region C1205 associated with the outer most anode) that increases in area as the fluid flows upward toward the surface of the microelectronic workpiece under process. The increase in area effectively reduces the fluid flow velocity along the vertical fluid flow path, with the velocity being greater at a lower portion of the flow region C1205 when compared to the velocity of the fluid flow at the upper portion of the particular flow region.

The interstitial region between the rims of concentrically adjacent cups effectively defines the size and shape of each of a plurality of virtual anodes, each virtual anode being respectively associated with a corresponding anode disposed in its respective anode chamber housing. The size and shape of each virtual anode that is seen by the microelectronic workpiece under process is generally independent of the size and shape of the corresponding actual anode. As such, consumable anodes that vary in size and shape over time as they are used can be employed for anodes C1015, C1020, C1025 and C1030 without a corresponding change in the overall anode configuration is seen by the microelectronic workpiece under process. Further, given the deceleration experienced by the fluid flow as it proceeds vertically through flow regions C1205, a high fluid flow velocity may be introduced across the vertical surfaces of the anodes C1015, C1020, C1025 and C1030 in the anode chamber housings C1022, C1027 and C1032 while concurrently producing a very uniform fluid flow pattern radially across the surface of the microelectronic workpiece under process. Such a high fluid flow velocity across the vertical surfaces of the anodes C1015, C1020, C1025 and C1030, as noted above, is desirable when using certain electrochemical electroplating solutions, such as electroplating fluids available from Atotech. Further, such high fluid flow velocities may be used to assist in removing some of the gas bubbles that form at the surface of the anodes, particularly inert anodes. To this end, each of the anode chamber housings C1017, C1022, C1027 and C1032 may be provided with one or more gas outlets (not illustrated) at the upper portion thereof to vent such gases.

Of further note, unlike the foregoing embodiment, element C1210 is a securement that is formed from a dielectric material. The securement C1210 is used to clamp a plurality of the structures forming reactor base C35 together. Although securement 1210 may be formed from a conductive material so that it may function as an anode, the innermost anode seen by the microelectronic workpiece under process is preferably a virtual anode corresponding to the interior most anode C1015.

FIGS. C11 and C12 illustrate computer simulations of fluid flow velocity contours of a reactor constructed in accordance with the embodiment shown in FIGS. C13 through C15. In this embodiment, all of the anodes of the reactor base may be isolated from a flow of fluid through the anode chamber housings. To this end, FIG. C11 illustrates the fluid flow velocity contours that occur when a flow of electroplating solution is provided through each of the anode chamber housings, while FIG. C12 illustrates the fluid flow velocity contours that occur when there is no flow of electroplating solution provided through the anode chamber housings past the anodes. This latter condition can be accomplished in the reactor of by turning off the flow the flow from the second fluid flow inlet (described below) and may likewise be accomplished in the reactor of FIGS. C9 and 10 by turning of the fluid flow through inlet C1060. Such a condition may be desirable in those instances in which a flow of electroplating solution across the surface of the anodes is found to significantly reduce the organic additive concentration of the solution.

FIG. C13 illustrates a variation of the reactor embodiment shown in FIG. C10. For the sake of simplicity, only the elements pertinent to the following discussion are provided with reference numerals.

This further embodiment employs a different structure for providing fluid flow to the anodes C1015, C1020, C1025 and C1030. More particularly, the further embodiment employs an inlet member C2010 that serves as an inlet for the supply and distribution of the processing fluid to the anode chamber housings C1017, 1022, 1027 and 1032.

With reference to FIGS. C13 and C14, the inlet member C2010 includes a hollow stem C2015 that may be used to provide a flow of electroplating fluid. The hollow stem C2015 terminates at a stepped hub C2020. Stepped hub C2020 includes a plurality of steps C2025 that each include a groove dimensioned to receive and support a corresponding wall of the anode chamber housings. Processing fluid is directed into the anode chamber housings through a plurality of channels C2030 that proceed from a manifold area into the respective anode chamber housing.

This latter inlet arrangement assists in further electrically isolating anodes C1015, C1020, C1025 and C1030 from one another. Such electrical isolation occurs due to the increased resistance of the electrical flow path between the anodes. The increased resistance is a direct result of the increased length of the fluid flow paths that exist between the anode chamber housings.

The manner in which the electroplating power is supplied to the microelectronic workpiece at the peripheral edge thereof affects the overall film quality of the deposited metal. Some of the more desirable characteristics of a contact assembly used to provide such electroplating power include, for example, the following:

uniform distribution of electroplating power about the periphery of the microelectronic workpiece to maximize the uniformity of the deposited film;

consistent contact characteristics to insure wafer-to-wafer uniformity;

minimal intrusion of the contact assembly on the microelectronic workpiece periphery to maximize the available area for device production; and minimal plating on the barrier layer about the microelectronic workpiece periphery to inhibit peeling and/or flaking.

To meet one or more of the foregoing characteristics, reactor assembly C20 preferably employs a contact assembly that includes the contacts C85 shown in FIG. C3. The contact assembly may be designed to provide either a continuous electrical contact or a high number of discrete electrical contacts with the microelectronic workpiece C25. By providing a more continuous contact with the outer peripheral edges of the microelectronic workpiece C25, in this case around the outer circumference of the semiconductor wafer, a uniform current is supplied to the microelectronic workpiece C25 that promotes uniform current densities. The uniform current densities enhance uniformity in the depth of the deposited material.

The contact assembly may include contact members that provide minimal intrusion about the microelectronic workpiece periphery while concurrently providing consistent contact with the seed layer. Contact with the seed layer is enhanced by using a contact member structure that provides a wiping action against the seed layer as the microelectronic workpiece is brought into engagement with the contact assembly. This wiping action assists in removing any oxides at the seed layer surface thereby enhancing the electrical contact between the contact structure and the seed layer. As a result, uniformity of the current densities about the microelectronic workpiece periphery is increased and the resulting film is more uniform. Further, such consistency in the electrical contact facilitates greater consistency in the electroplating process from wafer-to-wafer thereby increasing wafer-to-wafer uniformity.

The contact assembly may also include one or more structures that provide a barrier, individually or in cooperation with other structures, that separates the contact/contacts C85, the peripheral edge portions and backside of the microelectronic workpiece C25 from the plating solution. This prevents the plating of metal onto the individual contacts and, further, assists in preventing any exposed portions of the barrier layer near the edge of the microelectronic workpiece C25 from being exposed to the electroplating environment. As a result, plating of the barrier layer and the appertaining potential for contamination due to flaking of any loosely adhered electroplated material is substantially limited. Exemplary contact assemblies suitable for use in the present system are illustrated in U.S. Ser. No. 09/113,723, while Jul. 10, 1998, entitled "PLATING APPARATUS WITH PLATING CONTACT WITH PERIPHERAL SEAL MEMBER", which is hereby incorporated by reference.

One or more of the foregoing reactor assembly's may be readily integrated in a processing tool that is capable of executing a plurality of processes on a workpiece, such as a semiconductor microelectronic workpiece. One such processing tool is the LT-210™ electroplating apparatus available from Semitool, Inc., of Kalispell, Mont. FIGS. C15 and C16 illustrate such integration. Alternatively, the tool can have a configuration generally similar to that described above with reference to FIGS. 2–4.

The system of FIG. C15 includes a plurality of processing stations C1610. Preferably, these processing stations include one or more rinsing/drying stations and one or more electroplating stations (including one or more electroplating reactors such as the one above), although further immersion-chemical processing stations constructed in accordance with the present invention may also be employed. The system can also include a thermal processing station, such as at C1615, that includes at least one thermal reactor that is adapted for rapid thermal processing (RTP), and can further include a metrology station, as discussed above.

The workpieces are transferred between the processing stations C1610 and the RTP station C1615 using one or more robotic transfer mechanisms C1620 that are disposed for linear movement along a central track C1625. One or more of the stations C1610 may also incorporate structures that are adapted for executing an in-situ rinse. Preferably, all of the processing stations as well as the robotic transfer mechanisms are disposed in a cabinet that is provided with filtered air at a positive pressure to thereby limit airborne contaminants that may reduce the effectiveness of the microelectronic workpiece processing.

FIG. C16 illustrates a further embodiment of a processing tool in which an RTP station C1635, located in portion C1630, that includes at least one thermal reactor, may be integrated in a tool set. Unlike the embodiment of FIG. C15, at least one thermal reactor is serviced by a dedicated robotic mechanism C1640. The dedicated robotic mechanism C1640 accepts workpieces that are transferred to it by the robotic transfer mechanisms C1620. Transfer may take place through an intermediate staging door/area C1645. As such, it becomes possible to hygienically separate the RTP portion C1630 of the processing tool from other portions of the tool. Additionally, using such a construction, the illustrated annealing station may be implemented as a separate module that is attached to upgrade an existing tool set. It will be recognized that other types of processing stations may be located in portion C1630 in addition to or instead of RTP station C1635.

It is envisioned that the optimizer may be used in one or more stages of widely-varying processes for processing semiconductor workpieces. It is further envisioned that the optimizer may operate completely separately from the processing tools performing such processes, with only some mechanism for the optimizer to pass control parameters to such processing tools. Indeed, the optimizer and processing tools may be operated under the control and/or ownership of different parties, and/or in different physical locations.

Numerous modifications may be made to the described optimizer without departing from the basic teachings thereof. For example, although the present invention is described in the context of electrochemical processing of the microelectronic workpiece, the teachings herein can also be extended to other types of microelectronic workpiece processing, including various kinds of material deposition processes. For example, the optimizer may be used to control electrophoretic deposition of material, such as posi tive or negative electrophoretic photoresists or electrophoretic paints; chemical or physical vapor deposition; etc. In effect, the teachings herein can be extended to other microelectronic workpiece processing systems that have individually controlled processing elements that are responsive to control parameters and that have interdependent effects on a physical characteristic of the microelectronic workpiece that is processed using the elements. Such systems may employ sensitivity tables or matrices as set forth herein and use them in calculations with one or more input parameters sets to arrive at control parameter values that accurately result in the targeted physical characteristic of the microelectronic workpiece. The optimizer can also be integrated with or operatively coupled to the metrology unit to directly influence subsequent electrodeposition processes based on metrology reesults, in the manner described above.

2. Electrochemical Processing Station

Electrochemical processing stations in accordance with embodiments of the invention is described below with reference to FIGS. D1–D3. Further details of embodiments of the electrochemical processing station are described in the following references, each of which is incorporated herein in its entirety by reference:

(a) U.S. patent application Ser. No. 09/804,697, entitled "System for Electrochemically Processing a Workpiece," filed on Mar. 12, 2001;

(b) U.S. Provisional Application No. 60/129,055, filed on Apr. 13, 1999;

(c) U.S. patent application Ser. No. 09/875,300, entitled "Transfer Devices for Handling Microelectronic Workpieces Within an Environment of a Processing Machine and Methods of Manufacturing and Using Such Devices in the Processing of Microelectronic Workpieces," filed on Jun. 5, 2001;

(d) U.S. patent application Ser. No. 09/875,428, entitled "Integrated Tools With Transfer Devices for Handling Microelectronic Workpieces," filed on Jun. 5, 2001;

(e) U.S. patent application Ser. No. 09/875,304, entitled "Distributed Power Supplies for Microelectronic Workpiece Processing Tools," filed on Jun. 5, 2001;

(f) U.S. patent application Ser. No. 09/875,365, entitled "Adaptable Electrochemical Processing Chamber," filed on Jun. 5, 2001;

(g) U.S. patent application Ser. No. 09/875,424, entitled "Lift and Rotate Assembly For Use in a Workpiece Processing Station and a Method of Attaching the Same," filed on Jun. 5, 2001;

(h) Three U.S. Patent Applications entitled "Tuning Electrodes Used in a Reactor for Electrochemically Processing a Microelectronic Workpiece:" Ser. No. 09/849,505 filed on May 4, 2001 and Ser. Nos. 09/866,391 and 09/866,463 filed on May 24, 2001;

(i) U.S. patent application Ser. No. 09/872,151, entitled "Apparatus and Methods for Electrochemical Processing of Microelectronic Workpieces," filed May 31, 2001.

a. Selected Embodiments of Integrated Tools with Electrochemical Processing Stations FIG. D1 is an isometric view of a processing machine D100 having an electrochemical processing station D120 in accordance with an embodiment of the invention. A portion of the processing machine D100 is shown in a cut-away view to illustrate selected internal components. In one aspect of this embodiment, the processing machine D100 can include a cabinet D102 having an interior region D104 defining an interior enclosure that is at least partially isolated from an exterior region D105. The cabinet D102 can also include a plurality of apertures D106 (only one shown in FIG. D1) through which microelectronic workpieces D101 can ingress and egress between the interior region D104 and a load/unload station D110.

The load/unload station D110 can have two container supports D112 that are each housed in a protective shroud D113. The container supports D112 are configured to position workpiece containers D114 relative to the apertures D106 in the cabinet D102. The workpiece containers D114 can each house a plurality of microelectronic workpieces D101 in a "mini" clean environment for carrying a plurality of workpieces through other environments that are not at clean room standards. Each of the workpiece containers D114 is accessible from the interior region D104 of the cabinet D102 through the apertures D106.

The processing machine D100 can also include a plurality of electrochemical processing stations D120 and a transfer device D130 in the interior region D104 of the cabinet D102. The processing machine D100, for example, can be a plating tool that also includes clean/etch capsules D122, electroless plating stations, stripping units, seedlayer enhancement units, annealing stations, non-compliance stations, and/or metrology stations.

The transfer device D130 includes a linear track D132 extending in a lengthwise direction of the interior region D104 between the processing stations. The transfer device D130 can further include a robot unit D134 carried by the track D132. In the particular embodiment shown in FIG. D1, a first set of processing stations is arranged along a first row $R_1$—$R_1$ and a second set of processing stations is arranged along a second row $R_2$—$R_2$. The linear track D132 extends between the first and second rows of processing stations, and the robot unit D134 can access any of the processing stations along the track D132.

FIG. D2 illustrates an embodiment of an electrochemical-processing chamber D120 having a head assembly D150 and a processing chamber D200. The head assembly D150 includes a spin motor D152, a rotor D154 coupled to the spin motor D152, and a contact assembly D160 carried by the rotor D154. The rotor D154 can have a backing plate D155 and a seal D156. The backing plate D155 can move transverse to a workpiece D101 (arrow T) between a first position in which the backing plate D155 contacts a backside of the workpiece D101 (shown in solid lines in FIG. D2) and a second position in which it is spaced apart from the backside of the workpiece D101 (shown in broken lines in FIG. D2). The contact assembly D160 can have a support member D162, a plurality of contacts D164 carried by the support member D162, and a plurality of shafts D166 extending between the support member D162 and the rotor D154. The contacts D164 can be ring-type spring contacts or other types of contacts that are configured to engage a portion of the seed-layer on the workpiece D101. Commercially available head assemblies D150 and contact assemblies D160 can be used in the electroprocessing chamber D120. Particular suitable head assemblies D150 and contact assemblies D160 are disclosed in U.S. Pat. Nos. 6,228,232 and 6,080,691; and U.S. application Ser. Nos. 09/385,784; 09/386,803; 09/386,610; 09/386,197; 09/501,002; 09/733,608; and 09/804,696, all of which are herein incorporated by reference.

The processing chamber D200 includes an outer housing D202 (shown schematically in FIG. D2) and a reaction vessel D204 (also shown schematically in FIG. D2) in the housing D202. The reaction vessel D204 carries at least one electrode (not shown in FIG. D2) and directs a flow of electroprocessing solution to the workpiece D101. The electroprocessing solution, for example, can flow over a weir (arrow F) and into the external housing D202, which captures the electroprocessing solution and sends it back to a tank. An embodiment of a reaction vessel D204 is shown and described in detail with reference to FIG. D3.

In operation, the head assembly D150 holds the workpiece at a workpiece-processing site of the reaction vessel D204 so that at least a plating surface of the workpiece engages the electroprocessing solution. An electrical field is established in the solution by applying an electrical potential between the plating surface of the workpiece via the contact assembly D160 and one or more electrodes in the reaction vessel D204. For example, the contact assembly D160 can be biased with a negative potential with respect to the electrode(s) in the reaction vessel D204 to plate materials onto the workpiece. On the other hand the contact assembly D160 can be biased with a positive potential with respect to the electrode(s) in the reaction vessel D204 to (a) de-plate or electropolish plated material from the workpiece or (b) deposit other materials (e.g., electrophoretic resist). In general, therefore, materials can be deposited on or removed from the workpiece with the workpiece acting as a cathode or an anode depending upon the particular type of material used in the electrochemical process.

b. Embodiment of a Reaction Vessel for Use in Electrochemical Processing Chambers FIG. D3 illustrates an embodiment of a reaction vessel D204 for use in the processing chamber D200. As explained above, the housing D202 carries the reaction vessel D204. The housing D202 can have a drain D210 for returning the processing fluid that flows out of the reaction vessel D204 to a storage tank, and a plurality of openings for receiving inlets and electrical fittings. The reaction vessel D204 can include an outer container D220 having an outer wall D222 spaced radially inwardly of the housing D202. The outer container D220 can also have a spiral spacer D224 between the outer wall D222 and the housing D202 to provide a spiral ramp (i.e., a helix) on which the processing fluid can flow downward to the bottom of the housing D202. The spiral ramp reduces the turbulence of the return fluid to inhibit entrainment of gasses in the return fluid.

The particular embodiment of the reaction vessel D204 shown in FIG. D3 can include a distributor D300 for receiving a primary fluid flow $F_p$ and a secondary fluid flow $F_2$, a primary flow guide D400 coupled to the distributor D300 to condition the primary fluid flow $F_p$, and a field shaping unit D500 coupled to the distributor D300 to contain the secondary flow $F_2$ in a manner that shapes the electrical field in the reaction vessel D204. The reaction vessel D204 can also include at least one electrode D600 in a compartment of the field shaping unit D500 and at least one filter or other type of interface member D700 carried by the field shaping unit D500 downstream from the electrode. The primary flow guide D400 can condition the primary flow $F_p$ by projecting this flow radially inwardly relative to a common axis A—A, and a portion of the field shaping unit D500 directs the conditioned primary flow $F_p$ toward the workpiece. In several embodiments, the primary flow passing through the primary flow guide D400 and the center of the field shaping unit D500 controls the mass transfer of processing solution at the surface of the workpiece. The field shaping unit D500 also defines the shape the electric field, and it can influence the mass transfer at the surface of the workpiece if the secondary flow passes through the field shaping unit. The reaction vessel D204 can also have other configurations of components to guide the primary flow $F_p$ and the secondary flow $F_2$ through the processing chamber D200. The reaction vessel D204, for example, may not have a distributor in the processing chamber, but rather separate fluid lines with individual flows can be coupled to the vessel D204 to provide a desired distribution of fluid through the primary flow guide D400 and the field shaping unit. For example, the reaction vessel D204 can have a first outlet in the outer container D220 for introducing the primary flow into the reaction vessel and a second outlet in the outer container for introducing the secondary flow into the reaction vessel D204. As shown in FIG. D3, the primary flow guide D400 receives the primary fluid flow $F_p$ via the first inlet D320 of the distributor D300.

In one embodiment, the primary flow guide D400 includes an inner baffle D410 and an outer baffle D420. The inner baffle can have a base D412 and a wall D414 projecting upward and radially outward from the base D412. The wall D414, for example, can have an inverted frusto-conical shape and a plurality of apertures D416. The apertures D416 can be holes, elongated slots or other types of openings. In the illustrated embodiment, the apertures D416 are annularly extending radial slots that slant upward relative to the common axis to project the primary flow radially inward and upward relative to the common axis along a plurality of diametrically opposed vectors. The inner baffle D410 can also includes a locking member D418 that couples the inner baffle D410 to the distributor D300.

The outer baffle D420 can include an outer wall D422 with a plurality of apertures D424. In this embodiment, the apertures D424 are elongated slots extending in a direction transverse to the apertures D416 of the inner baffle D410. The primary flow $F_p$ flows through (a) the first inlet D320, (b) the passageway D324 under the base D412 of the inner baffle D410, (c) the apertures D424 of the outer baffle D420, and then (d) the apertures D416 of the inner baffle D410. The combination of the outer baffle D420 and the inner baffle D410 conditions the direction of the flow at the exit of the apertures D416 in the inner baffle D410. The primary flow guide D400 can thus project the primary flow along diametrically opposed vectors that are inclined upward relative to the common axis to create a fluid flow that has a highly uniform velocity. In alternate embodiments, the apertures D416 do not slant upward relative to the common axis such that they can project the primary flow normal, or even downward, relative to the common axis.

FIG. D3 also illustrates an embodiment of the field shaping unit D500 that receives the primary fluid flow $F_p$ downstream from the primary flow guide D400. The field shaping unit D500 also contains the second fluid flow $F_2$ and shapes the electrical field within the reaction vessel D204. In this embodiment, the field shaping unit D500 has a compartment structure with a plurality of walls D510 (identified individually by reference numbers D510a–d) that define electrode compartments D520 (identified individually by reference numbers D520a–d). The walls D510 can be annular skirts or dividers, and they can be received in one of the annular grooves D314 in the distributor D300. In one embodiment, the walls D510 are not fixed to the distributor D300 so that the field shaping unit D500 can be quickly removed from the distributor D300. This allows easy access to the electrode compartments D520 and/or quick removal of the field shaping unit D500 to change the shape of the electric field.

The field shaping unit D500 can have at least one wall D510 outward from the primary flow guide D400 to prevent the primary flow $F_p$ from contacting an electrode. In the particular embodiment shown in FIG. D3, the field shaping unit D500 has a first electrode compartment D520a defined by a first wall D510a and a second wall D510b, a second electrode compartment D520b defined by the second wall D510b and a third wall D510c, a third electrode compartment D520c defined by the third wall D510c and a fourth wall D510d, and a fourth electrode compartment D520d defined by the fourth wall D510d and the outer wall D222 of the container D220. The walls D510a–d of this embodiment are concentric annular dividers that define annular electrode compartments D520a–d. Alternate embodiments of the field shaping unit can have walls with different configurations to create non-annular electrode compartments and/or each electrode compartment can be further divided into cells. The second-fourth walls D510b–d can also include holes D522 for allowing bubbles in the first-third electrode compartments D520a–c to "cascade" radially outward to the next outward electrode compartment D520. The bubbles can then exit the fourth electrode compartment D520d through an exit hole D525 through the outer wall D222. In an alternate embodiment, the bubbles can exit through an exit hole D524.

The electrode compartments D520 provide electrically discrete compartments to house an electrode assembly having at least one electrode and generally two or more electrodes D600 (identified individually by reference numbers D600a–d). The electrodes D600 can be annular members (e.g., annular rings or arcuate sections) that are configured to fit within annular electrode compartments, or they can have other shapes appropriate for the particular workpiece (e.g., rectilinear). In the illustrated embodiment, for example, the electrode assembly includes a first annular electrode D600a in the first electrode compartment D520a, a second annular electrode D600b in the second electrode compartment D520b, a third annular electrode D600c in the third electrode compartment D520c, and a fourth annular electrode D600d in the fourth electrode compartment D520d. As explained in U.S. application No. 60/206,661, Ser. Nos. 09/845,505, and 09/804,697, all of which are incorporated herein by reference, each of the electrodes 600a–d can be biased with the same or different potentials with respect to the workpiece to control the current density across the surface of the workpiece. In alternate embodiments, the electrodes 600 can be non-circular shapes or sections of other shapes.

Embodiments of the reaction vessel D204 that include a plurality of electrodes provide several benefits for plating or electropolishing. In plating applications, for example, the electrodes D600 can be biased with respect to the workpiece at different potentials to provide uniform plating on different workpieces even though the seed layers vary from one another or the bath(s) of electroprocessing solution have different conductivities and/or concentrations of constituents. Additionally, another the benefit of having a multiple electrode design is that plating can be controlled to achieve different final fill thicknesses of plated layers or different plating rates during a plating cycle or in different plating cycles. Other benefits of particular embodiments are that the current density can be controlled to (a) provide a uniform current density during feature filling and/or (b) achieve plating to specific film profiles across a workpiece (e.g., concave, convex, flat). Accordingly, the multiple electrode configurations in which the electrodes are separate from one another provide several benefits for controlling the electrochemical process to (a) compensate for deficiencies or differences in seed layers between workpieces, (b) adjust for variances in baths of electroprocessing solutions, and/or (c) achieve predetermined feature filling or film profiles.

The field shaping unit D500 can also include a virtual electrode unit coupled to the walls D510 of the compartment assembly for individually shaping the electrical fields produced by the electrodes D600. In the particular embodiment illustrated in FIG. D3, the virtual electrode unit includes first-fourth partitions D530a–D530d, respectively. The first partition D530a can have a first section D532a coupled to the second wall D510b, a skirt D534 depending downward above the first wall D510a, and a lip D536a projecting upwardly. The lip D536a has an interior surface D537 that directs the primary flow $F_p$ exiting from the primary flow guide D400. The second partition D530b can have a first section D532b coupled to the third wall D510c and a lip D536b projecting upward from the first section D532b, the third partition D530c can have a first section D532c coupled to the fourth wall D510d and a lip D536c projecting upward from the first section D532c, and the fourth partition D530d can have a first section D532d carried by the outer wall D222 of the container D220 and a lip D536d projecting upward from the first section D532d. The fourth partition D530d may not be connected to the outer wall D222 so that the field shaping unit D500 can be quickly removed from the vessel D204 by simply lifting the virtual electrode unit. The interface between the fourth partition D530d and the outer wall D222 is sealed by a seal D527 to inhibit both the fluid and the electrical current from leaking out of the fourth electrode compartment D520d. The seal D527 can be a lip seal. Additionally, each of the sections D532a–d can be lateral sections extending transverse to the common axis.

The individual partitions D530a–d can be machined from or molded into a single piece of dielectric material, or they can be individual dielectric members that are welded together. In alternate embodiments, the individual partitions D530a–d are not attached to each other and/or they can have different configurations. In the particular embodiment shown in FIG. D3, the partitions D530a–d are annular horizontal members, and each of the lips D536a–d are annular vertical members arranged concentrically about the common axis.

The walls D510 and the partitions D530a–d are generally dielectric materials that contain the second flow $F_2$ of the processing solution for shaping the electric fields generated by the electrodes D600a–d. The second flow $F_2$, for example, can pass (a) through each of the electrode compartments D520a–d, (b) between the individual partitions D530a–d, and then (c) upward through the annular openings between the lips D536a–d. In this embodiment, the secondary flow $F_2$ through the first electrode compartment D520a can join the primary flow $F_p$ in an antechamber just before the primary flow guide D400, and the secondary flow through the second-fourth electrode compartments D520b–d can join the primary flow $F_p$ beyond the top edges of the lips D536a–d. The flow of electroprocessing solution then flows over a shield weir attached at rim D538 and into the gap between the housing D202 and the outer wall D222 of the container D220 as disclosed in International Application No. PCT/US00/10120. The fluid in the secondary flow $F_2$ can be prevented from flowing out of the electrode compartments D520a–d to join the primary flow $F_p$ while still allowing electrical current to pass from the electrodes D600 to the primary flow. In this alternate embodiment, the secondary flow $F_2$ can exit the reaction vessel D204 through the holes D522 in the walls D510 and the hole D525 in the outer wall D222. In still additional embodiments in which the fluid of the secondary flow does not join the primary flow, a duct can be coupled to the exit hole D525 in the outer wall D222 so that a return flow of the secondary flow passing out of the field shaping unit D500 does not mix with the return flow of the primary flow passing down the spiral ramp outside of the outer wall D222.

The field shaping unit D500 can have other configurations that are different than the embodiment shown in FIG. D3. For example, the electrode compartment assembly can have only a single wall D510 defining a single electrode compartment D520, and the reaction vessel D204 can include only a single electrode D600. The field shaping unit of either embodiment still separates the primary and secondary flows so that the primary flow does not engage the electrode, and thus it shields the workpiece from the single electrode.

One advantage of shielding the workpiece from the electrodes D600a–d is that the electrodes can accordingly be much larger than they could be without the field shaping unit because the size of the electrodes does not have an effect on the electrical field presented to the workpiece. This is particularly useful in situations that use consumable electrodes because increasing the size of the electrodes prolongs the life of each electrode, which reduces downtime for servicing and replacing electrodes.

An embodiment of reaction vessel D204 shown in FIG. D3 can accordingly have a first conduit system for conditioning and directing the primary fluid flow $F_p$ to the workpiece, and a second conduit system for conditioning and directing the secondary fluid flow $F_2$. The first conduit system, for example, can include the inlet D320 of the distributor D300; the channel D324 between the base D412 of the primary flow guide D400 and the inclined cavity D322 of the distributor D300; a plenum between the wall D422 of the outer baffle D420 and the first wall D510a of the field shaping unit D500; the primary flow guide D400; and the interior surface D537 of the first lip D536a. The first conduit system conditions the direction of the primary fluid flow $F_p$ by passing it through the primary flow guide D400 and along the interior surface D537 so that the velocity of the primary flow $F_p$ normal to the workpiece is at least substantially uniform across the surface of the workpiece. The primary flow $F_p$ and the rotation of the workpiece can accordingly be controlled to dominate the mass transfer of electroprocessing medium at the workpiece.

The second conduit system, for example, can include the plenum D330 and the channels D340–D346 of the distributor D300, the walls D510 of the field shaping unit D500, and the partitions D530 of the field shaping unit D500. The secondary flow $F_2$ contacts the electrodes D600 to establish individual electrical fields in the field shaping unit D500 that are electrically coupled to the primary flow $F_p$. The field shaping unit D500, for example, separates the individual electrical fields created by the electrodes D600a–d to create "virtual electrodes" at the top of the openings defined by the lips D536a–d of the partitions. In this particular embodiment, the central opening inside the first lip D536a defines a first virtual electrode, the annular opening between the first and second lips D536a–b defines a second virtual electrode, the annular opening between the second and third lips D536b–c defines a third virtual electrode, and the annular opening between the third and fourth lips D536c–d defines a fourth virtual electrode. These are "virtual electrodes" because the field shaping unit D500 shapes the individual electrical fields of the actual electrodes D600a–d so that the effect of the electrodes D600a–d acts as if they are placed between the top edges of the lips D536a–d. This allows the actual electrodes D600a–d to be isolated from the primary fluid flow, which can provide several benefits as explained in more detail below.

An additional embodiment of the processing chamber D200 includes at least one interface member D700 (identified individually by reference numbers D700a–d) for further conditioning the secondary flow $F_2$ of electroprocessing solution. The interface members D700, for example, can be filters that capture particles in the secondary flow that were generated by the electrodes (i.e., anodes) or other sources of particles. The filter-type interface members D700 can also inhibit bubbles in the secondary flow $F_2$ from passing into the primary flow $F_p$ of electroprocessing solution. This effectively forces the bubbles to pass radially outwardly through the holes D522 in the walls D510 of the field shaping unit D500. In alternate embodiments, the interface members D700 can be ion-membranes that allow ions in the secondary flow $F_2$ to pass through the interface members D700. The ion-membrane interface members D700 can be selected to (a) allow the fluid of the electroprocessing solution and ions to pass through the interface member D700, or (b) allow only the desired ions to pass through the interface member such that the fluid itself is prevented from passing beyond the ion-membrane.

C. Seed Layer Enhancement Units

An example of an embodiment of the seed layer enhancement unit 232 is described in "Apparatus And Method For Electrolytically Depositing Copper On A Semiconductor Workpiece", PCT/US99/06306, filed Mar. 22, 1999 and herein incorporated by reference. The seed layer enhancement unit 232 can be embodied as an adjustable plating reactor as described in "Workpiece Processor Having Processing Chamber With Improved Processing Fluid Flow", PCT/US00/10210 filed Apr. 13, 2000 or "System For Electrochemically Processing A Workpiece", PCT/US00/10120 filed Apr. 13, 2000 herein incorporated by reference.

In accordance with a specific embodiment of the process, an ultra-thin adhesion layer, formed by physical vapor deposition (PVD), is enhanced by subjecting the semiconductor microelectronic workpiece to an electrochemical copper deposition process in which an alkaline bath having a complexing agent is employed. The copper complexing agent may be at least one complexing agent selected from a group consisting of EDTA, ED, and a polycarboxylic acid such as citric acid or salts thereof. The alkaline electrolytic copper bath is used to enhance the ultra-thin copper adhesion layer which has been deposited on a barrier layer using a deposition process such as PVD. The enhanced copper seed layer provides an excellent conformal copper coating that allows trenches and vias to be subsequently filled with a copper layer having good uniformity using electrochemical deposition techniques.

D. Electroless Unit

Another process for depositing a layer (such as copper) onto a microelectronic workpiece is known as "electroless" plating. Unlike an electroplating reactor, electroless plating does not conduct external electrical power to the surface of a microelectronic workpiece. A catalytic material is used to effect plating of the material on the microelectronic workpiece. Electroless plating reactors and corresponding processes are disclosed in WO 00/03072, published Jan. 20, 2000; and U.S. Pat. Nos. 5,500,315; 5,389,496; and 5,139,818, all incorporated herein by reference. Electroless plating can be used instead of electroplating, or can be used to perform seed layer enhancement. Accordingly, an electroless unit can be used in place of (or in addition to) the electroplating units 240 (FIGS. 2–4) to deposit material on a microelectronic workpiece.

E. Annealing Units

Embodiments of annealing units 244 that can be included in any of the apparatuses described above with reference to FIGS. 2–4 are described in International Patent Application No. PCT/US99/02504, titled "Method And Apparatus For Low Temperature Annealing Of Metallization MicroStructures In The Production Of A Microelectronic Device", filed Feb. 2, 1999; U.S. patent application Ser. No. 09/501,002, titled "Method And Apparatus For Processing A Microelectronic Workpiece Including An Apparatus And Method For Executing A Processing Step At An Elevated Temperature", filed Feb. 9, 2000; and U.S. patent application Ser. No. 09/733,608, titled "Method and Apparatus for Processing a Microelectronic Workpiece at an Elevated Temperature," filed Dec. 8, 2000; all herein incorporated by reference.

In one aspect of an embodiment of the invention, the annealing units 244 can include a thermal reactor that is adapted for rapid thermal processing (RTP). In another aspect of this embodiment, the microelectronic workpieces can be transferred between the processing stations and the annealing units 244 using the transport unit 256 that is disposed for linear movement along the central track. Details of further embodiments of annealing units are discussed below.

1. Annealing Chamber Example

FIGS. E1A and E1B illustrate a thermal reactor, shown generally at E500, that is constructed in accordance with one embodiment of the present invention. The thermal reactor E500 can include a first assembly E505, a second assembly E510, and one or more actuators E515 that are connected to provide relative movement between the first assembly E505 and second assembly E510. The configuration of the thermal reactor E500 shown here may be constructed to occupy a smaller amount of space than some conventional arrangements, which can improve the versatility of the reactor.

In one illustrated embodiment, the second assembly E510 can include one or more components E525 that are adapted to receive a single workpiece W from an automated workpiece transfer mechanism, such as a robot having an end effector that can grasp and release the workpiece W. To this end, the second assembly E510 may include a second assembly housing E550 having an upper rim from which one or more workpiece support members E525 extend. The workpiece support members E525 may take on a number of different forms. For example, a single workpiece support member E525 may be formed as a continuous ring having a lip or the like upon which the workpiece W is set by the workpiece transfer mechanism. Alternatively, a plurality of workpiece support members E525 may be in the form of discrete fingers disposed at various angular positions corresponding to the peripheral edge of the workpiece W, the angular positions being chosen to ensure access by the workpiece transfer mechanism. Other configurations for the workpiece support may likewise be suitable.

The second assembly E510 can have an interior region in which a thermal transfer unit E560 is disposed. The thermal transfer unit E560, in turn, can include a heater E565 and a heat sink E570, the operation of which will be set forth in further detail below. In certain aspects of this embodiment, the heater E565 preferably has a relatively low thermal mass so that its temperature response time is fast enough for thermally processing the workpiece W within a reasonably defined time period. In a further aspect of this embodiment, the heat sink E570 preferably has a relatively high thermal mass when compared to the heater E565 so that the heat sink E570 can cool the heater E565 (as will be set forth below) within a reasonably defined time period. In a still further aspect of this embodiment, the thermal capacity of the heat sink E570 can be greater than the sum of the thermal capacities of the heater E565 and the workpiece W. The heat sink E570 can also include a highly thermally conductive material, such as copper. As used herein, the term thermal mass refers to the product of material density and specific heat, and the term thermal capacity refers to the product of the thermal mass and the material volume.

As noted, the actuator E515 provides relative movement between the first assembly E505 and the second assembly E510. In the illustrated configuration, the actuator E515 is connected to move the first assembly E505 to and from engagement with the second assembly E510. More particularly, the actuator E515 can include a lower portion E530 that is in fixed positional alignment with the second assembly E510 since both are secured to a common deck E535. A transversely extending arm E540 can extend from an upper portion E545 of the actuator E515 and engages the first assembly E505. The actuator E515 can be configured to drive the transversely extending arm E540 and the first assembly E505 between a first position in which the workpiece W can be loaded onto the second assembly E510 by an automated workpiece transfer mechanism (not shown), and a second position in which the first assembly E505 and second assembly E510 are disposed proximate one another to form a space or chamber in which the workpiece W is processed.

In operation, the actuator E515 can initially drive the first assembly E505 to the first position, as illustrated in FIG. E1A. While in this position, the workpiece W can be placed onto the workpiece support members E525 of the second assembly E510 by an automated workpiece transfer mechanism, such as an articulated robot having an end effector carrying the workpiece W.

Once the workpiece W has been loaded onto the workpiece supports E525, the actuator E515 can drive the first assembly E505 toward the second assembly E510 to the second position illustrated in FIG. E1B. The workpiece support members E525 translate congruently with the first assembly E505, through contact with the lower surface of the first assembly E505 or through independent actuation. As illustrated in FIG. E1B, the workpiece W is deposited directly onto the surface of thermal transfer unit E560, where it will be thermally processed. Generally, the upper surface of workpiece W will be the device side of the workpiece while the non-device, lower surface of workpiece W will be placed in contact with the upper surface of thermal transfer unit E560. Alternatively, the orientation of the workpiece W can be inverted. To secure workpiece W to the upper surface of thermal transfer unit E560 during processing, thermal transfer unit E560 may include one or more apertures (described in detail below) that are connected to a vacuum source that draws the lower surface of workpiece W against the upper surface of thermal transfer unit E560.

In the position shown in FIG. E1B, the lower portion of a first assembly housing E520 may engage the upper portion of the second assembly housing E550 to form a thermal processing chamber E555, which may or may not be generally gas-tight. When the thermal reactor E500 is used, as here, for annealing the workpiece, the thermal processing chamber E555 can be continuously purged with an inert gas to minimize the level of any oxidizing agents that may form an undesirable oxide with the copper. To facilitate this purge, the first assembly E505 may be provided with one or more gas inlet ports E580 and one or more gas outlet ports E585. The gas inlet port E580 may open to a manifold in the housing E520 that, in turn, opens to a plurality of holes disposed through a lower surface of housing E520. Gas mixtures that are particularly suitable for reducing oxidizing agents in the processing chamber E555 include nitrogen or hydrogen forming gases (5% hydrogen/95% argon). The inert process environment inhibits surface film oxidation of the workpiece W at elevated temperatures, which can be enhanced by the oxygen-gettering effects of hydrogen forming gas. In processes other than annealing, ports E580 and E585 may be used to provide an inlet and outlet for other gases used to process workpiece W.

Other features may be incorporated into the thermal reactor E500 to make it particularly well-suited for single workpiece annealing. For example, the volume of the processing chamber E555 formed by the cooperation of the first assembly E505 and second assembly E510 may be relatively small, which makes it more efficient to purge and, thereby, reduces the consumption of high-purity, inert process gas. In addition, the first assembly E505 may be provided with one or more cooling fluid inlet ports E612 and one or more cooling fluid outlet ports E617 that provide a flow of cooling fluid to a lower surface of the housing E520 proximate to the workpiece W that, in turn, assists in cooling the workpiece W. Still further, the first assembly housing E520 may contain internal flow channels for re-circulating fluid, to maintain the lower surface of the housing E520 at a specified temperature.

It will be recognized that various fluid inlet and outlet ports may also be affixed to the second assembly E510. For example, fluid ports may be affixed to the second assembly E510 for use in connection with the heat sink E570. More particularly, a flow of cooling fluid may be provided directly to the heat sink E570 or to other structures of the second assembly for cooling of the heat sink E570. Furthermore, one or more exhaust ports may be disposed in the second assembly E510 for supplying and/or venting process gases. This arrangement in which the ports are affixed to the second assembly E510 has the benefit of reducing the amount of movement imparted to the ports and corresponding connectors, thereby increasing in the overall reliability of the corresponding connections.

FIGS. E1C and E1D illustrate a further embodiment of a thermal reactor constructed in accordance with the present invention. In many respects, this embodiment is somewhat similar to the embodiment set forth above in connection with FIGS. E1A and E1B. It differs, however, in that the workpiece supporting components are disposed on the first assembly E505 as opposed to the second assembly E510. Accordingly, an automated robot servicing the thermal reactor embodiment of these figures can be controlled to place and remove the workpiece to and from the first assembly E505 when the first and second assemblies are in the relative workpiece loading position.

In each of the foregoing reactor embodiments, once the workpiece W is secured to the thermal transfer unit E560 and the processing chamber E555 has been purged, the heater E565 of thermal transfer unit E560 can be directed to ramp up to the target process temperature. In one aspect of these embodiments, heating power is provided to the heater E565 in the form of electrical energy by a controller using one or more temperature feedback signals for closed-loop control. The workpiece W is then held at the processing temperature for a specified length of time. After the expiration of the specified length of time, power is shut off to the heater E565 and the heat sink E570 is engaged. In accordance with one manner in which the cooling process takes place, the heat sink E570 remains engaged until the temperature drops below a predetermined temperature threshold, such as 70 degrees Celsius, after which the heat sink E570 may be disengaged. As such, the workpiece W can be cooled to a temperature that allows it to be safely handled by the workpiece transfer mechanism as well as in subsequent processing chambers. Further, the workpiece W can be cooled to a temperature at which the electroplated metal is less susceptible to oxidizing agents in the ambient atmosphere before it is removed from the inert atmosphere of the processing chamber E555.

Upon completion of the cool-down cycle, the vacuum circuit that is used to secure workpiece W against thermal transfer unit E560 can be deactivated and the actuator E515 can drive the first assembly E505 back to the position illustrated in FIG. E1A or FIG. E1C, depending on the particular embodiment. As the first assembly E505 is raised in the embodiment of FIGS. E1A and E1B, the workpiece support members E525 naturally engage or are otherwise directed to engage and lift workpiece W from the surface of the thermal transfer unit E560. The automated workpiece transfer mechanism then removes workpiece W from workpiece support members E525, thereby leaving the thermal reactor E500 ready for accepting and processing another workpiece W. While the thermal reactor E500 is waiting to accept another workpiece W, the heater E565 may be directed to begin ramping to the desired processing temperature, or some intermediate temperature, to thereby reduce the overall time required to thermally process the next microelectronic workpiece. Similarly, the workpiece support members E525 of the embodiment shown in FIG. E1C can be directed to release the workpiece W to the automated workpiece transfer mechanism thereby leaving the reactor E500 in a state in which it is ready to receive another workpiece.

FIGS. E2A–E2F illustrate different embodiments of the heater E565, employing different substrate configurations. In one embodiment, the heater E565 is constructed as a thick film heater (i.e., a heater that is constructed using thick film patterning techniques) having a low thermal mass. Each thick film heater E565 configuration can accommodate a high power density within a thin physical profile, resulting in a low thermal mass with fast thermal response (i.e., faster heating and cooling). Given the low thermal mass of such thick film heater configurations, the thick film heater E565 can be thermally isolated from other structures in the second assembly E510, in one aspect of this embodiment.

FIG. E2A illustrates a basic thick film heater. As shown, the thick film heater E565 includes a high resistance layer E600 that is disposed between two ceramic substrate layers E605.

FIG. E2B illustrates further details of one embodiment of the thick film heater E565. As shown, the thick film heater E565 may be fabricated by forming a layer E600 having a circuit pattern of high resistance traces E604 between two or more thin ceramic substrates E605, with optional vacuum distribution circuit channels E603 embedded between the high electrical resistance traces E604. When employed, the vacuum distribution circuit channels E603 are connected to an exterior vacuum supply E607. The high resistance traces E604 may be formed in a pattern that tailors the power distribution to the shape of the microelectronic workpiece so that the workpiece is uniformly heated. The optional vacuum circuit channels E603 are connected to apertures E606 in the top substrate layer, thereby providing suction to the lower surface of the microelectronic workpiece. The embodiments illustrated in FIGS. E2A and E2B are particularly suited for those instances in which a ceramic interface is desired between the heater E565 and the heat sink E570.

FIG. E2C illustrates a third manner in which the thick film heater E565 may be constructed. As shown, the thick film heater E565 may be fabricated with two or more layers of thin ceramic substrate E605 that sandwich a layer of vacuum circuit channels, with a layer of high electrical resistance traces E600 deposited onto the bottom surface of the thick film heater E565. A layer of dielectric overglaze E601 is deposited over the high electrical resistance traces E604 for protection and electrical isolation. Optionally, another dielectric coating E601a can be disposed between the layer of high electrical resistance traces E600 and the adjacent ceramic substrate E605 to improve the adhesion between the ceramic substrate E605 and the layer E600. This embodiment can be relatively easy to manufacture because the vacuum distribution channels E603 may be cut completely through the second ceramic layer E605 and the rear side thereof may be sealed by a lower, adjacent ceramic layer.

FIG. E2D illustrates a fourth manner in which the thick film heater E565 may be constructed. As shown, thick film heater E565 may be fabricated with three or more laminated layers of thin ceramic substrate E605 that sandwich a layer of vacuum circuit channels E603 between two or more thin ceramic substrates E605, and a lower layer of high electrical resistance traces E600 between a different pair of ceramic substrates E605. Again, this embodiment is relatively easy to manufacture because the vacuum distribution channels E603 are cut completely through the second ceramic layer and are sealed by a lower, adjacent ceramic layer. Further, this embodiment is particularly well-suited for those instances in which it is desired to have a ceramic interface between the heating chuck E565 and the heat sink E570.

FIG. E2E illustrates a fifth manner in which the thick film heater E565 may be constructed. As shown, thick film heater E565 may be fabricated with one layer of thin ceramic substrate E605, with a layer of high electrical resistance traces E600 deposited onto the bottom surface of the thick film heater E565. A layer of dielectric overglaze E601 can be deposited over the high electrical resistance traces E604 for protection and electrical isolation. The void between the bottom surface of the thick film heater E565 and the top surface of the heat sink E570 serves as a vacuum reservoir for the apertures E606 that extend through the thick film heater E565.

FIG. E2F illustrates an embodiment of heater E565 that may be used to provide good thermal contact between the upper surface of heater E565 and the workpiece W during a heating cycle and the lower surface of the heater E565 and the heat sink E570 during a cooling cycle. To this end, the second of the ceramic layers E605 is provided with at least one set of vacuum distribution channels E603. The vacuum distribution channels E603 are in fluid communication with one or more apertures E606 disposed through the upper ceramic substrate that is used to contact the workpiece W. The vacuum distribution channels E603 are also in fluid communication with one or more apertures E609 disposed through a lower surface of the heater E565. Vacuum equipment E607 operates during both the heating and the cooling cycles. During the cooling cycle, the vacuum provided through apertures E609 assists in establishing thermal contact between the lower surface of the heater E565 and the heat sink E570.

Alternatively, separate vacuum distribution channels E603 may be connected to separately operable vacuum sources E607 and E608. In this embodiment, a first vacuum source and corresponding vacuum distribution channels can bring the workpiece W into firm thermal contact with the upper surface of the heater E565 while a second vacuum source and corresponding vacuum distribution channels can bring the heat sink E570 into firm thermal contact with the lower surface of the heater E565 during a cooling cycle.

FIGS. E2G–E2J are exemplary plan views of various elements used in the thick film heaters shown in FIGS. E2B–E2F. FIG. E2G is a plan view of an exemplary layout for the high resistance layer E600. As illustrated, the exemplary layout includes a plurality of concentric high resistance traces E604 that are separated from one another by corresponding concentric isolation regions E611. The isolation regions E611 may include a dielectric material, such as ceramic or air. When air is used as the dielectric material, the isolation regions E611 can define the vacuum distribution channels E603 of an embodiment such as the one illustrated in FIG. E2B. Each of the high resistance traces E604 can include electrical nodes that are isolated from one another by corresponding isolation regions E613. The isolation regions E613 may include a dielectric material, such as ceramic or air. Additionally, the high resistance traces E604 may be provided with power on an individual basis, or may be provided with power supplied on a common power bus.

FIG. E2H is an exemplary plan view of the layout of vacuum distribution channels E603 formed in the second ceramic layer E605 such as the one illustrated in FIGS. E2C, E2D and E2F. Again, the vacuum distribution channels E603 are formed in a concentric arrangement and are generally isolated from one another by corresponding isolation regions E614. The isolation regions E614 can include one or more fluid passage channels E617 that provide areas of fluid communication between the distribution channels E603 so that the vacuum provided by a vacuum source connected to one or more of the distribution channels E603 may be communicated to all of the distribution channels.

FIG. E2I is a top plan view of an exemplary layout for the uppermost ceramic layer E605. As illustrated, apertures E606 may be formed in the upper ceramic layer E605 at locations disposed immediately above the vacuum flow channels E603 (shown in phantom outline). With respect to the exemplary layout shown here, the apertures E606 are arranged in concentric circles at equal angular intervals.

FIG. E2J illustrates a further configuration for the high resistance traces E604. As shown, the traces E604 are organized in the form of a continuous spiral separated by a isolation regions E611 that, as noted above, can be formed from a solid dielectric material or air. When air is employed, regions E611, in certain of the foregoing embodiments, can function as the vacuum flow channels E603.

FIGS. E3A–E6B illustrate various embodiments of the thermal transfer unit E560 employing different interfaces between the thick film heater E565 and the heat sink E570. In an embodiment shown in FIGS. E3A and E3B, solid/solid conduction is used as the primary mode of heat transfer from the thick film heater E565 to the heat sink E570 as well as for the heat transfer between the heater E565 and the workpiece W. During thermal processing of the workpiece W, the thermal transfer unit E560 is in the heating state illustrated in FIG. E3A. In the heating state, the top surface of the heat sink E570 can be offset from the lower surface of the thick film heater E565 and the volume between them can be filled with a relatively low thermal conductivity gas, such as nitrogen, which thermally insulates the elements from one another. Isolating the thick film heater E565 from the heat sink E570 in this manner can facilitate a fast heat up to the desired process temperature, because there is minimal heat loss. The cool-down state is illustrated in FIG. E3B. In this state, the thick film heater E565 is deactivated and the thick film heater E565 and heat sink E570 are moved relative to one another so that the lower surface of thick film heater E565 engages the upper surface of heat sink E570. Such relative movement may be provided, for example, by opposing inflatable, flange seals that are actuated to impart vertical movement to the heat sink E570.

FIGS. E4A and E4B illustrate an embodiment of the thermal transfer unit E560 in which solid/gas/solid conduction is used as the primary mode of heat transfer from the thick film heater E565 to the heat sink E570. In this embodiment, the thick film heater E565 and the heat sink E570 are permanently offset from one another by a very small distance (i.e., 0.020 inches). While in the heating state illustrated in FIG. E4A, the volume E569 between the thick film heater E565 and the heat sink E570 is purged with a relatively low thermal conductivity gas to thermally insulate the elements from one another. When in the cooling state illustrated in FIG. E4B, the thick film heater E565 is deactivated and the volume E569 between the thick film heater E565 and the heat sink E570 is purged with a relatively high thermal conductivity gas, such as helium, which serves as the medium for conducting heat from the thick film heater E565 to the heat sink E570. This approach provides efficient use and transfer of thermal energy, with no moving parts. Notably, inlet and outlet ports for the gases must be provided in the thermal reactor E500.

FIGS. E5A and E5B illustrate an embodiment of the thermal transfer unit E560 that makes use of forced convection and boiling as the primary modes to transfer heat from the thick film heater E565 to the heat sink E570. Again, the thick film heater E565 and the heat sink E570 are permanently offset from one another by a small distance (i.e., 0.020–0.040 inches). While in the heating state illustrated in FIG. E5A, the volume E569 between the thick film heater E565 and the heat sink E570 is purged with a relatively low thermal conductivity gas to thermally insulate the elements from one another. When in the cooling state illustrated in FIG. E5B, the thick film heater E565 is deactivated and the volume E569 between the heating chuck E565 and the heat sink E570 is filled with an impinging, high-speed flow of heat transfer fluid (i.e., water or glycol), which serves as the medium for convecting heat away from the thick film heater E565 to the heat sink E570. The heat sink E570 in this instance may be formed to serve as a sparger shower assembly, uniformly delivering the heat transfer fluid through a manifold of flow jet apertures in the upper surface of the heat sink, and locally draining the fluid through an interspersed manifold of exit holes. Alternatively, spent cooling fluid may be directed to exit radially in the channel between the heating and heat sinks. This overall approach provides efficient use and transfer of thermal energy, again with no moving parts.

FIGS. E6A and E6B illustrate yet a further embodiment of the thermal transfer unit E560. In this embodiment, the workpiece W, the thick film heater E565 and the heat sink E570 are in constant contact during the entire thermal processing cycle. A thin layer of insulating material E633 is used to thermally insulate the thick film heater E565 from the heat sink E570. The material used for the layer E633 and the thickness thereof are chosen to yield an optimal balance between the performance of the thermal transfer unit E560 that is exhibited during the heating and cooling sub-cycles of the overall thermal processing cycle. This design offers the advantage of design simplicity, in that there are no moving parts and no thermally insulating/conducting gases needed.

In each of the foregoing embodiments in which the heat sink E570 directly contacts the heater E565, an optional, high thermal conductivity material may be disposed between the contact surfaces during the cooling cycle. The material disposed between the contact surfaces preferably is resiliently deformable in response to the pressure applied when the heater E565 and heat sink E570 are in direct thermal contact with one another. In this way, a more uniform thermal transfer medium exists between the heater E565 and heat sink E570 since air pockets or the like that may otherwise occur if the heater E565 and heat sink E570 surfaces were in direct physical contact are substantially eliminated.

FIG. E7 illustrates one manner in which two or more thermal reactors constructed in accordance with one or more of the foregoing embodiments may be consolidated at a single annealing station. In this embodiment, the thermal reactors are disposed in a stacked configuration within a housing unit E700. Housing unit E700 includes a plurality of chamber units E710, each including a single thermal reactor. The chamber units E710 are defined by upper and lower horizontal walls E715 and E720, and one or more sidewalls E725. One or more sidewalls E725 of each chamber unit E710 may include an automated door or mail slot opening E730 that isolates each chamber unit E710 from the surrounding environment and provides a workpiece transfer mechanism with access to the thermal reactors during workpiece loading and unloading operations.

FIG. E8 is a schematic block diagram of one embodiment of a programmable control system that may be used to control the thermal reactor assembly in accordance with a further aspect of the present invention. The control system, shown generally at E900, can include a programmable controller E905, such as a programmable logic controller, microcontroller, microprocessor, etc. The controller E905 receives data and communicates data to and from a plurality of peripheral components that are used to monitor and control the thermal reactor. For example, the controller E905 can be in communication with an automated gas flow meters/valve system E910. The automated gas flow meters/valve system E910 controls the flow of various gases, such as the purging gases, that are provided to the thermal reactor. The automated gas flow system E910 may also be used to control the operation of the vacuum equipment E607 and/or E608 shown in FIGS. E2B–E2F, turning the equipment on and off at the appropriate times.

Control of the annealing temperature within the thermal reactor may also be performed by the controller E905 through a corresponding interface with a reactor temperature sensor/supply system E915. The reactor temperature sensor/supply system E915 can include a plurality of temperature sensors that monitor the temperature within the thermal reactor. The system E915 can also include a power supply that provides the necessary electrical power to the electrical traces E604 (FIGS. E3A–E3F) of the high resistance layer in response to data communicated from the controller E905. Various known temperature control algorithms may be employed within the programmable controller E905 to facilitate this function.

Element drive system E920 and chuck cooling assembly E925 can operate the drive E530 (FIGS. E1A–E1D) and the heat sink E570, respectively. More particularly, drive system E920 can operate the drive E530 to move the first and second assemblies E510, E520 with respect to one another for loading/unloading and processing of the workpiece W in response to commands received from programmable controller E905. The drive system E920 may also communicate positional information to the controller E905 indicative of the relative position of the first and second assemblies E510, E520, which may be used by the controller E905 to properly position the assemblies during operation of the thermal reactor.

Cooling assembly system E925 may serve a dual purpose. First, the system E925 may be used to control the relative movement between the heater and the heat sink E570 in response to commands received from the controller E905. Further, system E925 may be used to control the temperature of the heat sink E570 by controlling the cooling gases provided to the heat sink in response to commands received from the controller E905. To this end, system E925 may also include one or more temperature sensors that monitor the temperature of the heat sink E570 and transmit data to the controller E905 indicative of this temperature. The controller E905 may then use this temperature information to direct system E925 to cool the heat sink E570 to the target temperature.

Controller E905 also communicates with one or more safety shutdown elements E930. The safety shutdown elements E930 are activated by the controller E905 when the controller detects one or more conditions that compromise the safety of the thermal reactor. For example, the safety shutdown elements E930 may be used by the controller E905 to shutdown the thermal reactor system in response to an over temperature condition of the heating chuck, reactor chamber, etc. It will be recognized in view of these teachings that other safety conditions may also be detected by the controller E905 pursuant to activation of the safety shutdown elements E930.

FIG. E9 is a partially schematic, partially cut-away, side isometric view of an apparatus E1000 for thermally processing microelectronic workpieces W in accordance with another embodiment of the invention. In one aspect of this embodiment, the apparatus E1000 includes two thermal processing chambers E1003 (shown as an upper chamber E1003a and a lower chamber E1003b) supported by an apparatus support E1002. Each chamber E1003 can have a base E1010 and lid E1020 that moves toward and away from the base E1010 to close and open the chamber E1003. The workpiece W can be supported within the chamber E1003 on a plurality of workpiece supports E1070. In one aspect of this embodiment, the apparatus E1000 can anneal a selected material (such as copper or another metal) of the workpiece W. Alternatively, the apparatus E1000 can perform other elevated temperature processes, as described in greater detail below. When the apparatus E1000 both heats and cools the workpiece W, the supports E1070 can lower the workpiece W into engagement with a heat source E1040 during a heating phase of the process. During a cooling phase of the process, a first heat sink E1060 can rise to engage an opposite surface of the heat source E1040 to cool both the heat source E1040 and the workpiece W. After the cooling phase, the first heat sink E1060 can descend to engage a second heat sink E1050 where the first heat sink E1060 is cooled in preparation for another cycle. The lid E1020 can then move away from the base E1010 and the workpiece W can be removed. In a preferred aspect of this embodiment, the heat source E1040 is positioned between the workpiece W and the first heat sink E1060, with the first heat sink E1060 positioned beneath the heat source E1040.

In one embodiment, the support E1002 of the apparatus E1000 can include a frame defined by a plurality of columns E1004 (two of which are visible in FIG. E9), each having a receiving channel E1005. The chambers E1003 can be fixedly attached to the columns E1004 by inserting tabs E1006 extending outwardly from the base E1010 of each chamber E1003 into the corresponding channels E1005 and fastening the tabs E1006 to the columns E1004. Accordingly, the chambers E1003 can remain fixed while a transfer mechanism E620 moves in the vertical direction to selectively place a single microelectronic workpiece W in either the upper chamber E1003a or the lower chamber E1003b. Alternatively, the chambers E1003 can be coupled either individually or together to one or more actuators E1007 to move the chambers E1003 vertically in addition to or in lieu of moving the transfer mechanism E620 in the vertical direction.

In a further aspect of this embodiment, the chambers E1003 can have a modular construction. For example, the lid E1020 of the lower chamber E1003b can depend from and can be integrated with the base E1010 of the upper chamber E1003a. The lid E1020 of the upper chamber E1003a can be supported by a cover E1030. Accordingly, any number of chambers E1003 can be stacked one above the other in a manner that reduces the total number of components of the apparatus E1000 by integrating features of one chamber with those of the chamber above. This arrangement can also reduce the footprint required for multiple chambers. At the same time, this arrangement provides the flexibility of a modular construction. In other embodiments, the apparatus E1000 can have other modular arrangements, for example, with the chambers positioned side by side.

The lid E1020 of each chamber E1003 can be coupled to a lid actuator E1021 to move downwardly from an open position (shown in FIG. E9) to a closed position. The lid actuator E1021 of the upper chamber E1003a can be attached to the cover E1030, and the lid actuator E1021 of the lower chamber E1003b can be attached to the base E1010 of the upper chamber E1003a. Each lid actuator E1021 can include an air-activated bellows that moves the lid E1020 downwardly when inflated. In one aspect of this embodiment, each bellows can extend circumferentially for 360° to form a closed circle. Alternatively, a plurality of bellows or other actuators can be disposed at spaced-apart circumferential locations around the lid E1020. In either embodiment, one or more springs (not shown) can return the lid E1020 to the open (upper) position when the air pressure within the bellows is released.

When the lid E1020 is in the closed position, the lid E1020 and the base E1010 define a chamber volume E1008 around the microelectronic workpiece W. As described above with reference to FIG. E1B, it can be advantageous to purge the region around the microelectronic workpiece W during the annealing process. Accordingly, the lid E1020 can include a purge fluid passageway E1022 that transmits a purge fluid (such as nitrogen) to the chamber volume E1008 via a manifold E1027. The manifold E1027 is aligned with a purge fluid diffusion plate E1025 that is perforated with purge fluid apertures E1024 leading directly into the chamber volume E1008. The passageway E1022 can also be coupled to a purge fluid port E1023 via a connecting passage E1028a. The purge fluid port E1023 can be connected to a source of purge fluid (not shown). In one embodiment, the purge fluid port E1023 for the upper chamber E1003a can be positioned in the cover E1030, and the purge fluid port E1023 for the lower chamber E1003b can be positioned in the base E1010 of the upper chamber E1003a. The connecting passages E1028a for both chambers E1003 can extend laterally outwardly to couple to the purge fluid ports E1023 at the outer surface of the apparatus E1000 and can extend upwardly to avoid interfering with the annular lid actuators E1021. The purge fluid can exit the chamber volume E1008 through purge fluid exit openings E1026 at the outer surface of the apparatus E1000.

During the elevated temperature portion of the annealing process, the microelectronic workpiece W can be engaged with the heat source E1040. Accordingly, the upper surface of the heat source E1040 can include a solid state material that can transfer heat to the microelectronic workpiece by conduction. The heat source E1040 can also include vacuum apertures E1041 coupled to a vacuum source (not shown), as described in greater detail below, to draw the microelectronic workpiece W into close engagement with the heat source E1040 during heating. For example, the heat source E1040 can be supported relative to the base E1010 with a plurality of heat source supports E1044, at least one of which includes a vacuum passage E1043 (shown in the lower chamber E1003b) in fluid communication with the vacuum apertures E1041. The vacuum passage E1043 can also be connected (via a connecting passage E1028b) to a heater vacuum port E1042 at the outer surface of the apparatus E1000 for coupling to the vacuum source.

During the cooling portion of the annealing process, the first heat sink E1060 can be raised to engage the heat source E1040 and cool both the heat source E1040 and the microelectronic workpiece W by conduction. Accordingly, the first heat sink E1060 can be coupled to a heat sink actuator E1061 that moves the first heat sink E1060 upwardly into engagement with the heat source E1040. In one embodiment, the heat sink actuator E1061 can include an air-driven bellows, generally similar to the lid actuator E1021 discussed above. Alternatively, the heat sink actuator E1061 can have other configurations that move the first heat sink E1060 upwardly into engagement with the heat source E1040 and downwardly out of engagement with the heat source E1040.

In a further aspect of this embodiment, the first heat sink E1060 can include a vacuum supply passageway E1062 connected (via a connecting passage E1028c) to a vacuum port E1065 in the outer surface of the apparatus E1000. The vacuum supply passageway E1062 is coupled to one or more radial vacuum channels E1063 and one or more circumferential vacuum channels E1064 in an upper surface of the first heat sink E1060 to draw the first heat sink E1060 into close thermal contact with the heat source E1040 when the heat source E1040 and the first heat sink E1060 are engaged with each other. The upper surface of the first heat sink E1060 can also include a compressible, conductive thermal pad E1066 having an engaging surface E1067 to provide close thermal contact with the heat source E1040 when the first heat sink E1060 is in its raised position. In another aspect of this embodiment, the lower surface of the first heat sink E1060 can include a compressible, conductive thermal pad generally similar to the pad E1066 to improve the thermal contact with the second heat sink E1050.

In one embodiment, the first heat sink E1060 has no active cooling elements. Accordingly, an advantage of this arrangement is that no cooling fluid supply lines are connected to the first heat sink E1060, which can eliminate the complexity associated with fluid couplings attached to a movable heat sink. Instead, the second heat sink E1050 can be actively cooled and can cool the first heat sink E1060 when the first heat sink E1060 is disengaged from the heat source E1040 and engaged with the second heat sink E1050. Accordingly, the second heat sink E1050 can include a cooling channel E1054 coupled to a cooling fluid supply port and a return port described in greater detail below with reference to FIG. E18. The second heat sink E1050 can also include a cooling member cap E1051 that seals and defines, in part, the cooling channel E1054. In an alternate embodiment, the first heat sink E1060 can be actively cooled (for example, with cooling fluid) in addition to or in lieu of actively cooling the second heat sink E1050. Such an arrangement can increase the speed with which the first heat sink E1060 (and/or the heat source E1040 and workpiece W) cools because the first heat sink E1060 can be cooled while it is engaged with the heat source E1040.

The operation of an embodiment of the apparatus E1000 described above is explained below with reference to FIG. E9. The operation of the upper chamber E1003a can be independent of the operation of the lower chamber E1003b. Accordingly, for either chamber E1003a, E1003b, the lid E1020 is initially moved to the raised or open position shown in FIG. E9. The chamber volume E1008 can be purged with a relatively low flow rate of inert gas, such as $N_2$, flowing through the purge fluid passageway E1022 via the purge fluid port E1023. The heat source E1040 can idle at an average temperature of approximately 50 degrees Celsius. Alternatively, the heat source E1040 can be turned off or deactivated, and in another alternate embodiment, the heat source E1040 can be fully activated. In still a further alternate embodiment, the heat source E1040 can idle at a temperature other than 50 degrees Celsius. In any of the foregoing embodiments, the first heat sink E1060 can be positioned against the second heat sink E1050 to cool the first heat sink E1060.

The microelectronic workpiece W is then moved (with the applied material side facing upward in one embodiment) into the open chamber by a robotic transfer mechanism. The transfer mechanism rests the microelectronic workpiece W on the workpiece supports E1070 and withdraws. The lid E1020 then moves downwardly to the closed position and as it does so, engages the workpiece supports E1070 and moves them downwardly until the workpiece W engages the heat source E1040. A vacuum is applied to the vacuum apertures E1041 via the vacuum port E1042 to draw the workpiece W into close thermal engagement with the heat source E1040. The vacuum can be applied before, during or after the lid closing operation. The purge fluid to the chamber volume E1008 is then replaced with a flow of process gas (for example, 1 to 10 liters per minute of $N_2$, Ar, $H_2$ or $He_2$). When the gas is supplied at more than one flow rate, the apparatus E1000 can include a mass flow controller and/or a multi-port valved manifold to selectively control the flow of gas into the chamber volume E1008.

The heat source E1040 is then activated to heat the microelectronic workpiece W to a selected temperature for a selected period of time. For example, when the microelectronic workpiece W includes a copper layer, the workpiece W can be heated to a temperature in the range of from about 210 degrees Celsius to 290 degrees Celsius for a period of from about 30 seconds to about 90 seconds. In one specific example, the copper layer can be heated to about 250 degrees Celsius for about 60 seconds. Accordingly, the copper layer can be annealed such that the grain structure of the layer changes (e.g., the size of the grains forming the layer can increase). In other embodiments, the workpiece W can be heated to other temperatures for other periods of time depending on the chemical composition of the material targeted by the process, and by the result expected to be achieved by the process. The increase in temperature from the idle temperature can begin before, during or after the lid closing operation. The increase in temperature from the idle temperature to the target process temperature can be controlled using a closed-loop temperature sensor feedback control, such as a proportional integral control, a proportional integral derivative control or a multi-variable temperature control.

After the microelectronic workpiece W has been heated, the first heat sink E1060 can move upwardly into engagement with the lower surface of the heat source E1040 to cool the heat source E1040 and the microelectronic workpiece W. A vacuum is applied to the vacuum supply passageway E1062 via the vacuum port E1065 to draw the first heat sink E1060 into close thermal engagement with the heat source E1040. In one embodiment, the microelectronic workpiece W can be cooled to a temperature below 70 degrees Celsius in 18 seconds. The flow of process gas is then replaced with a flow of purge gas. After the cooling phase is complete, the first heat sink E1060 moves downwardly into engagement with the second heat sink E1050 to cool the first heat sink E1060. Simultaneously, the lid E1050 can be raised to open the chamber E1003, and the transfer mechanism E620 can be moved into the open chamber to engage the microelectronic workpiece W and remove it for further processing. The second heat sink E1050 can be cooled during or after contact with the first heat sink E1060 by providing cooling fluid to the cooling channel E1054.

An advantage of an embodiment of the apparatus E1000 described above with reference to FIG. E9 is that it can be of modular construction. Accordingly, any number of chambers E1003 can be stacked, one above the other, to reduce the footprint occupied by the chambers. The chambers can also be integrated as they are stacked so that the bottom portion of an upper chamber defines the top portion of the chamber below. Another feature of an embodiment of the apparatus E1000 described above with reference to FIG. E9 is that the heat source E1040 and the second heat sink E1050 do not move relative to the rest of the apparatus. Instead, the first heat sink E1060 and the microelectronic workpiece W move relative to the heat source E1040 to transfer heat to and from the microelectronic workpiece W. An advantage of this feature is that the number of movable couplings for providing electrical power, purge fluid communication and vacuum communication to moving parts can be reduced by comparison with some conventional arrangements. Still further features of an embodiment of the apparatus E1000 are that the heat source E1040 has a low thermal mass and is positioned above the heat sinks E1050, E1060. Accordingly, the heat source (and therefore the workpiece W) can cool relatively quickly, and any gas heated by the heat source E1040 will tend to rise away from (rather than toward) the heat sinks E1050, E1060. An advantage of this arrangement is that the workpiece can heat and cool quickly, increasing the throughput of the apparatus relative to conventional devices.

In other embodiments, the apparatus E1000 can have other configurations. For example, the heat supplied by the heat source E1040 can be provided devices other than the electrical element E1080. The cooling provided to the second heat sink E1050 can be provided by mechanisms other than chilled fluid. The actuators moving the lid E1020 and the first heat sink E1060 can be powered by devices other than pneumatic devices. The apparatus E1000 (and/or other heat transfer apparatuses described above with reference to FIGS. E1A–E9) can be configured to perform thermal processes other than annealing. For example, the apparatuses can heat a microelectronic workpiece W to reflow solder on the workpiece W, cure or bake photoresist on the workpiece W, and/or perform other processes that benefit from and/or require an elevated temperature. The heat source of the apparatus can heat the microelectronic workpiece conductively by contacting the workpiece directly, and/or conductively via an intermediate gas or liquid, and/or convectively via an intermediate gas or liquid, and/or radiatively. The heat source and the workpiece support can be fixed relative to each other or one or both of the heat source and the workpiece support can be moveable relative to the other. The first heat sink can be moveable relative to the heat source and the second heat sink or alternatively these components can be fixed relative to each other and can selectively heat or cool the workpiece by introducing fluid media between the heat source and the first heat sink and/or between the first heat sink and the second heat sink.

F. Metrology Unit

Each of the metrology units 228, 932, 942, 952, 1020, 1036 (FIGS. 2–4, 9 and 10) can be a fourpoint probe style metrology tool. The metrology units can use sheet resistance or capacitance to determine layer thickness. Alternately, the metrology units can use optical or thermal reference methods. In one embodiment, the metrology units can use a laser based non-constant metrology system wherein the laser induces an acoustic response in the measured film and the acoustic response is related to film thickness. This is known as impulsive stimulated thermal scattering (ISTS). One such system is manufactured by Philips Analytical under the model name "IMPULSE" or "EMERALD". Another such metrology unit is manufactured by Rudolf Technologies, under the model name "METAPULSE." In other embodiments, the metrology units can have other configurations and/or perform other metrology functions with other methodologies.

G. Input/Output Station

Embodiments of the input/output station 224 described above with reference to FIGS. 2–4 are described in U.S. patent application Ser. No. 09/611,860, titled "Apparatus for Processing a Microelectronic Workpiece Including a Workpiece Cassette Inventory Assembly," filed on Jul. 7, 2000, and in International Patent Application No. PCT/US98/00076 "Semiconductor Processing Apparatus Having Lift And Tilt Mechanism", filed Jan. 5, 1998, both incorporated herein by reference. The input/output section can include an opening through which the one or more cassettes are received by a multi-cassette interface. The multi-cassette interface can selectively adjust the alignment of the one or more cassettes with respect to one or more corresponding direct-access assemblies for transfer therebetween. The one or more direct-access assemblies can receive the one or more cassettes from the multi-cassette interface and position them to allow direct access to individual microelectronic workpiece positions of the one or more cassettes, including direct access to any microelectronic workpieces disposed at the microelectronic workpiece positions.

H. Non-compliance Station

The non-compliance station 148 can include a cassette for holding multiple microelectronic workpieces. The cassette can be automated, for example to be sent back to the PVD seed layer deposition station for reestablishing a seed layer on the microelectronic workpiece substrates.

I. Linear Robot System

Embodiments of the linear robot system 226 described above with reference to FIGS. 2–4 are described in further detail in International Patent Application No. PCT/US98/00132, titled "Semiconductor Processing Apparatus Having Linear Conveyor System", filed Jan. 6, 1998; and in International Patent Application No. PCT/US98/00076, titled "Semiconductor Processing Apparatus Having Lift And Tilt Mechanism", filed Jan. 5, 1998; and in International Patent Application No. PCT/US99/15567, titled "Robots For Microelectronic Workpiece Handling", filed Jul. 9, 1999, all herein incorporated by reference.

J. Chemical Mechanical Polishing Station

Embodiments of chemical mechanical polishing tools 916 described above with reference to FIG. 9 are further described in published International Patent Application No. WO 00/26609, published May 11, 2000, and in U.S. Pat. No. 5,738,574, both incorporated herein by reference.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An apparatus for processing a microelectronic workpiece, comprising:
   a deposition unit configured to receive the microelectronic workpiece and deposit a layer of material on the microelectronic workpiece;
   a metrology unit configured to receive the microelectronic workpiece, the metrology unit being configured to detect a condition of a layered portion of the microelectronic workpiece and transmit a condition signal representative of the condition;
   a stripping unit configured to receive the microelectronic workpiece and chemically strip at least part of the layered portion from the microelectronic workpiece, the stripping unit including:
      a rotor motor; and
      a workpiece housing connected to the rotor motor for rotation, the workpiece housing defining an at least approximately closed processing space coupleable to sources of one or more processing fluids to distribute the one or more processing fluids across at least one face of the workpiece;
   a transport unit positioned to move the microelectronic workpiece to the stripping unit; and
   a control unit operatively coupled to at least the metrology unit and at least one of the transport unit and the stripping unit, the control unit being configured to receive the condition signal and, based on the condition signal, transmit at least one of a first transmitted signal and a second transmitted signal, the first transmitted signal being configured to direct the transport unit to move the microelectronic workpiece to the stripping unit, the second transmitted signal being configured to influence a process carried out by the stripping unit.

2. The apparatus of claim 1 wherein the microelectronic workpiece is a first microelectronic workpiece, and wherein the control unit is operatively coupled to the deposition unit to influence a deposition process carried out by the deposition unit on at least one of the first microelectronic workpiece and a second microelectronic workpiece subsequently received at the deposition unit.

3. The apparatus of claim 1 wherein the metrology unit is positioned external to a housing that at least partially encloses at least one of the deposition unit and the stripping unit.

4. The apparatus of claim 1, further comprising at least one of:
   a seed layer enhancement unit configured to receive the microelectronic workpiece and enhance characteristics of a seed layer disposed on the microelectronic workpiece;
   a non-compliance unit configured to receive and support the microelectronic workpiece without changing the condition of the microelectronic workpiece when the condition of the layered portion of the microelectronic workpiece is outside a tolerance range;
   an annealing unit configured to receive the microelectronic workpiece and anneal at least a portion of the microelectronic workpiece; and
   a pre-align unit configured to rotationally align the microelectronic workpiece.

5. The apparatus of claim 1 wherein the metrology unit is configured to detect a condition of a layer deposited by the deposition unit.

6. The apparatus of claim 1 wherein the deposition unit is configured to deposit at least one of a seed layer and a blanket layer on the microelectronic workpiece.

7. The apparatus of claim 1 wherein the stripping unit includes:
   a rotatable support member;
   an upper chamber member having a first fluid inlet; and
   a lower chamber member having a second fluid inlet and being coupled to the upper chamber member to define a substantially closed processing chamber configured to receive the microelectronic workpiece when the microelectronic workpiece is carried by the support member, the processing chamber having a peripheral region with a fluid outlet positioned to receive fluid having a centrifugal force imparted to it by contact with the microelectronic workpiece.

8. The apparatus of claim 1 wherein the deposition unit is configured to deposit a layer of material by at least one of an electrochemical process, an electrolytic process and an electroless process.

9. An apparatus for processing a microelectronic workpiece, comprising:
   a deposition unit configured to receive the microelectronic workpiece and deposit a layer of material on the microelectronic workpiece, the deposition unit including a reaction vessel, the reaction vessel having:
      an outer container having an outer wall;
      a first outlet configured to introduce a primary flow into the outer container;
      at least one second outlet configured to introduce a secondary flow into the outer container separate from the primary flow;
      a dielectric field shaping unit in the outer container coupled to the second outlet to receive the secondary flow, the field shaping unit being configured to contain the secondary flow separate from the primary flow through at least a portion of the outer container, and the field shaping unit having at least one electrode compartment through which the secondary flow can pass while the secondary flow is separate from the primary flow; and
      an electrode in the electrode compartment; further comprising:
   a metrology unit configured to receive the microelectronic workpiece, the metrology unit being configured to detect a condition of a layered portion of the microelectronic workpiece and transmit a condition signal representative of the condition;
   a transport unit positioned to move the microelectronic workpiece to the deposition unit; and
   a control unit operatively coupled to the metrology unit and at least one of the deposition unit and the transport unit, the control unit being configured to receive the condition signal and, based on the condition signal, transmit at least one of a first transmitted signal and a second transmitted signal, the first transmitted signal being configured to direct the transport unit to move the microelectronic workpiece to the deposition unit, the second transmitted signal being configured to influence a process carried out by the deposition unit.

10. The apparatus of claim 9, further comprising a primary flow guide including:
   a first baffle having a plurality of first apertures through which at least the primary flow can pass; and
   a second baffle downstream from the first baffle, the second baffle having a plurality of second apertures through which the primary flow can pass after passing through the first apertures.

11. The apparatus of claim 9 wherein the field shaping unit includes:
a first annular wall in the outer container centered on a common axis, the first annular wall being spaced radially inward of the outer wall,
a second annular wall in the outer container concentric with first annular wall and between the first annular wall and the outer wall, wherein an inner surface of the second annular wall defines an outer side of a first electrode compartment and an outer surface of the second annular wall defines an inner side of a second electrode compartment, and
a virtual electrode unit having a first partition and a second partition, the first partition having a first lateral section coupled to the first and second annular walls and a first annular lip projecting from the first lateral section to define an interior flow path for the primary flow, and a second partition having a second lateral section above the first lateral section and a second annular lip projecting from the second lateral section, the second annular lip surrounding the first annular lip to define an annular opening therebetween;
and wherein the apparatus further comprises a first annular electrode in the first electrode compartment and a second annular electrode in the second electrode compartment.

12. The apparatus of claim 9, further comprising a primary flow guide including:
an annular outer baffle centered on a common axis, the outer baffle having a plurality of first apertures; and
an annular inner baffle positioned concentrically inside the outer baffle, the inner baffle having a plurality of second apertures, wherein the primary flow passes through the first apertures of the outer baffle and then through the second apertures of the inner baffle.

13. The apparatus of claim 9 wherein the microelectronic workpiece is a first microelectronic workpiece, and wherein the control unit is operatively coupled to the deposition unit to influence a deposition process carried out by the deposition unit on at least one of the first microelectronic workpiece and a second microelectronic workpiece subsequently received at the deposition unit.

14. The apparatus of claim 9 wherein the metrology unit is positioned external to a housing that at least partially encloses the deposition unit.

15. The apparatus of claim 9, further comprising at least one of:
a stripping unit configured to receive the microelectronic workpiece and chemically strip at least part of the layered portion from the microelectronic workpiece;
a seed layer enhancement unit configured to receive the microelectronic workpiece and enhance characteristics of a seed layer disposed on the microelectronic workpiece;
a non-compliance unit configured to receive and support the microelectronic workpiece without changing the condition of the microelectronic workpiece when the condition of the layered portion of the microelectronic workpiece is outside a tolerance range;
an annealing unit configured to receive the microelectronic workpiece and anneal at least a portion of the microelectronic workpiece; and
a pre-align unit configured to rotationally align the microelectronic workpiece.

16. The apparatus of claim 9 wherein the metrology unit is configured to detect a condition of a layer deposited by the deposition unit.

17. The apparatus of claim 9 wherein the deposition unit is configured to deposit at least one of a seed layer and a blanket layer on the microelectronic workpiece.

18. The apparatus of claim 9 wherein the deposition unit is configured to deposit a layer of material by at least one of an electrochemical process, an electrolytic process and an electroless process.

19. An apparatus for processing a microelectronic workpiece, comprising:
a deposition unit configured to receive the microelectronic workpiece and deposit a layer of material on the microelectronic workpiece, the deposition unit including:
a principal fluid flow chamber;
a plurality of concentric electrodes disposed at different elevations in the principal fluid flow chamber so as to place the concentric electrodes at different distances from a microelectronic workpiece under process; and
a controller configured to deliver through the individual concentric electrodes a current that is (a) based upon a current delivered through the concentric electrode to process an earlier-processed microelectronic workpiece and (b) selected to produce a more uniform processing of the workpiece under process than the processing of the earlier-processed microelectronic workpiece, the apparatus further comprising:
a metrology unit configured to receive the microelectronic workpiece, the metrology unit being configured to detect a condition of a layered portion of the microelectronic workpiece and transmit a condition signal representative of the condition;
a transport unit positioned to move the microelectronic workpiece to the deposition unit; and
a control unit operatively coupled to the metrology unit and at least one of the deposition unit and the transport unit, the control unit being configured to receive the condition signal and, based on the condition signal, transmit at least one of a first transmitted signal and a second transmitted signal, the first transmitted signal being configured to direct the transport unit to move the microelectronic workpiece to the deposition unit, the second transmitted signal being configured to influence a process carried out by the deposition unit.

20. The apparatus of claim 19 wherein the sensitivity values are logically arranged within the control system as one or more Jacobian matrices.

21. The apparatus of claim 19 wherein the at least one user input parameter comprises the thickness of a film that is to be electrochemically deposited on the at least one surface of the microelectronic workpiece.

22. The apparatus of claim 19 wherein the individual electrodes are independently connected to the controller.

23. The apparatus of claim 19 wherein the microelectronic workpiece is a first microelectronic workpiece, and wherein the control unit is operatively coupled to the deposition unit to influence a deposition process carried out by the deposition unit on at least one of the first microelectronic workpiece and a second microelectronic workpiece subsequently received at the deposition unit.

24. The apparatus of claim 19 wherein the metrology unit is positioned external to a housing that at least partially encloses at least one of the deposition unit.

25. The apparatus of claim 19, further comprising at least one of:

a stripping unit configured to receive the microelectronic workpiece and chemically strip at least part of the layered portion from the microelectronic workpiece;

a seed layer enhancement unit configured to receive the microelectronic workpiece and enhance characteristics of a seed layer deposited on the microelectronic workpiece;

a non-compliance unit configured to receive and support the microelectronic workpiece without changing the condition of the microelectronic workpiece when the condition of the layered portion of the microelectronic workpiece is outside a tolerance range;

an annealing unit configured to receive the microelectronic workpiece and anneal at least a portion of the microelectronic workpiece; and a pre-align unit configured to rotationally align the microelectronic workpiece.

26. The apparatus of claim 19 wherein the metrology unit is configured to detect a condition of a layer deposited by the deposition unit.

27. The apparatus of claim 19 wherein the deposition unit is configured to deposit at least one of a seed layer and a blanket layer on the microelectronic workpiece.

28. The apparatus of claim 19 wherein the deposition unit is configured to deposit a layer of material by at least one of an electrochemical process, an electrolytic process and an electroless process.

29. An apparatus for processing a microelectronic workpiece, comprising:

a deposition unit configured to receive the microelectronic workpiece and deposit a layer of material on the microelectronic workpiece;

a metrology unit configured to receive the microelectronic workpiece, the metrology unit being configured to detect a condition of a layered portion of the microelectronic workpiece and transmit a condition signal representative of the condition;

an annealing unit configured to receive the microelectronic workpiece and process the microelectronic workpiece at an elevated temperature, the annealing unit including:
an apparatus support;
a heat source supported by the apparatus support;
a workpiece support positioned proximate to the heat source to engage and support the microelectronic workpiece relative to the heat source; and
a heat sink positioned to selectively transfer heat from the microelectronic workpiece, the apparatus further comprising:

a transport unit positioned to move the microelectronic workpiece to the annealing unit;

a control unit operatively coupled to at least the metrology unit and at least one of the transport unit and the annealing unit, the control unit being configured to receive the condition signal and, based on the condition signal, transmit at least one of a first transmitted signal and a second transmitted signal, the first transmitted signal being configured to direct the transport unit to move the microelectronic workpiece to the deposition unit, the second transmitted signal being configured to influence a process carried out by the annealing unit.

30. The apparatus of claim 29 wherein the workpiece support is movable relative to the heat source between a first position with the microelectronic workpiece contacting the heat source and a second position with the microelectronic workpiece spaced apart from the heat source.

31. The apparatus of claim 29 wherein the heat sink includes a passive conduction heat sink having no cooling fluid links coupled thereto.

32. The apparatus of claim 29 wherein at least one of the heat sink and the heat source is movable relative to the other between an engaged position with the heat sink engaged with the heat source and a disengaged position with the heat sink spaced apart from the heat source.

33. The apparatus of claim 29 wherein the heat sink is a first heat sink and the engaged position is a first engaged position, and wherein the apparatus further comprises a second heat sink spaced apart from the first heat sink and coupled to a supply of cooling fluid, and wherein the first heat sink is positioned between the second heat sink and the heat source, the first heat sink being movable relative to the second heat sink between the first engaged position with the first heat sink engaged with the heat source and a second engaged position with the first heat sink engaged with the second heat sink to cool the first heat sink.

34. The apparatus of claim 29 wherein the microelectronic workpiece is a first microelectronic workpiece, and wherein the control unit is operatively coupled to the deposition unit to influence a deposition process carried out by the deposition unit on at least one of the first microelectronic workpiece and a second microelectronic workpiece subsequently received at the deposition unit.

35. The apparatus of claim 29 wherein the microelectronic workpiece is a first microelectronic workpiece, and wherein the control unit is operatively coupled to the annealing unit to influence an annealing process carried out by the annealing unit on at least one of the first microelectronic workpiece and a second microelectronic workpiece subsequently received at the annealing unit.

36. The apparatus of claim 29 wherein the metrology unit is positioned external to a housing that at least partially encloses at least one of the deposition unit and the annealing unit.

37. The apparatus of claim 29, further comprising at least one of:

a stripping unit configured to receive the microelectronic workpiece and chemically strip at least part of the layered portion from the microelectronic workpiece;

a seed layer enhancement unit configured to receive the microelectronic workpiece and enhance characteristics of a seed layer disposed on the microelectronic workpiece;

a non-compliance unit configured to receive and support the microelectronic workpiece without changing the condition of the microelectronic workpiece when the condition of the layered portion of the microelectronic workpiece is outside a tolerance range; and a pre-align unit configured to rotationally align the microelectronic workpiece.

38. The apparatus of claim 29 wherein the metrology unit is configured to detect a condition of a layer deposited by the deposition unit.

39. The apparatus of claim 29 wherein the deposition unit is configured to deposit at least one of a seed layer and a blanket layer on the microelectronic workpiece.

40. The apparatus of claim 29 wherein the deposition unit is configured to deposit a layer of material by at least one of an electrochemical process, an electrolytic process and an electroless process.

41. A method for processing a microelectronic workpiece having a first side, a second side, and an outer perimeter between the first and second sides, the method comprising:

receiving the microelectronic workpiece at a metrology unit;

detecting a condition of a layered portion of the microelectronic workpiece at the metrology unit;

transmitting from the metrology unit to a control unit a condition signal representative of the condition;

based on the condition signal, transmitting a first control signal from the control unit to direct a transport unit to move the microelectronic workpiece to a stripping unit, or transmitting a second control signal to influence a process carried out by the stripping unit, or transmitting both the first control signal and the second control signal; and stripping at least some of the layered portion at the stripping unit, wherein stripping includes:
  introducing a first processing fluid at the first side of the workpiece;
  introducing a second processing fluid at the second side of the workpiece;
  driving the first processing fluid to contact the first side of the workpiece, the outer perimeter, and a peripheral margin of the second side of the workpiece; and
  driving the second processing fluid to contact the second side of the workpiece substantially only at those portions of the second side interior to the peripheral margin of the second side.

42. The method of claim 41, further comprising selecting the first fluid to include an etchant.

43. The method of claim 41 wherein the driving the first processing fluid includes driving the first processing fluid using centrifugal force resulting, at least in part, from rotation of the workpiece.

44. The method of claim 41, further comprising depositing the layered portion on the microelectronic workpiece at a deposition unit.

45. The method of claim 41, further comprising:
  depositing the layered portion on the microelectronic workpiece at a deposition unit by at least one of an electrochemical process, an electrolytic process, and an electroless process; and
  influencing a deposition process carried out by the deposition unit by transmitting a signal from the control unit to the deposition unit.

46. The method of claim 41 wherein the microelectronic workpiece is a first microelectronic workpiece, and wherein the process further comprises:
  depositing the layered portion on the microelectronic workpiece at a deposition unit; and
  transmitting a signal from the control unit to the deposition unit to influence a deposition process carried out by the deposition unit on at least one of the first microelectronic workpiece and a second microelectronic workpiece received subsequently at the deposition unit.

47. The method of claim 41 wherein transmitting a condition signal from the metrology unit includes transmitting a condition signal from a metrology unit external to a housing that at least partially encloses the stripping unit.

48. The method of claim 41, further comprising moving the microelectronic workpiece to at least one of:
  a seed layer enhancement unit configured to receive the microelectronic workpiece and enhance characteristics of a seed layer deposited on the microelectronic workpiece;
  a non-compliance unit configured to receive and support the microelectronic workpiece without changing the condition of the microelectronic workpiece when the condition of the layered portion of the microelectronic workpiece is outside a tolerance range;
  an annealing unit configured to receive the microelectronic workpiece and anneal at least a portion of the microelectronic workpiece; and
  a pre-align unit configured to rotationally align the microelectronic workpiece.

49. The method of claim 41 wherein detecting a condition of a layered portion of the microelectronic workpiece includes detecting a condition of at least one of a seed layer and a blanket layer on the microelectronic workpiece.

50. A method for processing a microelectronic workpiece, comprising:
  receiving the microelectronic workpiece in a reaction vessel of a deposition unit,
  depositing a material on the deposition unit, wherein depositing includes:
    passing a primary fluid flow through the reaction vessel along a first flow path;
    passing a secondary fluid flow through the reaction vessel along a second flow path, wherein the second flow path is separate from the first flow path through at least a portion of the reaction vessel;
    applying an electrical potential to an electrode in the secondary fluid flow at a location where the secondary fluid flow is separate from the primary fluid flow, and wherein the method further comprises:
  receiving the microelectronic workpiece at a metrology unit;
  detecting a condition of a layered portion of the microelectronic workpiece at the metrology unit;
  transmitting from the metrology unit to a control unit a condition signal representative of the condition;
  based on the condition signal, transmitting a first control signal from the control unit to move the microelectronic workpiece, or transmitting a second control signal from the control unit to influence a process carried out by the deposition unit, or transmitting both the first control signal and the second control signal.

51. The method of claim 50, further comprising:
  depositing the layered portion on the microelectronic workpiece at a deposition unit by at least one of an electrochemical process, and an electrolytic process; and
  influencing a deposition process carried out by the deposition unit by transmitting a signal from the control unit to the deposition unit.

52. The method of claim 50 wherein the microelectronic workpiece is a first microelectronic workpiece, and wherein the process further comprises:
  depositing the layered portion on the microelectronic workpiece at a deposition unit; and
  transmitting a signal from the control unit to the deposition unit to influence a deposition process carried out by the deposition unit on at least one of the first microelectronic workpiece and a second microelectronic workpiece received subsequently at the deposition unit.

53. The method of claim 50 wherein transmitting a condition signal from the metrology unit includes transmitting a condition signal from a metrology unit external to a housing that at least partially encloses the deposition unit.

54. The method of claim 50, further comprising moving the microelectronic workpiece to at least one of:
  a seed layer enhancement unit configured to receive the microelectronic workpiece and enhance characteristics of a seed layer disposed on the microelectronic workpiece;

a stripping unit configured to receive the microelectronic workpiece and chemically strip at least part of the layered portion from the microelectronic workpiece;

a non-compliance unit configured to receive and support the microelectronic workpiece without changing the condition of the microelectronic workpiece when the condition of the layered portion of the microelectronic workpiece is outside a tolerance range;

an annealing unit configured to receive the microelectronic workpiece and anneal at least a portion of the microelectronic workpiece; and a pre-align unit configured to rotationally align the microelectronic workpiece.

55. The method of claim 50 wherein detecting a condition of a layered portion of the microelectronic workpiece includes detecting a condition of a seed layer.

56. A method for processing a microelectronic workpiece, comprising:

receiving the microelectronic workpiece in a reaction vessel of a deposition unit;

depositing a material on the microelectronic workpiece, wherein depositing includes:
introducing at least one surface of the microelectronic workpiece into an electroplating bath;
providing a plurality of electrodes in the electroplating bath, the plurality of electrodes being spaced at different distances from the at least one surface of the microelectronic workpiece that is to be electroplated; and
for the individual electrodes, inducing an electrical current between the electrode and the at least one surface of the microelectronic workpiece, the induced electrical current being (a) based on an electrical current induced between the electrode and a previously electroplated microelectronic workpiece and (b) selected to improve on an electroplating result achieved for the previously electroplated microelectronic workpiece, and wherein the method further includes:

receiving the microelectronic workpiece at a metrology unit;

detecting a condition of a layered portion of the microelectronic workpiece at the metrology unit;

transmitting from the metrology unit to a control unit a condition signal representative of the condition; and based on the condition signal, transmitting a first control signal from the control unit to direct a transport unit to move the microelectronic workpiece, or transmitting a control signal from the control unit to influence a process carried out by the deposition unit, or transmitting both the first control signal and the second control signal.

57. The method of claim 56 wherein transmitting a condition signal from the metrology unit includes transmitting a condition signal from a metrology unit external to a housing that at least partially encloses the deposition unit.

58. The method of claim 56, further comprising moving the microelectronic workpiece to at least one of:

a seed layer enhancement unit configured to receive the microelectronic workpiece and enhance characteristics of a seed layer deposited on the microelectronic workpiece;

a stripping unit configured to receive the microelectronic workpiece and chemically strip at least part of the layered portion from the microelectronic workpiece;

a non-compliance unit configured to receive and support the microelectronic workpiece without changing the condition of the microelectronic workpiece when the condition of the layered portion of the microelectronic workpiece is outside a tolerance range;

an annealing unit configured to receive the microelectronic workpiece and anneal at least a portion of the microelectronic workpiece; and a pre-align unit configured to rotationally align the microelectronic workpiece.

59. The method of claim 56 wherein detecting a condition of a layered portion of the microelectronic workpiece includes detecting a condition of a seed layer.

60. A method for processing a microelectronic workpiece, comprising:

receiving the microelectronic workpiece at a metrology unit;

detecting a condition of a layered portion of the microelectronic workpiece at the metrology unit;

transmitting from the metrology unit to a control unit a condition signal representative of the condition;

based on the condition signal, transmitting a first control signal from the control unit to direct a transport unit to move the microelectronic workpiece to an annealing unit, or transmitting a second control signal from the control unit to influence a process carried out by the annealing unit, or transmitting both the first control signal and the second control signal; and annealing the microelectronic workpiece at the annealing unit, wherein annealing includes:
supporting the microelectronic workpiece relative to a heat source;
transferring heat from the heat source to the microelectronic workpiece; and
cooling the microelectronic workpiece.

61. The method of claim 60, further comprising moving at least one of the microelectronic workpiece and the heat source relative to the other to transfer heat from the heat source to the microelectronic substrate.

62. The method of claim 60, further comprising moving a heat sink relative to the heat source from a disengaged position to an engaged position with the heat sink contacting the heat source when the heat sink is in the engaged position to transfer heat from the heat source and the microelectronic workpiece.

63. The method of claim 62 wherein the heat sink is a first heat sink and wherein the method further comprises:

transferring heat from the first heat sink to a second heat sink by moving the first heat sink away from the heat source and proximate to a second heat sink; and transferring heat away from the second heat sink.

64. The method of claim 60, further comprising depositing the layered portion on the microelectronic workpiece at a deposition unit.

65. The method of claim 60, further comprising:

depositing the layered portion on the microelectronic workpiece at a deposition unit by at least one of an electrochemical process, an electrolytic process, and an electroless process; and influencing a deposition process carried out by the deposition unit by transmitting a signal from the control unit to the deposition unit.

66. The method of claim 60 wherein the microelectronic workpiece is a first microelectronic workpiece, and wherein the process further comprises:

depositing the layered portion on the microelectronic workpiece at a deposition unit; and transmitting a signal from the control unit to the deposition unit to influence a deposition process carried out by the deposition unit on at least one of the first microelectronic workpiece and a second microelectronic workpiece received subsequently at the deposition unit.

67. The method of claim 60 wherein transmitting a condition signal from the metrology unit includes transmitting a condition signal from a metrology unit external to a housing that at least partially encloses the annealing unit.

68. The method of claim 60, further comprising moving the microelectronic workpiece to at least one of:

a stripping unit configured to receive the microelectronic workpiece and chemically strip at least part of the layered portion from the microelectronic workpiece;

a seed layer enhancement unit configured to receive the microelectronic workpiece and enhance characteristics of a seed layer deposited on the microelectronic workpiece;

a non-compliance unit configured to receive and support the microelectronic workpiece without changing the condition of the microelectronic workpiece when the condition of the layered portion of the microelectronic workpiece is outside a tolerance range; and a pre-align unit configured to rotationally align the microelectronic workpiece.

69. The method of claim 60 wherein detecting a condition of a layered portion of the microelectronic workpiece includes detecting a condition of at least one of a seed layer and a blanket layer of the microelectronic workpiece.

* * * * *